United States Patent

Yamamichi et al.

[11] Patent Number: 5,943,547
[45] Date of Patent: Aug. 24, 1999

[54] METHOD OF FORMING HIGHLY-INTEGRATED THIN FILM CAPACITOR WITH HIGH DIELECTRIC CONSTANT LAYER

[75] Inventors: Shintaro Yamamichi; Pierre Yves Lesaicherre, both of Tokyo, Japan

[73] Assignee: NEC Corporation, Tokyo, Japan

[21] Appl. No.: 08/926,369

[22] Filed: Sep. 9, 1997

Related U.S. Application Data

[62] Division of application No. 08/635,872, Apr. 18, 1996, Pat. No. 5,883,781.

[30] Foreign Application Priority Data

Apr. 19, 1995 [JP] Japan ................................. 7-117853

[51] Int. Cl.⁶ .............................................. H01L 21/8242
[52] U.S. Cl. ................................................ 438/3; 438/240
[58] Field of Search ........................... 438/3, 238–240, 438/250–256, 381, 393–399

[56] References Cited

U.S. PATENT DOCUMENTS

| | | |
|---|---|---|
| 5,382,817 | 1/1995 | Kashihara et al. .................. 257/295 |
| 5,466,964 | 11/1995 | Sakao et al. ........................ 257/532 |
| 5,567,636 | 10/1996 | Jones, Jr. . |
| 5,580,814 | 12/1996 | Larson . |

FOREIGN PATENT DOCUMENTS

| | | | |
|---|---|---|---|
| 0415751 | 3/1991 | European Pat. Off. ........ H01L 29/92 |
| 0697719 | 2/1996 | European Pat. Off. .... H01L 21/3205 |
| 6-244435 | 9/1994 | Japan ........................... H01L 29/788 |
| 7-094600 | 4/1995 | Japan ........................ H01L 21/8242 |
| 8-116032 | 5/1996 | Japan ............................. H01L 27/04 |
| 8-191137 | 7/1996 | Japan ........................... H01L 27/108 |

OTHER PUBLICATIONS

P.Y. Lesaicherre Et AL., "A Gbit–scale DRAM stacked capacitor technology with ECR MOCVD SrTiO₃ and RIE patterned RuO₂/TiN storage nodes", pp. 34.1.1–34.1.4, San Francisco USA.

*Primary Examiner*—Jey Tsai
*Attorney, Agent, or Firm*—Hayes Soloway, Hennessey, Grossman & Hage

[57] ABSTRACT

In a capacitor including a silicon substrate and an insulating layer formed on the silicon substrate having a contact hole, a lower electrode layer including a silicon diffusion preventing conductive layer and an oxidation resistance conductive layer, an upper electrode layer, and a high dielectric constant layer therebetween, the silicon diffusion preventing layer is located on or within the contact hole and is isolated from the high dielectric constant layer. The high dielectric constant layer is formed on an upper surface and a side surface of the oxidation resistance conductive layer.

8 Claims, 53 Drawing Sheets

5,943,547

METHOD OF FORMING HIGHLY-INTEGRATED THIN FILM CAPACITOR WITH HIGH DIELECTRIC CONSTANT LAYER

This is a divisional of application Ser. No. 08/635,872 filed on Apr. 18, 1996, now U.S. Pat. No. 5,883,781.

BACKGROUND OF THE INVENTION

1. Field of the Invention

The present invention relates to a thin film capacitor used as a stacked capacitor in a memory cell of a dynamic random access memory (DRAM) device.

2. Description of the Related Art

Generally, in a DRAM cell, a stacked capacitor is comprised of a lower electrode made of polycrystalline silicon, an upper electrode layer made of polycrystalline silicon, and a capacitor insulating (dielectric) layer made of silicon oxide or silicon oxide/silicon nitride/silicon oxide (ONO) therebetween. In this case, the permittivity of silicon oxide or ONO is relatively small.

Recently, as DRAM devices have become more fine-structured, stacked capacitors have also become more fine-structured. Particularly, in a 256 Mbit DRAM device where a 0.3 to 0.35 cm rule will be adopted, if silicon oxide or ONO is used as a capacitor dielectric layer, the capacitor insulating layer will be less than 4 nm in thickness, which is difficult to form. Therefore, in order to enhance the capacitance of a stacked capacitor, a high dielectric constant layer has been used as a capacitor dielectric layer made of $SiTiO_3$ or $(Ba, Sr) TiO_3$ (BST).

A first prior art stacked capacitor includes a lower electrode layer made of noble metal/refractory metal or conductive oxide/refractory metal such as Pt/Ta and $RuO_2$/TiN formed on a polycrystalline silicon plug, an upper electrode layer, and a high dielectric constant layer made of $SiTiO_3$ or BST therebetween (see: P-Y. Lesaicherre el al. "A Gbit-scale DRAM stacked capacitor technology with ECR MOCVD $SiTiO_3$ and RIE patterned $RuO_2$/TiN storage nodes", IEDM, pp. 831–834, 1994). This will be explained later in detail. In this case, the noble metal or conductive oxide hardly reacts with oxygen in an oxygen atmosphere for forming the high dielectric constant layer, and therefore, a low permittivity oxide layer is hardly created between the noble metal and the high dielectric constant layer. Thus, the noble metal or conductive oxide serves as an oxidation resistance conductive layer. However, the noble metal or conductive oxide easily reacts with silicon at a low temperature such as 450° C. to form metal silicide which is easily changed to a low permittivity oxide. Therefore, the refractory metal is inserted between the noble metal or conductive oxide and the polycrystalline silicon plug so that the noble metal or conductive oxide is not in direct contact with the polycrystalline silicon plug. In this case, the refractory metal hardly reacts with silicon even at a temperature of 600° C., so that refractory metal silicide is hardly created. Thus, the refractory metal serves as a silicon diffusion preventing conductive layer.

Note that there has never been a conductive layer which can serve as an oxidation resistance conductive layer as well as a silicon diffusion preventing conductive layer.

In the above-described first prior art stacked capacitor, however, since the refractory metal is exposed to oxygen at a temperature of about 600° C. for forming the high dielectric constant layer, the refractory metal easily reacts with oxygen so that the refractory metal is oxidized. As a result, a contact resistance of the lower electrode layer is increased, and the capacitance density of the stacked capacitor is decreased.

In a second prior art stacked capacitor, in order to avoid oxidation of the refractory metal, an insulating spacer is formed on the entire sidewall of the lower electrode layer prior to the formation of the high dielectric constant layer (see: T. Emori et al., "A Newly Designed Planar Stacked Capacitor Cell with High dielectric Constant Film for 256 Mbit DRAM", IEDM, pp. 631–634, 1993). This also will be explained later in detail.

In the above-described second prior art stacked capacitor, however, the lateral length of the stacked capacitor is substantially increased, which reduces the integration. Particularly, in a 1 Gbit DRAM device where a less than 0.2 μm rule will be adoped, since the physical size of the high dielectric constant layer is limited, the lower electrode layer has to be more stereostructured. Also, the thickness of the oxidation resistance conductive layer is relatively small due to the sidewall insulating spacer, so that a surface area of the oxidation resistance conductive layer in contact with the high dielectric constant layer is small, and thus, a large capacitance cannot be expected.

SUMMARY OF THE INVENTION

It is an object of the present invention to provide a highly-integrated capacitor having a high dielectric constant layer.

According to the present invention, in a capacitor including a silicon substrate and an insulating layer formed on the silicon substrate having a contact hole, a lower electrode layer including a silicon diffusion preventing conductive layer and an oxidation resistance conductive layer, an upper electrode layer, and a high dielectric constant layer therebetween, the silicon diffusion preventing layer is located on or within the contact hole and is isolated from the high dielectric constant layer. The high dielectric constant layer is formed on an upper surface and a side surface of the oxidation resistance conductive layer.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art stacked capacitors will be explained with reference to FIGS. 1 through 3.

Figure 1:
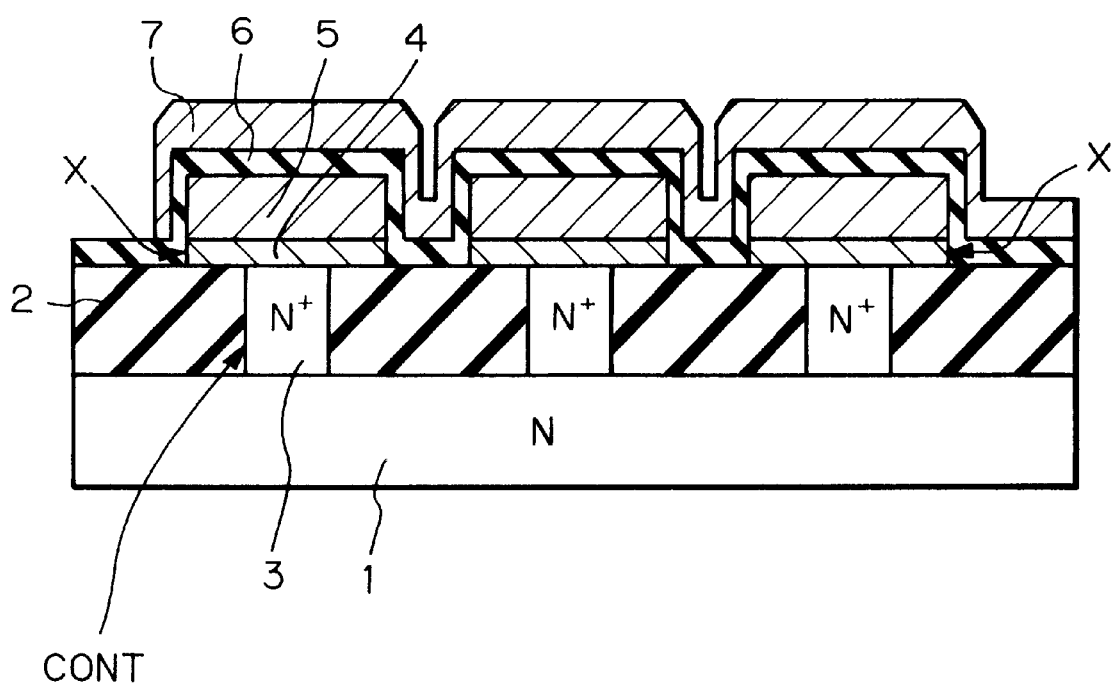
FIG. 1 is a cross-sectional view illustrating a first prior art stacked capacitor.

In FIG. 1, which illustrates a first stacked capacitor (see the P-Y. Lesaicherre document), reference numeral 1 designates an N-type monocrystalline silicon substrate having a low resistance, and 2 designates an insulating layer made of silicon oxide. Also, formed in the insulating layer 2 is a contact hole CONT in which an N-type impurity doped polycrystalline silicon plug 3 is buried.

A silicon diffusion preventing conductive layer 4 made of refractory metal such as TiN and an oxidation resistance conductive layer 5 made of noble metal or conductive oxide such as $RuO_2$ are formed on the polycrystalline silicon plug 3 to form a lower electrode layer. Also, a high dielectric constant layer 6 made of $SiTiO_3$ or BST is formed to cover the lower electrode layer. Further, an upper electrode layer 7 is formed on the high dielectric constant layer 6.

In the stacked capacitor of FIG. 1, however, when the high dielectric constant layer 6 is grown by a metal organic chemical vapor deposition (MOCVD) process, the refractory metal of the silicon diffusion preventing conductive layer 4 is exposed to oxygen as indicated by arrows X. Therefore, since the refractory metal easily reacts with oxygen, the refractory metal is oxidized.

The degree of oxidation of the refractor metal depends upon the deposition temperature at the MOCVD process.

Figure 3:
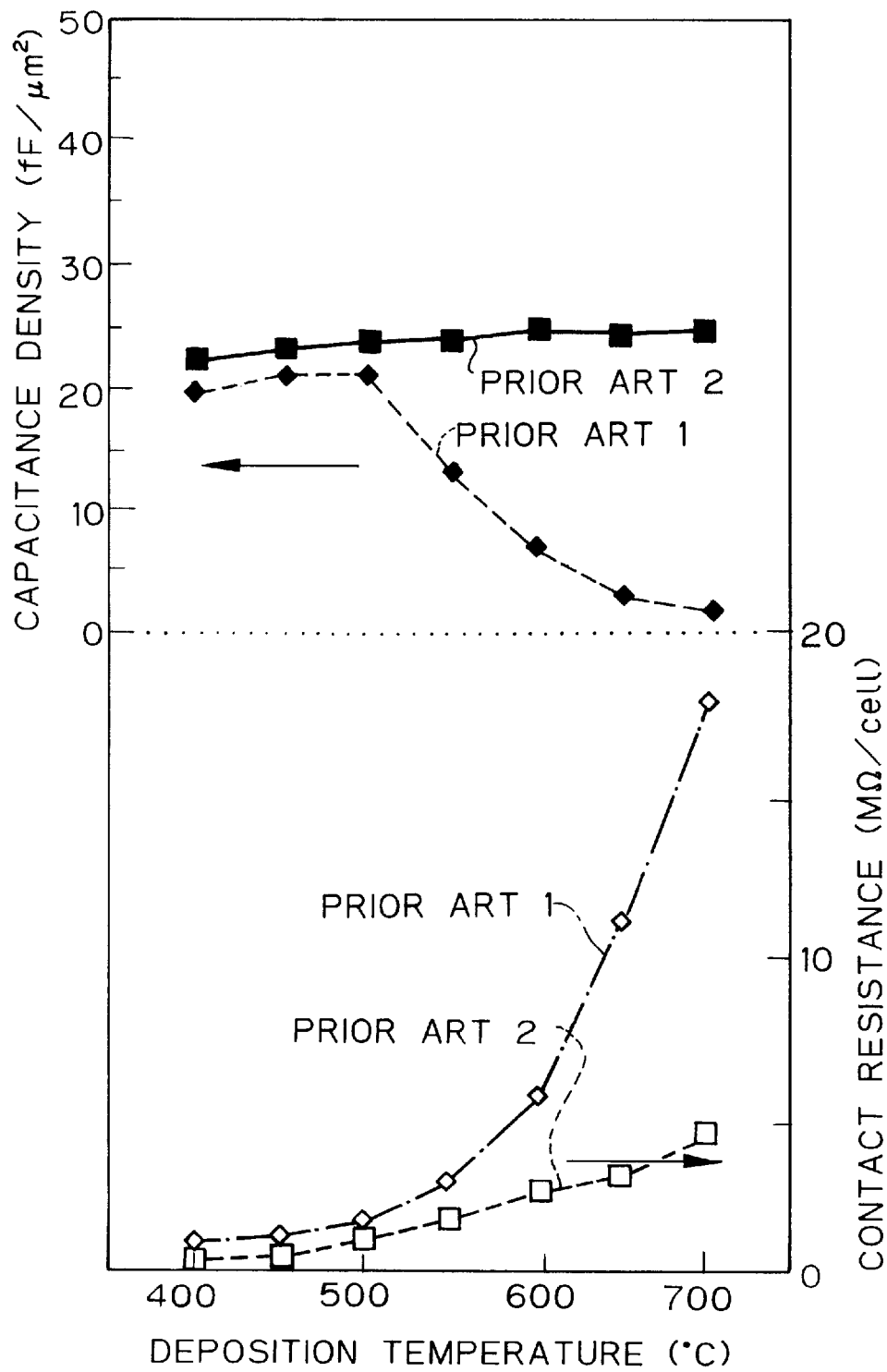
FIG. 3 is a graph showing the contact resistance and capacitance density characteristics of the stacked capacitors of FIGS. 1 and 2.

That is, as shown in FIG. 3, when the deposition temperature is higher than 550° C., the contact resistance of the polycrystalline silicon plug 3 and the lower electrode layer (4, 5) is remarkably increased, and accordingly, the capacitance density of the stacked capacitor is remarkably decreased.

Figure 2:
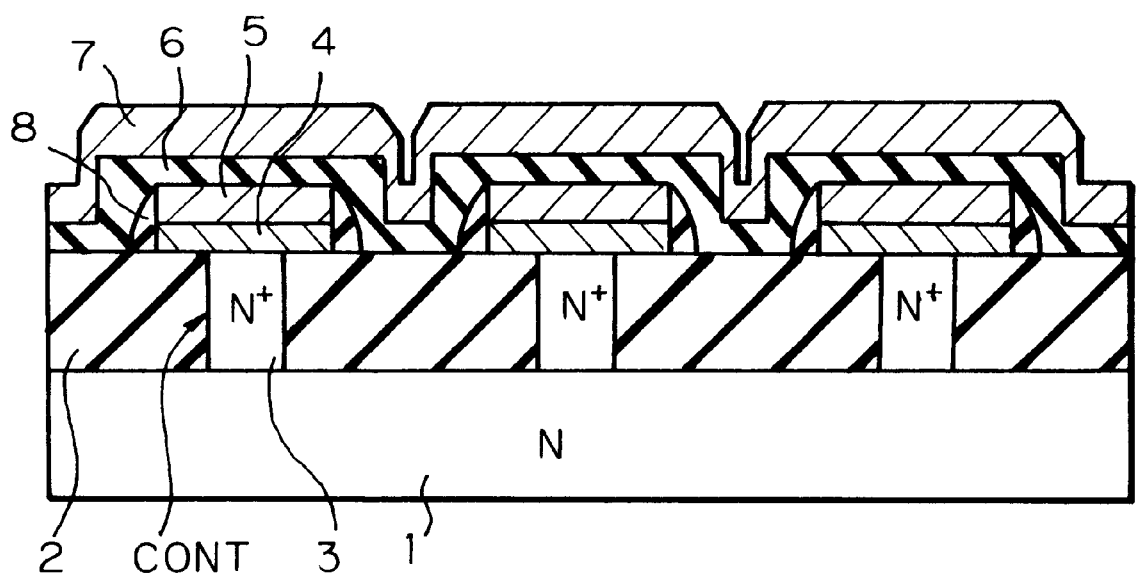
FIG. 2 is a cross-sectional view illustrating a second prior art stacked capacitor.

In FIG. 2, which illustrates a second prior art stacked capacitor (see the T. Eimori document), a sidewall insulating spacer 8 is formed on the entire sidewall of the lower electrode layer (4, 5) prior to the formation of the high dielectric constant layer 6. Therefore, when the high dielectric constant layer 6 is grown by an RF sputtering process, since the refractory metal of the silicon diffusion preventing conductive layer 4 is completely covered by the sidewall insulating layer 8, the refractory metal is hardly oxidized. That is, as shown in FIG. 3, even when the deposition temperature is higher than 550° C., the contact resistance is not increased, and also, the capacitance density of the stacked capacitor is increased rather than decreased, since, the better the crystallinity of the high dielectric constant layer 6, the higher the deposition temperature.

In the stacked capacitor of FIG. 3, however since the lateral length of the stacked capacitor is substantially increased due to the presence of the large sidewall insulating spacer 8, the integration is decreased. Also, the thickness of the oxidation resistance conductive layer 6 is relatively small due to the sidewall insulating spacer 8, so that a surface area of the oxidation resistance layer in contact with the high dielectric constant layer 6 is small, a large capacitance cannot be expected.

Figure 4:
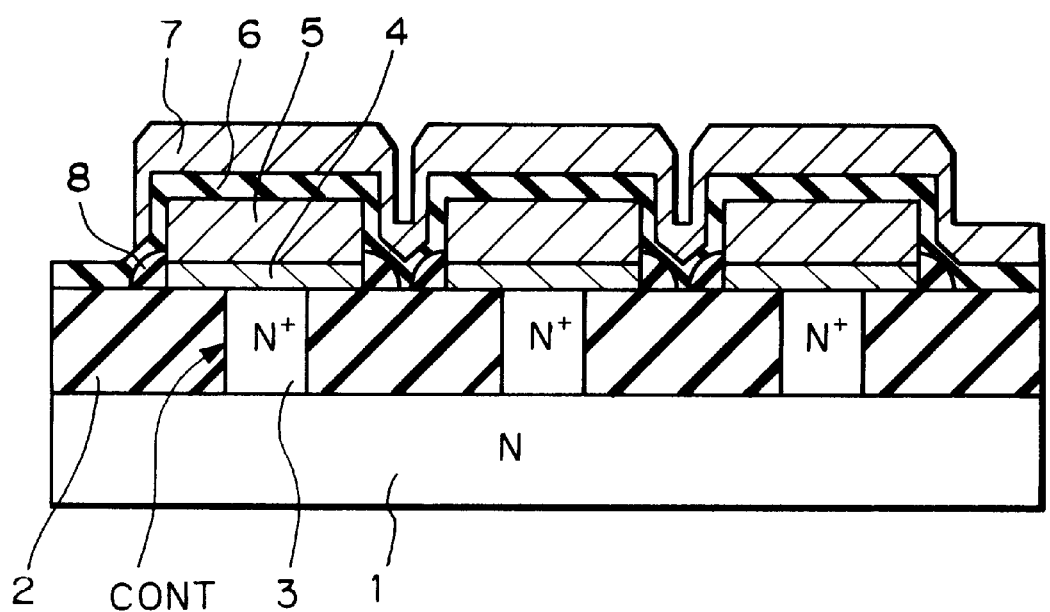
FIG. 4 is a cross-sectional view illustrating a first embodiment of the stacked capacitor according to the present invention.

In FIG. 4, which illustrates a first embodiment of the present invention, reference numeral 1 designates an N-type monocrystalline silicon substrate having a low resistance of about 0.1 Ω.cm, and 2 designates an about 600 nm thick insulating layer made of silicon oxide. Also, formed in the insulating layer 2 is a contact hole CONT in which a phosphorus doped polycrystalline silicon plug 3 is buried.

An about 100 nm thick silicon diffusion preventing conductive layer 4 made of refractory metal such as TiN and an oxidation resistance conductive layer 5 made of noble metal such as $RuO_2$ (500 nm)/Ru (50 nm) are formed on the polycrystalline silicon plug 3 to form a lower electrode layer.

Also, formed on only a sidewall of the silicon diffusion preventing layer 4 is a sidewall insulating spacer 8 made of silicon nitride. Thus, the high dielectric constant layer 6 is in contact with the sidewall of the oxidation resistance conductive layer 5 as well as the upper surface thereof. Also, the silicon diffusion preventing conductive layer 4 is isolated from the high dielectric constant layer 6.

Also, a high dielectric constant layer 6 made of $SiTiO_3$ or BST is formed to cover the lower electrode layer. Further, an upper electrode layer 7 made of Al(1 μm)/TiN(100 nm) is formed on the high dielectric constant layer 6.

Thus, also in FIG. 4, when the high dielectric constant layer 6 is grown by an MOCVD process, the refractory metal of the silicon diffusion preventing layer 4 is completely covered by the sidewall insulating spacer 8. In addition, however, in FIG. 2, since effective use is made of only a top surface of the oxidation resistance conductive layer 5 as a lower electrode, the capacitance is small. Contrary to this, in FIG. 4, since effective use is made of a side surface of the oxidation resistance conductive layer 5 as well as the top surface of the oxidation resistance conductive layer 5 as a lower electrode, the capacitance can be increased as compared with the stacked capacitor of FIG. 2. Thus, the stacked capacitor of FIG. 4 can be adapted to a 1 Gbit DRAM device. Also, the refractory metal is never oxidized.

Figure 5:
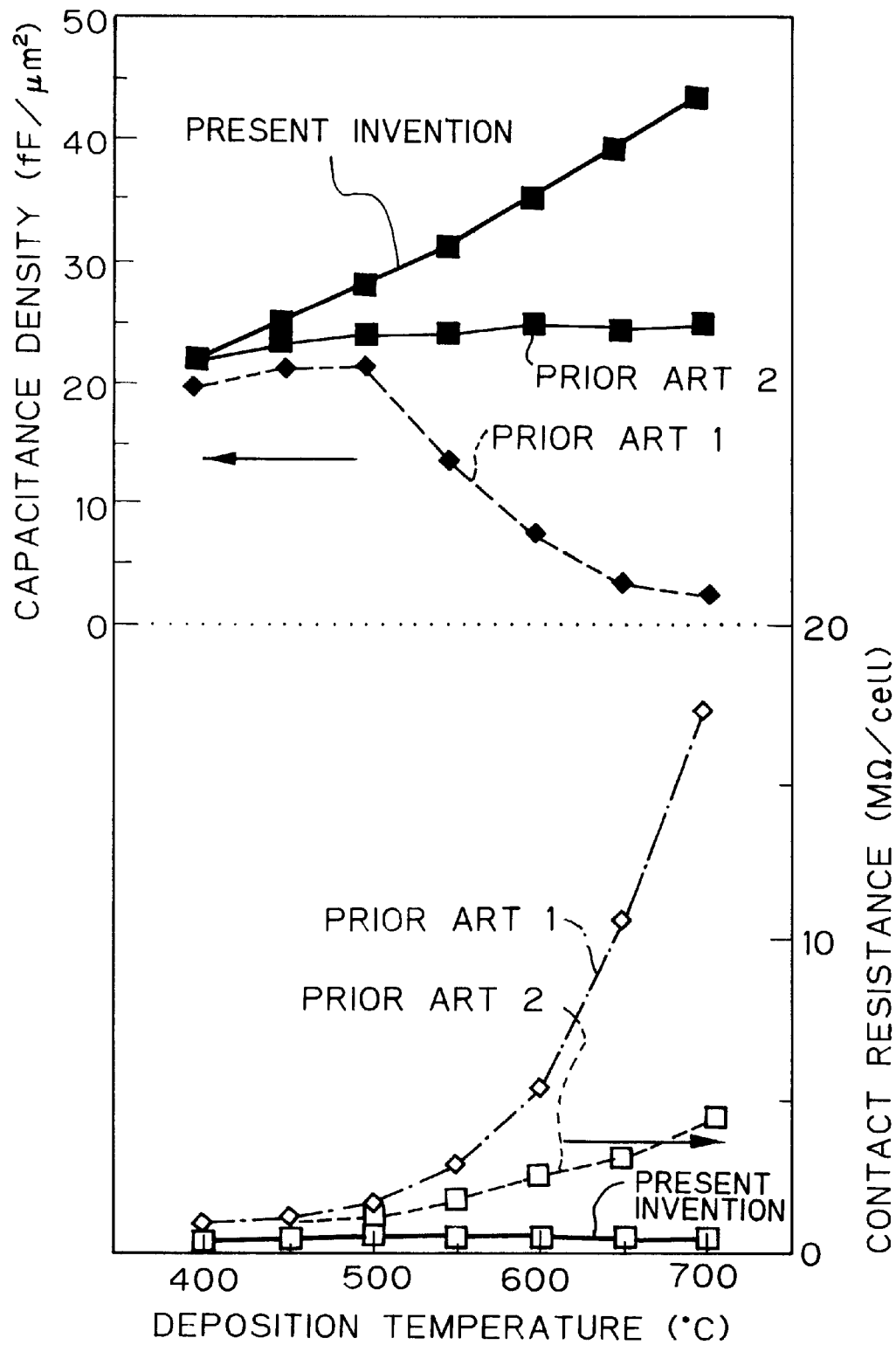
FIG. 5 is a graph showing the contact resistance and capacitance density characteristics of the stacked capacitor of FIG. 4.

That is, as shown in FIG. 5, even when the deposition temperature is higher than 550° C., the contact resistance is not increased, and also, the capacitance density of the stacked capacitor is increased rather than decreased, since, the better the crystallinity of the high dielectric constant layer 6, the higher the deposition temperature.

In addition, as stated above, since the effective area of the oxidation resistance conductive layer 5 in contact with the high dielectric constant layer 6 is larger in FIG. 4 than in FIG. 2, the height of the lower electrode layer can be reduced. Further, since the sidewall insulating spacer 8 is smaller in FIG. 4 than in FIG. 2, the integration can be enhanced.

Figure 6:
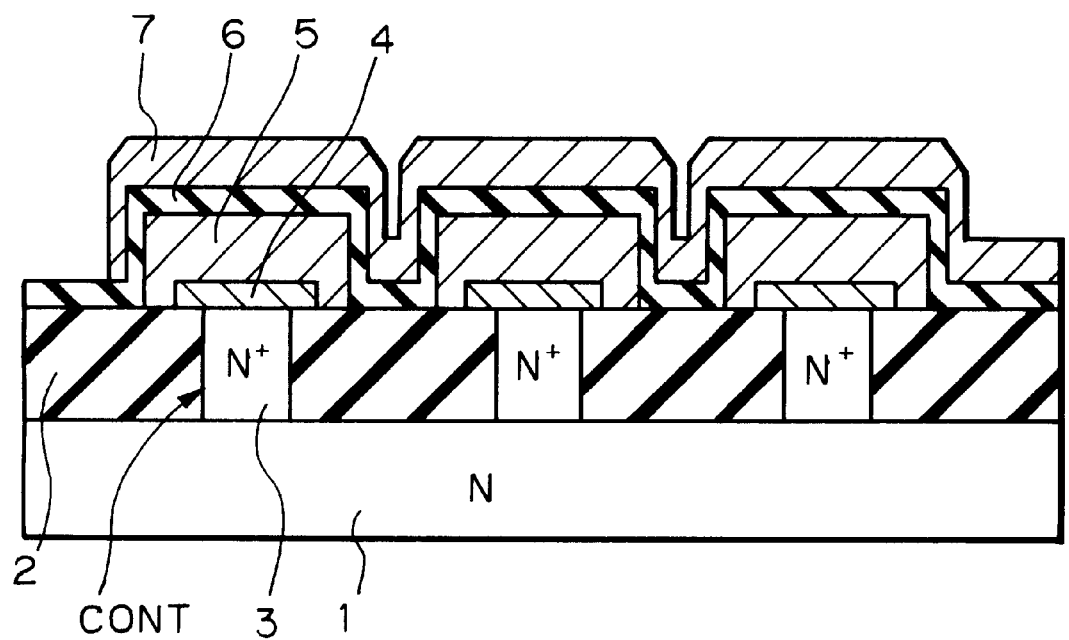
FIG. 6 is a cross-sectional view illustrating a second embodiment of the stacked capacitor according to the present invention.

In FIG. 6, which illustrates a second embodiment of the present invention, the sidewall insulating spacer 8 of FIG. 4 is deleted and the silicon diffusion preventing conductive layer 4 of FIG. 4 is reduced in a lateral direction. Thus, the silicon diffusion preventing conductive layer 4 is isolated from the high dielectric constant layer 6.

In addition, since the effective area of the oxidation resistance conductive layer 5 in contact with the high dielectric constant layer 6 is larger in FIG. 6 than in FIG. 4, the height of the lower electrode layer can be reduced. Further, since the sidewall insulating spacer 8 of FIG. 4 is absent, the integration can be enhanced.

Figure 7:
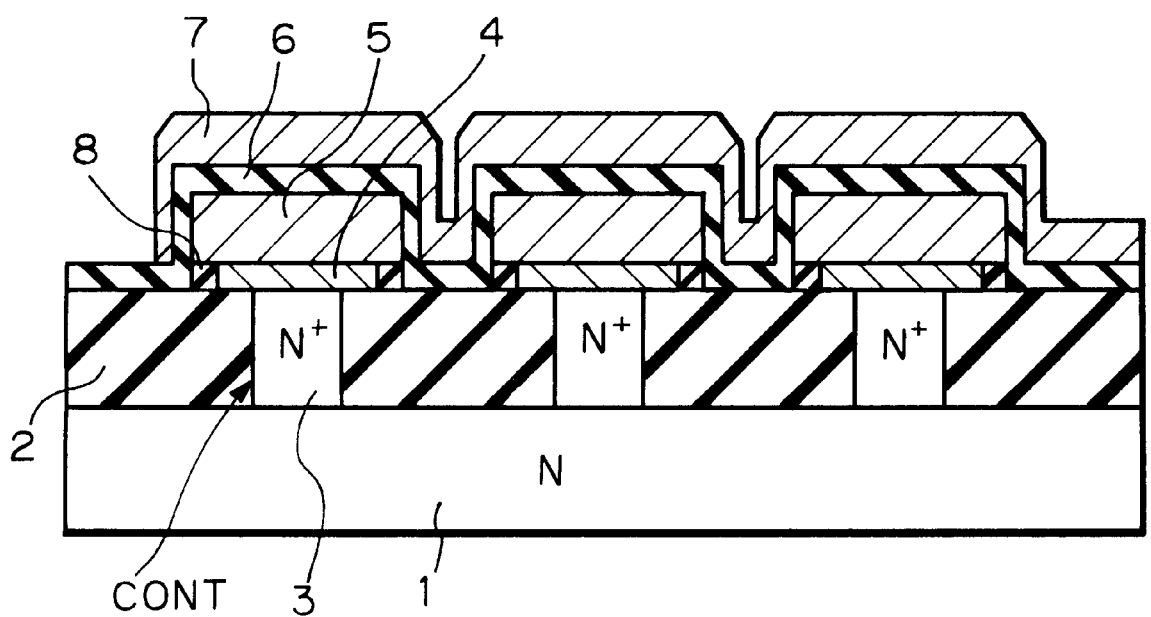
FIG. 7 is a cross-sectional view illustrating a third embodiment of the stacked capacitor according to the present invention.

In FIG. 7, which illustrates a third embodiment of the present invention, the silicon diffusion preventing conductive layer 4 is reduced in a lateral direction as compared with that of FIG. 4. In other words, the sidewall insulating spacer 8 is located under the oxidation resistance conductive layer 5. Thus, the integration can be enhanced as compared with the stacked capacitor of FIG. 4.

Also, the silicon diffusion preventing conductive layer 4 is isolated from the high dielectric constant layer 6.

Figure 8:
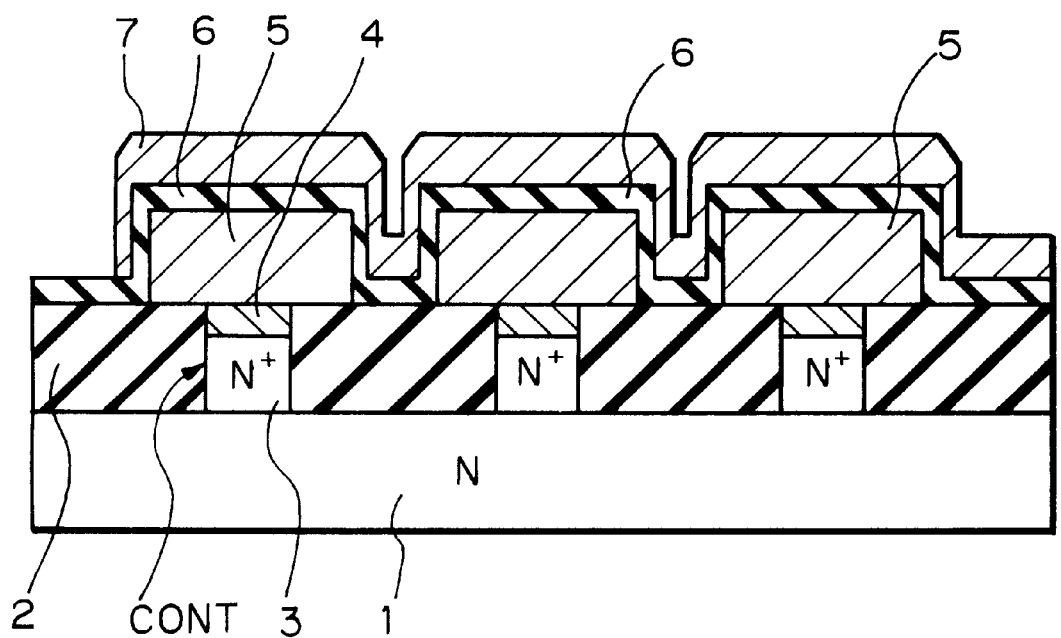
FIG. 8 is a cross-sectional view illustrating a fourth embodiment of the stacked capacitor according to the present invention.

In FIG. 8, which illustrates a fourth embodiment of the present invention, the silicon diffusion preventing conductive layer 4 is buried within the contact hole CONT. Thus, the silicon diffusion preventing conductive layer 4 is isolated from the high dielectric constant layer 6.

In addition, since the effective area of the oxidation resistance conductive layer 5 in contact with the high dielectric constant layer 6 can be larger in FIG. 8 than in FIG. 4, the height of the lower electrode layer can be further reduced. Further, since the silicon diffusion preventing conductive layer 4 is fitted into the contact hole CONT, it is unnecessary to provide a particular step for defining the position of the silicon diffusion preventing conductive layer 4, so that the manufacturing cost can be reduced as compared with the stacked capacitor of FIG. 7.

Figure 9:
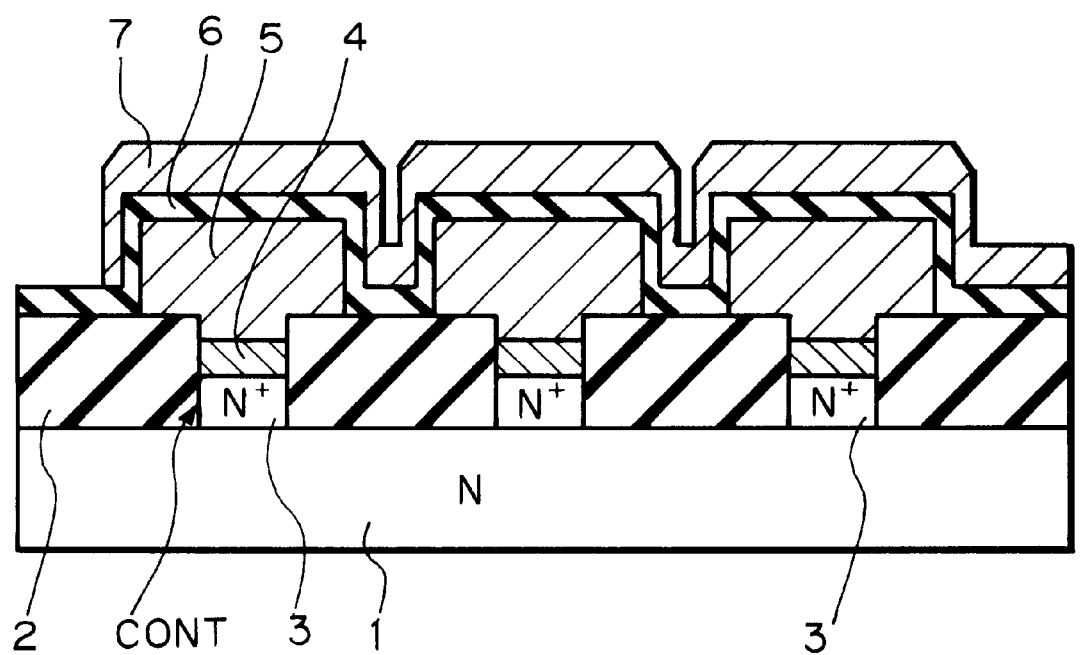
FIG. 9 is a cross-sectional view illustrating a fifth embodiment of the stacked capacitor according to the present invention.

In FIG. 9, which illustrates a fifth embodiment of the present invention, the silicon diffusion preventing conductive layer 4 and a part of the oxidation resistance conductive layer 5 are buried within the contact hole CONT. Thus, the silicon diffusion preventing conductive layer 4 is isolated from the high dielectric constant layer 6.

In addition, in the same way as in the stacked capacitor of FIG. 8, since the effective area of the oxidation resistance conductive layer 5 in contact with the high dielectric constant layer 6 can be larger in FIG. 9 than in FIG. 4, the height of the lower electrode layer can be further reduced. Further, since the silicon diffusion preventing conductive layer 4 is fitted into the contact hole CONT, it is unnecessary to provide a particular step for defining the position of the silicon diffusion preventing conductive layer 4, so that the manufacturing cost can be reduced as compared with the stacked capacitor of FIG. 7. Still further, the position of the silicon diffusion preventing conductive layer 5 in a longitudinal direction does not need to be accurate, which further reduces the manufacturing cost.

Figure 10:
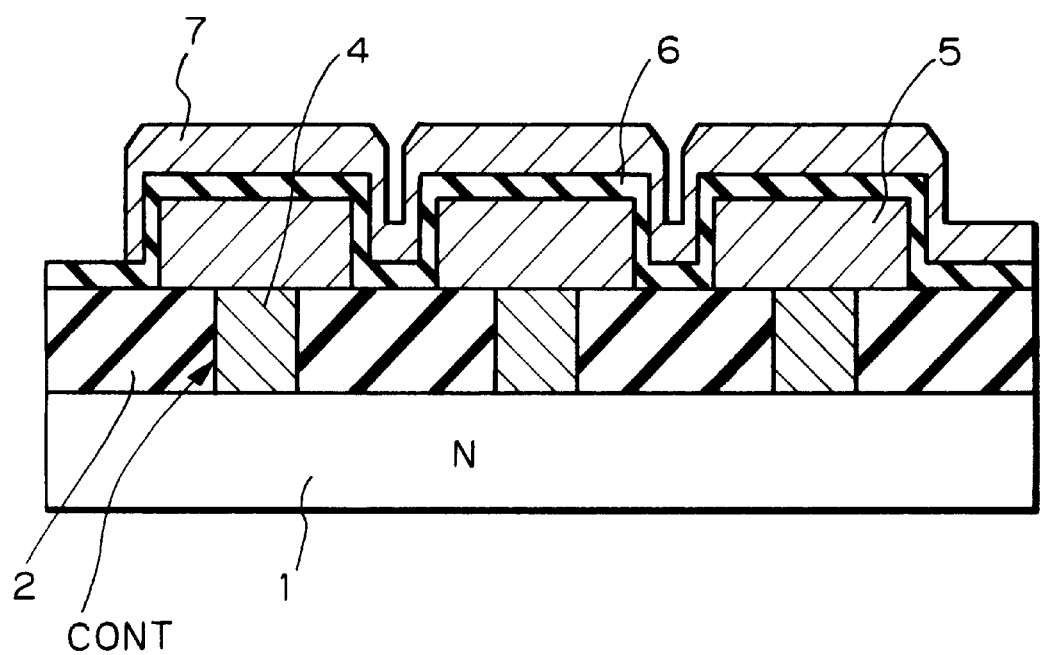
FIG. 10 is a cross-sectional view illustrating a sixth embodiment of the stacked capacitor according to the present invention.

In FIG. 10, which illustrates a sixth embodiment of the present invention, the silicon diffusion preventing conductive layer 4 is completely buried within the contact hole CONT. That is, the polycrystalline silicon plug 3 is not formed, and therefore, the stacked capacitor of FIG. 10 is adapted to a case where the thickness of the insulating layer 2 is small and the diameter of the contact hole CONT is large. Thus, the silicon diffusion preventing conductive layer 4 is isolated from the high dielectric constant layer 6.

In addition, since the effective area of the oxidation resistance conductive layer 5 in contact with the high dielectric constant layer 6 can be larger in FIG. 10 than in FIG. 4, the height of the lower electrode layer can be further reduced. Further, since the silicon diffusion preventing conductive layer 4 is completely fitted into the contact hole CONT, it is unnecessary to provide a particular step for defining the position of the silicon diffusion preventing conductive layer 4, so that the manufacturing cost can be reduced as compared with the stacked capacitor of FIG. 7.

Figure 11:
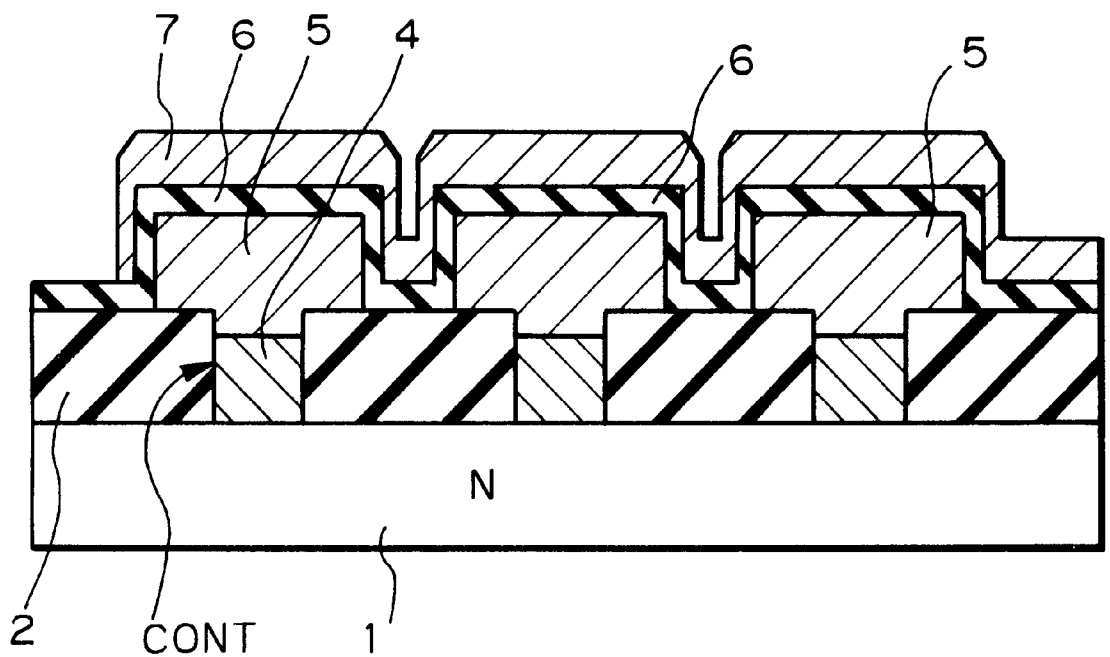
FIG. 11 is a cross-sectional view illustrating a seventh embodiment of the stacked capacitor according to the present invention.

In FIG. 11, which illustrates a seventh embodiment of the present invention, the silicon diffusion preventing conductive layer 4 and a part of the oxidation resistance conductive layer 5 are buried within the contact hole CONT. That is, in this case, the polycrystalline silicon plug 3 is not formed, and therefore, the stacked capacitor of FIG. 11 is also adapted to a case where the thickness of the insulating layer 2 is small and the diameter of the contact hole CONT is large. Thus, the silicon diffusion preventing conductive layer 4 is isolated from the high dielectric constant layer 6.

In addition, since the effective area of the oxidation resistance conductive layer 5 in contact with the high dielectric constant layer 6 can be larger in FIG. 11 than in FIG. 6, the height of the lower electrode layer can be further reduced. Further, since the silicon diffusion preventing conductive layer 4 is completely fitted into the contact hole CONT, it is unnecessary to provide a particular step for defining the position of the silicon diffusion preventing conductive layer 4, so that the manufacturing cost can be reduced as compared with the stacked capacitor of FIG. 7.

In FIGS. 12, 13, 14, 15, 16, 17 and 18, which illustrate eighth, ninth, tenth, eleventh, twelfth, thirteenth and fourteenth embodiments, respectively, of the present invention, the stacked capacitors of FIGS. 4, 6, 7, 8, 9, 10 and 11, respectively, are modified. That is, a silicon contact layer 9 is interposed between the silicon diffusion preventing conductive layer 4 and the polycrystalline silicon plug 3 (or the silicon substrate 1). For example, the silicon diffusion preventing conductive layer 4 is made of about 50 nm thick TiN, and the silicon contact layer 9 is made of about 50 nm thick $TiSi_2$. Generally, metal nitride such as TiN has bad contact characteristics to silicon, and as a result, a contact resistance therebetween is relatively large. Also, at worst, the metal nitride is peeled off the silicon. On the contrary, metal silicide such as $TiSi_2$ has good contact characteristics to silicon, silicon oxide and silicon nitride. Therefore, the silicon contact layer 9 improves the connection between the silicon diffusion preventing conductive layer 4 and the polycrystalline silicon plug 3 (or the silicon substrate 1), thus further reducing the contact resistance of the polycrystalline silicon plug 3 (or the silicon substrate 1) and the lower electrode layer (4, 5, 9). Also, the manufacturing yield can be enhanced.

Figure 12:
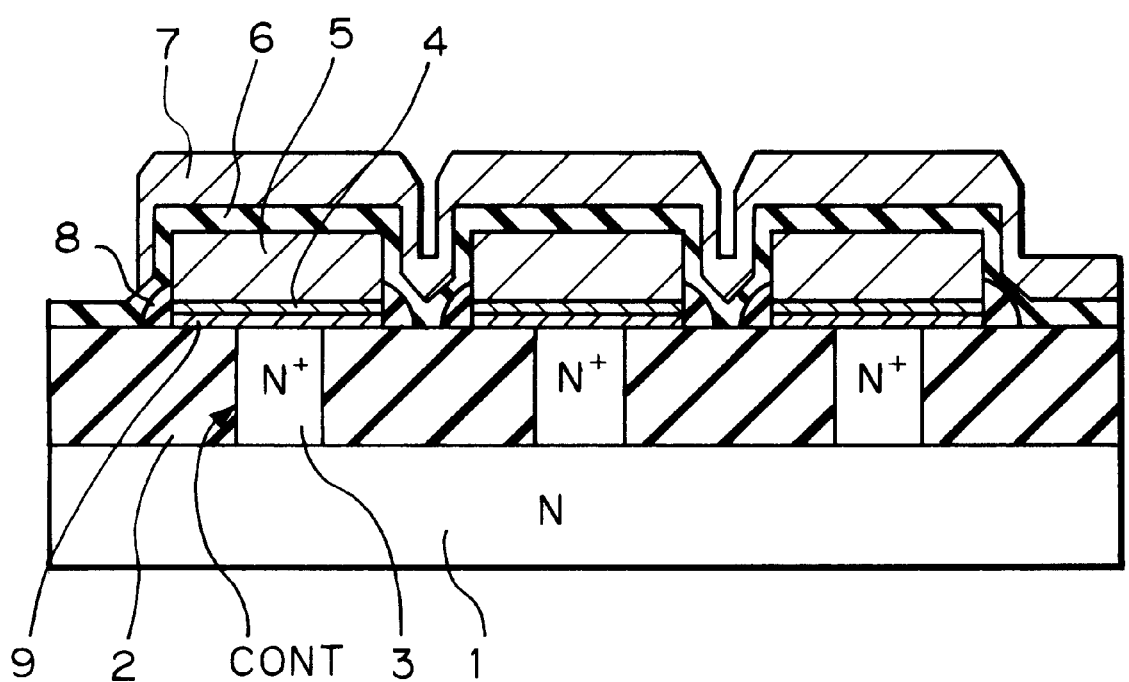
FIG. 12 is a cross-sectional view illustrating an eighth embodiment of the stacked capacitor according to the present invention.
Figure 13:
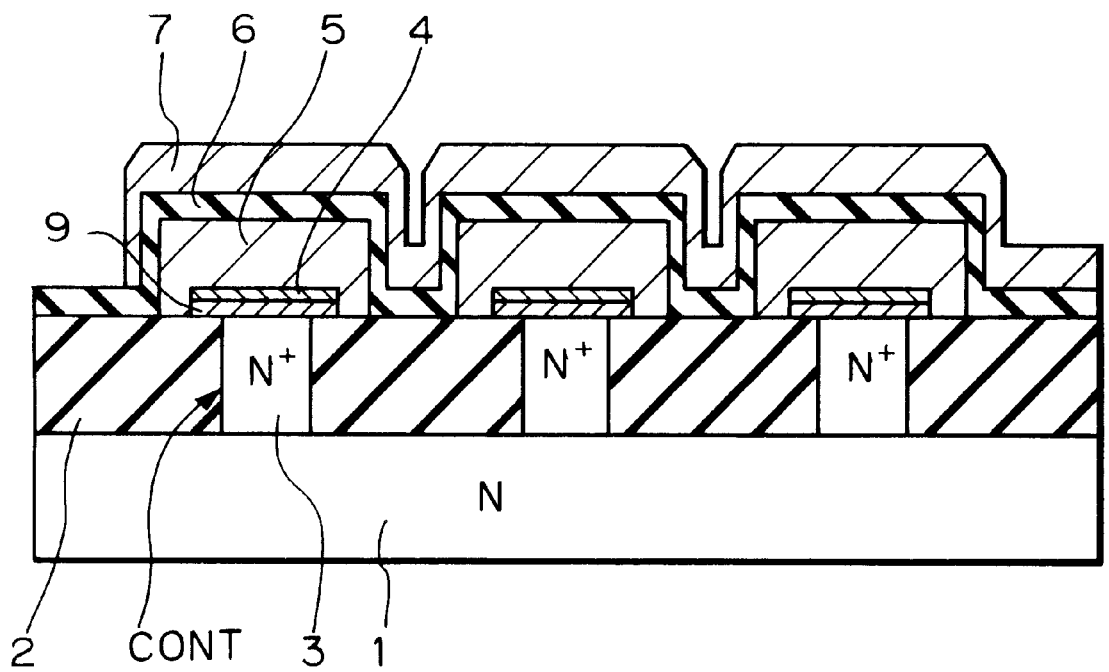
FIG. 13 is a cross-sectional view illustrating a ninth embodiment of the stacked capacitor according to the present invention.
Figure 14:
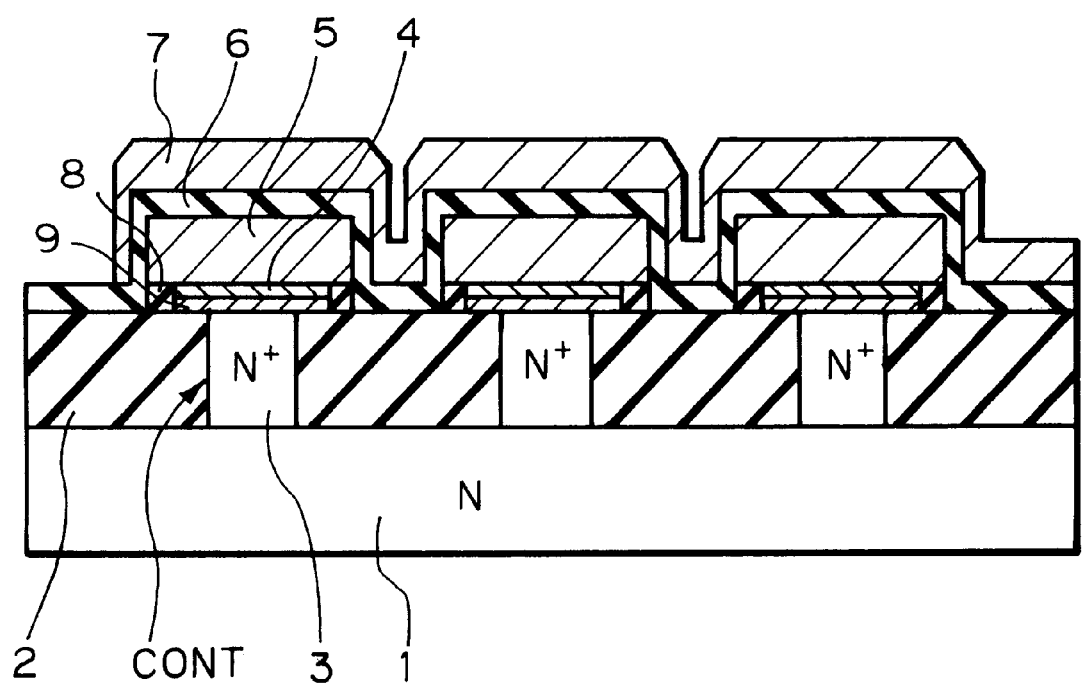
FIG. 14 is a cross-sectional view illustrating a tenth embodiment of the stacked capacitor according to the present invention.
Figure 15:
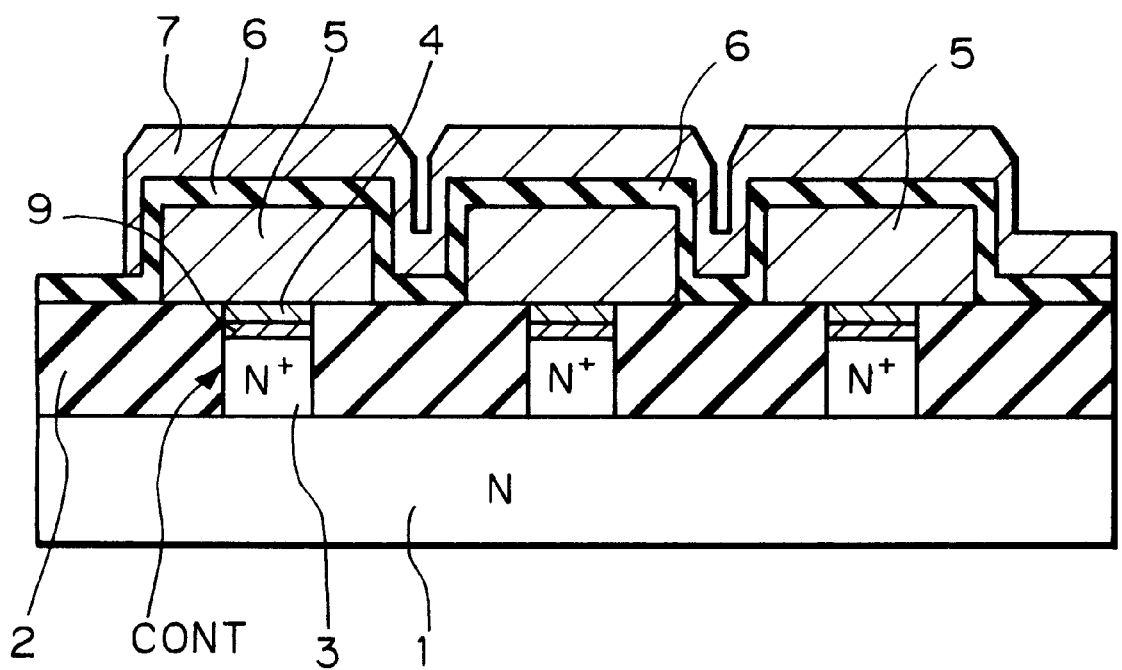
FIG. 15 is a cross-sectional view illustrating an eleventh embodiment of the stacked capacitor according to the present invention.
Figure 19:
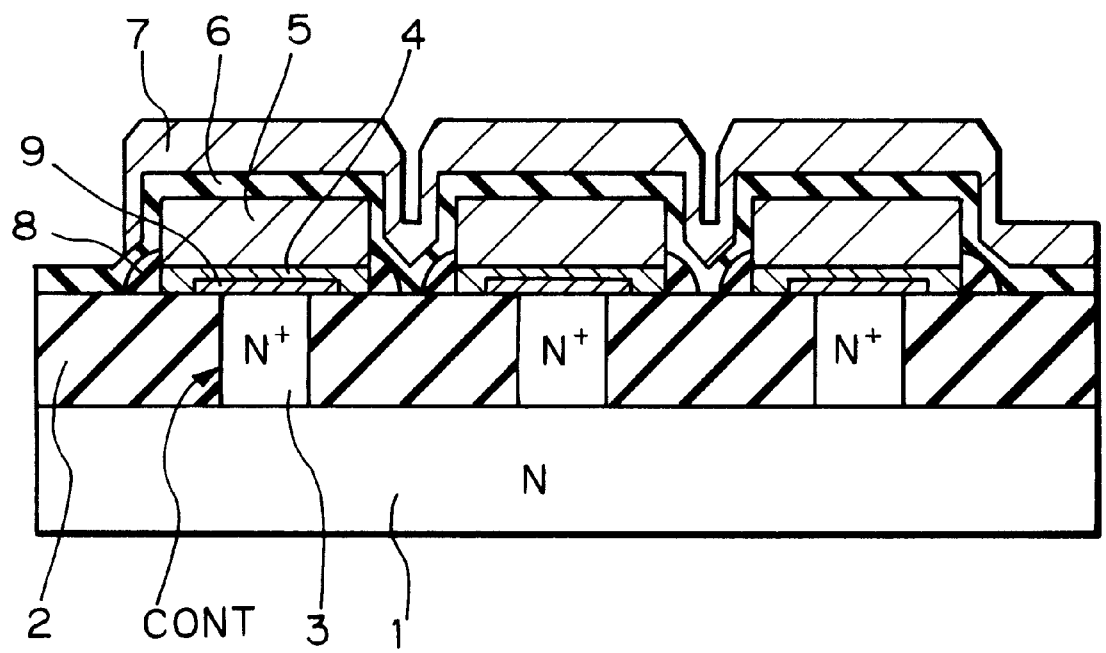
FIG. 19 is a cross-sectional view illustrating a fifteenth embodiment of the stacked capacitor according to the present invention.
Figure 20:
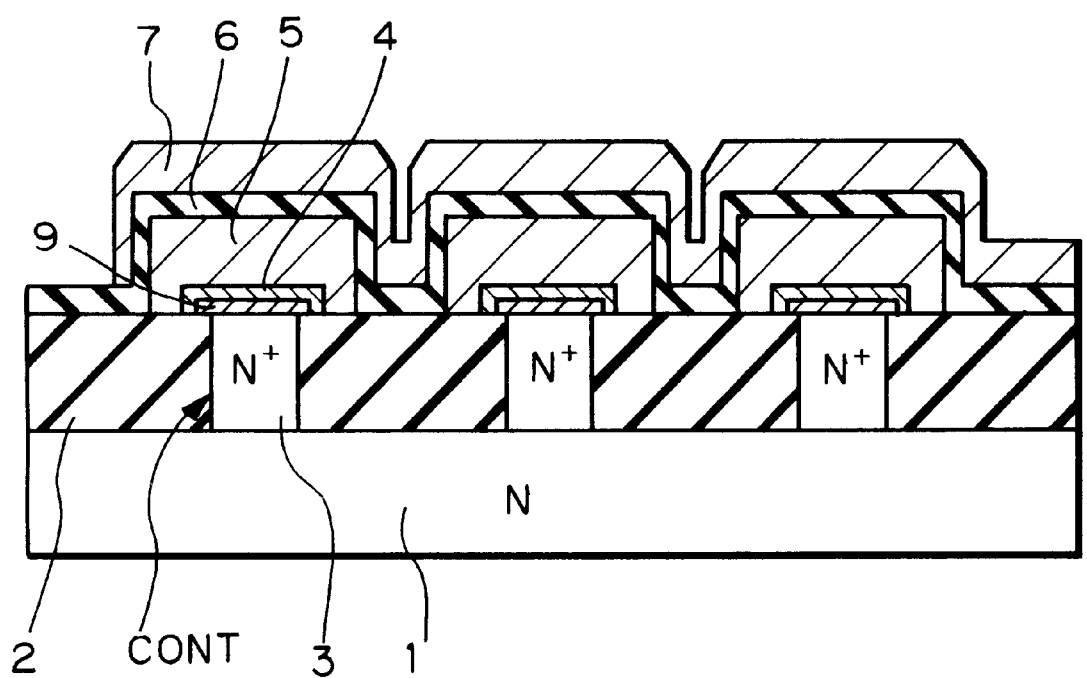
FIG. 20 is a cross-sectional view illustrating a sixteenth embodiment of the stacked capacitor according to the present invention.
Figure 21:
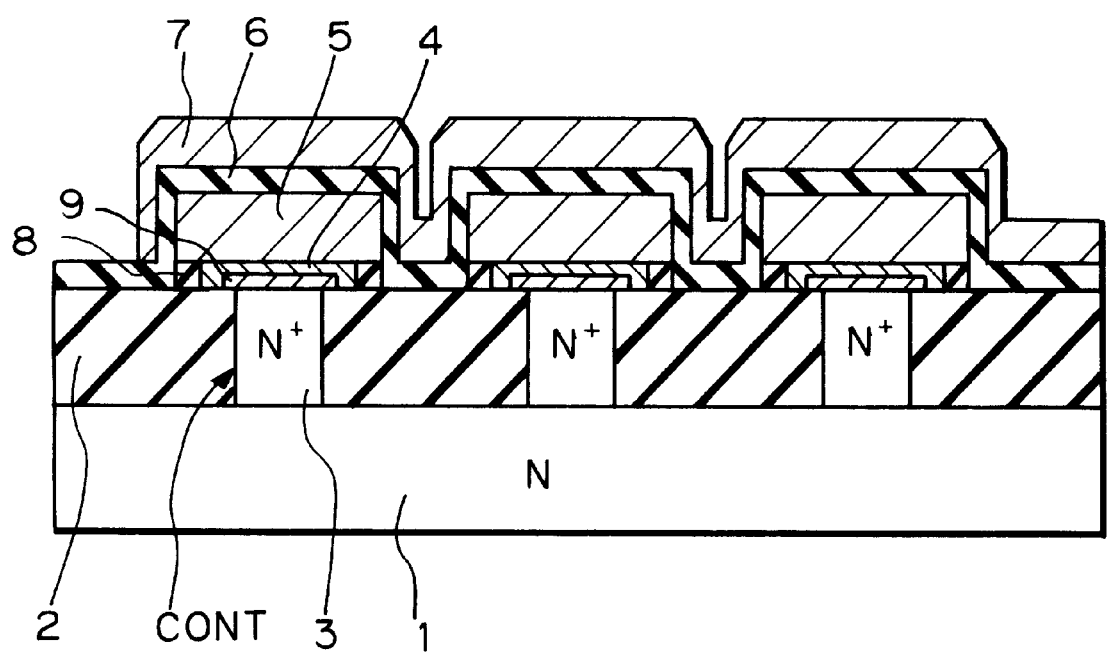
FIG. 21 is a cross-sectional view illustrating a seventeenth embodiment of the stacked capacitor according to the present invention.

In FIGS. 19, 20 and 21, which illustrate fifteenth, sixteenth and seventeenth embodiments, respectively, of the present invention, the stacked capacitors of FIGS. 12, 13 and 14, respectively, are modified. That is, the silicon contact layer 9 is reduced in a lateral direction as compared with that of FIGS. 12, 13 and 14. Therefore, the stacked capacitor can be reduced in size to enhance the integration.

In FIGS. 22, 23, 24 and 25 which illustrate eighteenth, nineteenth, twentieth and twenty-first embodiments, respectively, of the present invention, the stacked capacitors of FIGS. 15, 16, 17 and 18 are modified. That is, the silicon contact layer 9 is also formed on a sidewall of the insulating layer 2 within the contact hole CONT. As a result, the formation of the silicon contact layer 9 is easy, so that the manufacturing yield can be enhanced.

The methods for manufacturing the stacked capacitors according to the present invention are explained next.

FIGS. 26A through 26G are cross-sectional views for explaining the stacked capacitor of FIG. 4.

Figure 26A:
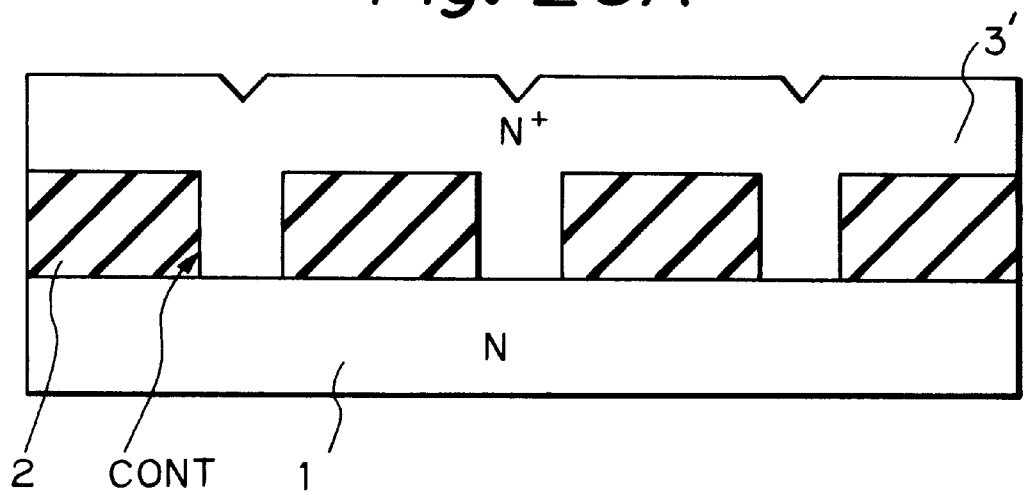
FIGS. 26A through 26G are cross-sectional views for explaining a method for manufacturing the stacked capacitor of FIG. 4.

First, referring to FIG. 26A, an N-type monocrystalline silicon substrate 1 having a resistance of about 0.1 $\Omega$.cm is thermally oxidized to form an about 600 nm thick insulating layer 2 made of silicon oxide. Then, a contact hole CONT is perforated in the insulating layer 2. Then, an about 1 $\mu$m thick polycrycrystalline silicon layer 3' is deposited on the entire surface by a CVD process, and phosphorous ions are diffused into the polycrystalline silicon layer 3' to reduce the resistance thereof.

Figure 26B:
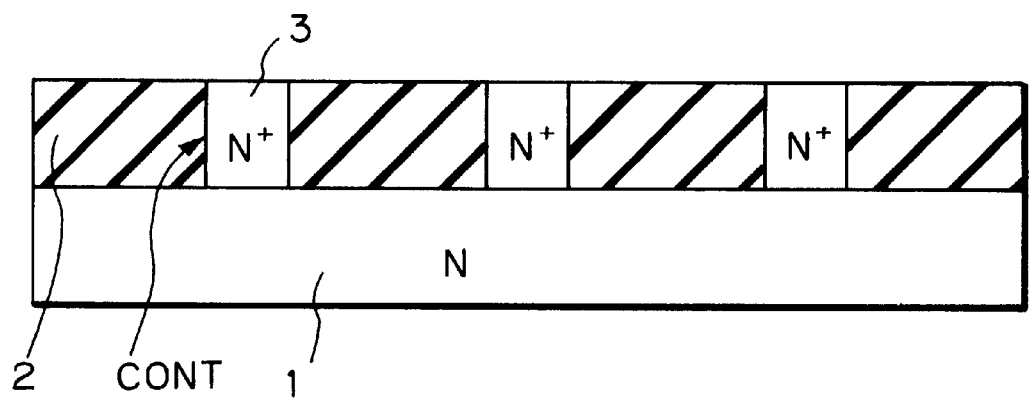

Next, referring to FIG. 26B, the polycrystalline silicon layer 3' is etched back by a reactive ion etching (RIE) process using chlorine gas, and as a result, a polycrystalline silicon plug 3 is buried in the contact hole CONT.

Figure 26C:
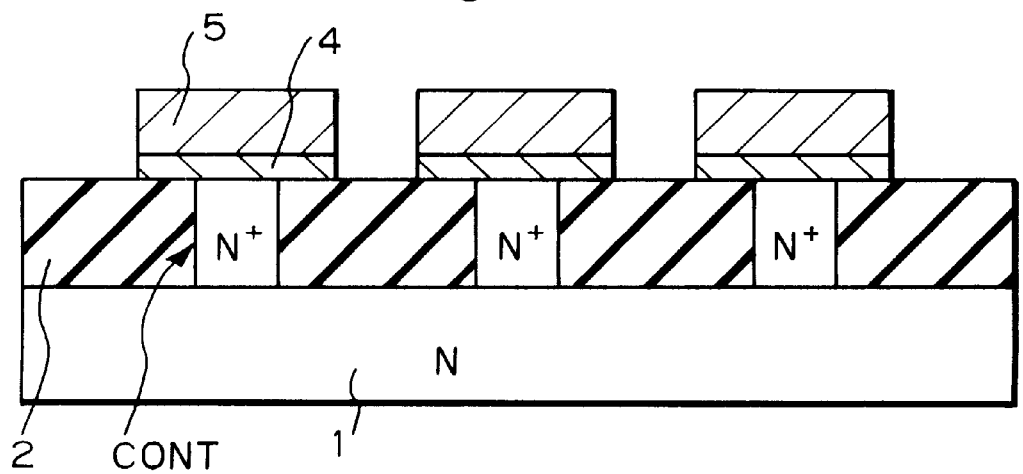

Next, referring to FIG. 26C, a TiN layer and a $RuO_2/Ru$ layer are sequentially deposited by a reactive DC sputtering process. Then, the TiN layer and the $RuO_2/Ru$ layer are patterned by an electron cyclotron resonance (ECR) plasma etching process using a mixture of chlorine gas and oxygen gas to form a silicon diffusion preventing conductive layer 4 made of TiN and an oxidation resistance conductive layer 5 made of $RuO_2$(500 nm) and Ru(50 nm).

Figure 26D:
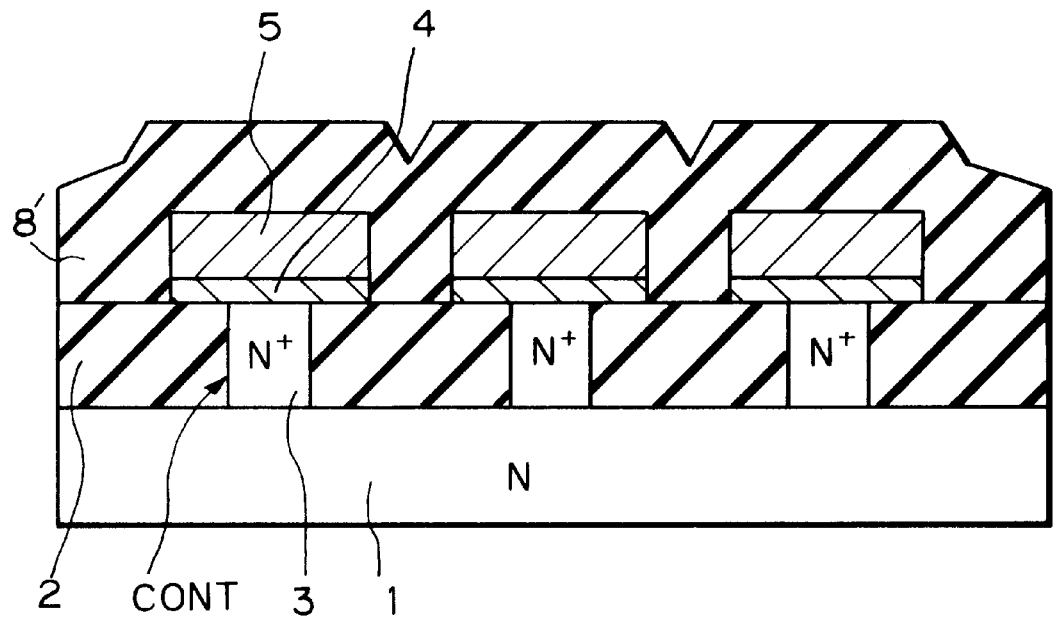

Next, referring to FIG. 26D, a silicon nitride layer 8' is deposited by a CVD process.

Figure 26E:
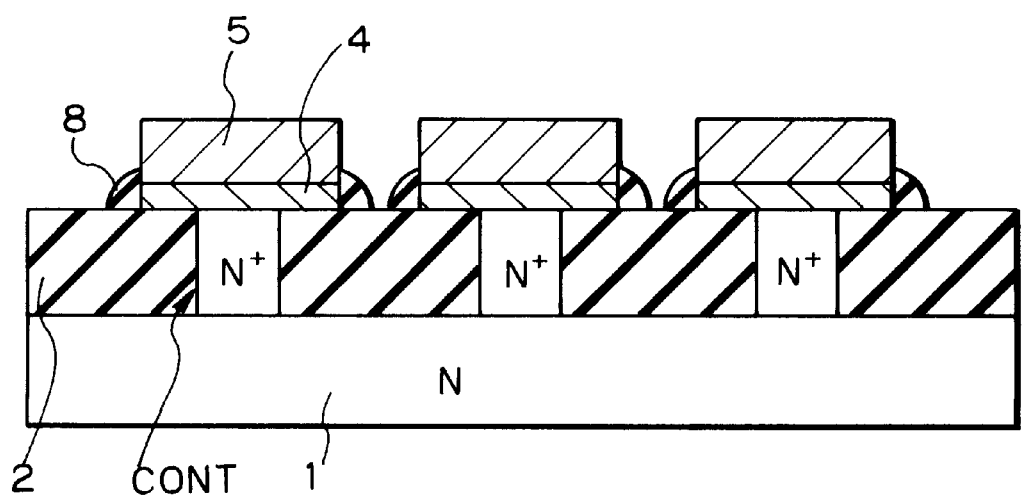

Next, referring to FIG. 26E, the silicon nitride layer 8' is etched back by an RIE process using chlorine gas to form a sidewall insulating spacer 8 made of silicon nitride. In this case, the sidewall insulating spacer 8 covers the sidewall of the silicon diffusion conductive layer 4, while the sidewall insulating spacer 8 covers only a part of the sidewall of the oxidation resistance conductive layer 5.

Figure 26F:
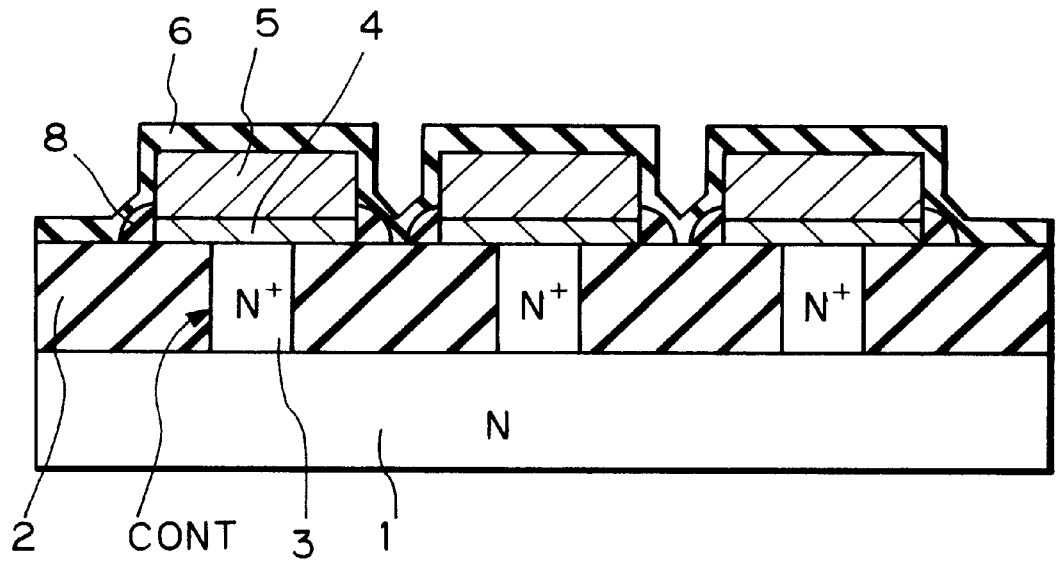

Next, referring to FIG. 26F, an about 100 nm thick high dielectric constant layer 6 made of BST is deposited on the entire surface by an ECR-MOCVD process using Ba(DPM)$_2$, Sr(DPM)$_2$, Ti(i-OC$_3$H$_7$) and oxygen gas. Here, DPM is bis-dipivaloylmethanate. In this process, the substrate temperature is about 400 to 700° C., and the gas pressure is about 7 mTorr.

Figure 26G:
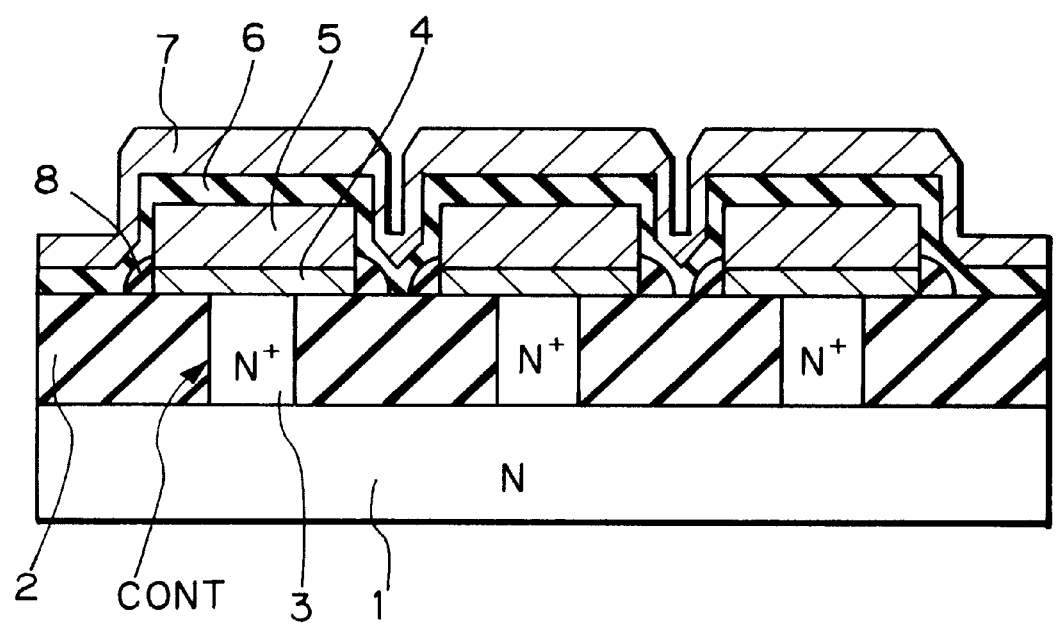

Finally, referring to FIG. 26G, an upper electrode layer 7 made of Al(1 $\mu$m)/TiN(50 nm) is deposited on the entire surface by a DC sputtering process using Ar gas.

Then, the upper electrode layer 7 is etched by an RIE process using chlorine gas, thus obtaining the stacked capacitor of FIG. 4.

Figure 27A:
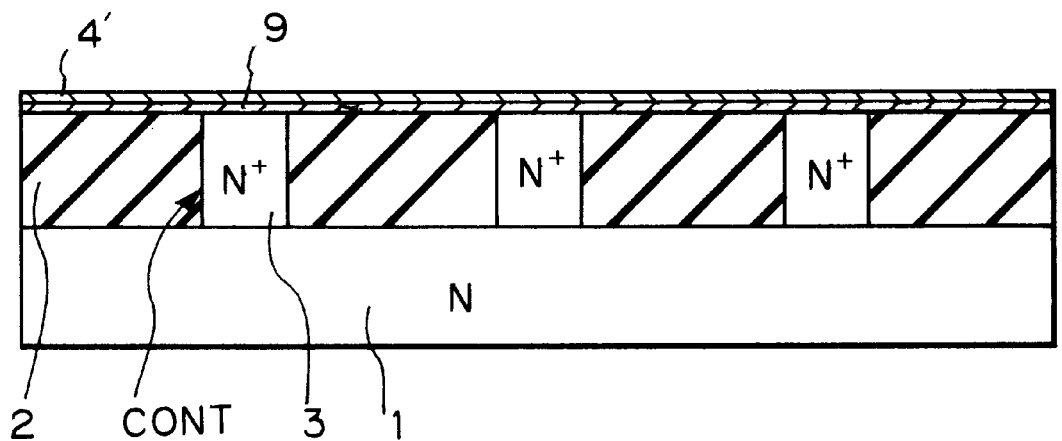
FIGS. 27A and 27B are cross-sectional views for explaining a method for manufacturing the stacked capacitors of FIGS. 12 and 19.

Note that in the process step as shown in FIG. 26C, before a TiN layer as indicated by 4' in FIG. 27A is formed, a silicon contact layer 9 made of $TiSi_2$ is formed, so that the stacked capacitor of FIG. 12 can be obtained.

Figure 27B:
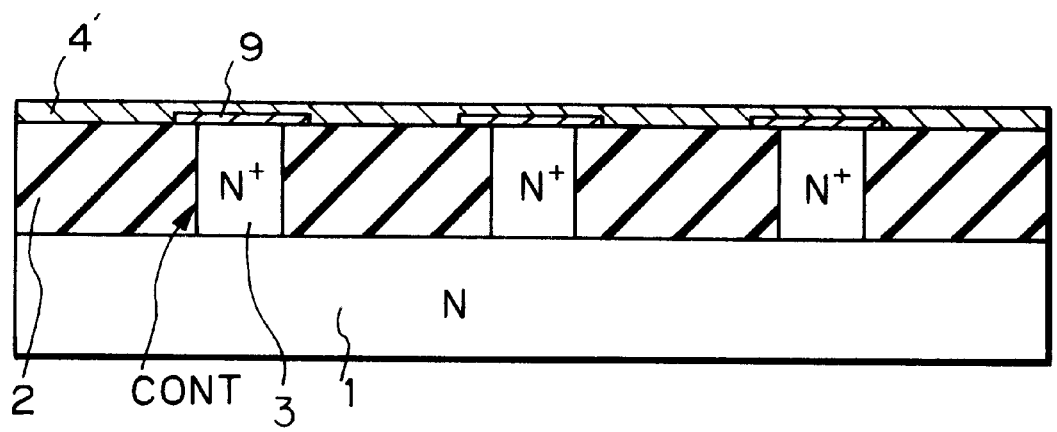

Also, after a Ti layer (not shown) is deposited when a rapid thermal annealing process at a temperature of about 700° C. is performed upon the Ti layer in a nitrogen atmosphere, a silicon contact layer 9 made of TiSi$_2$ is formed on the polycrystalline silicon plug 3 as illustrated in FIG. 27B, so that the stacked capacitor of FIG. 19 can be obtained.

FIGS. 28A through 28F are cross-sectional views for explaining the stacked capacitor of FIG. 6.

Figure 28A:
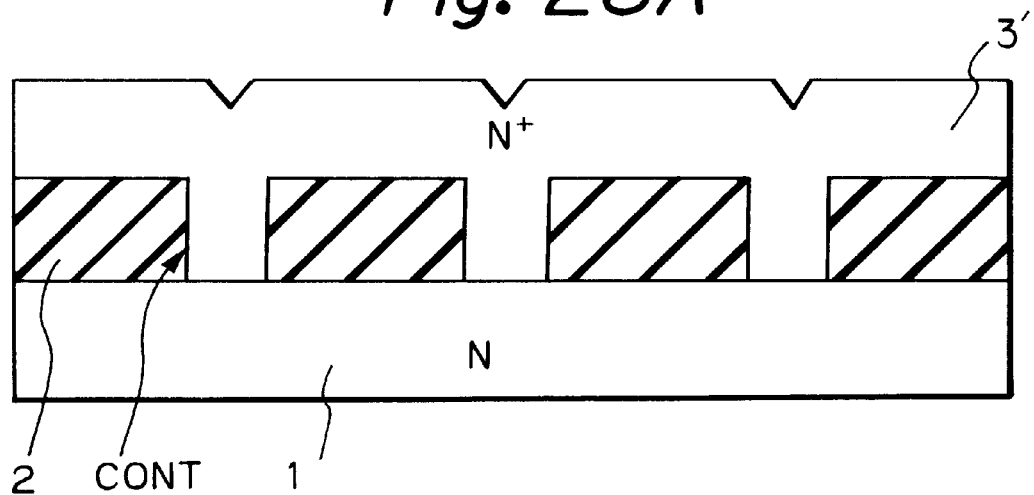
FIGS. 28A through 28F are cross-sectional views for explaining a method for manufacturing the stacked capacitor of FIG. 6.

First, referring to FIG. 28A, in the same way as in FIG. 26A, an N-type monocrystalline silicon substrate 1 having a resistance of about 0.1 Ω.cm is thermally oxidized to form an about 600 nm thick insulating layer 2 made of silicon oxide. Then, a contact hole CONT is perforated in the insulating layer 2. Then, an about 1 μm thick polycrycrystalline silicon layer 3' is deposited on the entire surface by a CVD process, and phosphorous ions are diffused into the polycrystalline silicon layer 3' to reduce the resistance thereof.

Figure 28B:
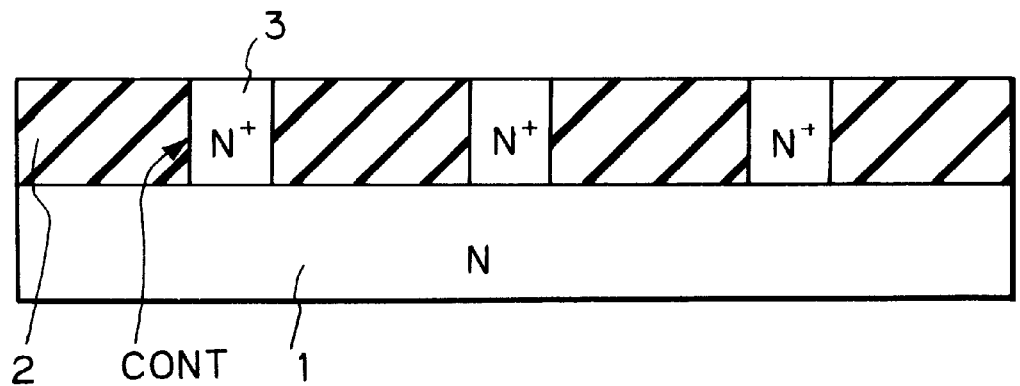

Next, referring to FIG. 28B, in the same way as in FIG. 26B, the polycrystalline silicon layer 3' is etched back by an RIE process using chlorine gas, and as a result, a polycrystalline silicon plug 3 is buried in the contact hole CONT.

Figure 28C:
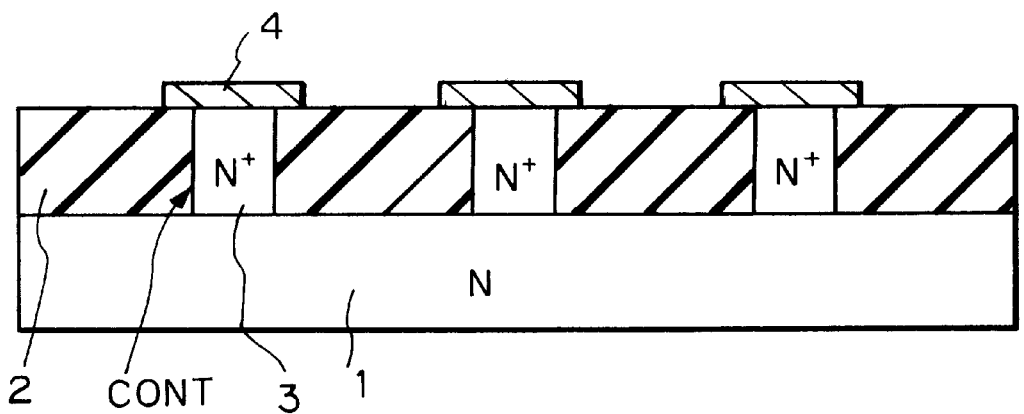

Next, referring to FIG. 28C, a TiN layer is deposited by a reactive DC sputtering process. Then, the TiN layer is patterned by an ECR plasma etching process using a mixture of chlorine gas and oxygen gas to form a silicon diffusion preventing conductive layer 4 made of TiN.

Figure 28D:
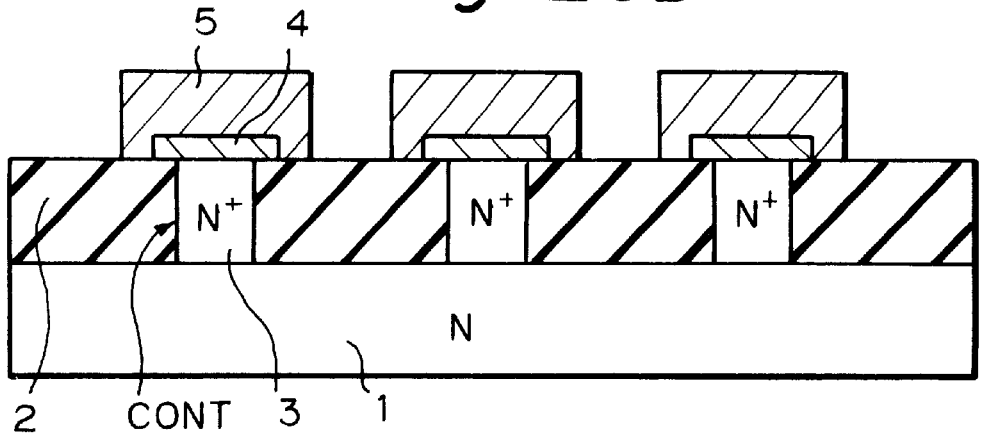

Next, referring to FIG. 28D, a RuO$_2$/Ru layer is deposited by a reactive DC sputtering process. Then, the RuO$_2$/Ru layer is patterned by an ECR plasma etching process using a mixture of chlorine gas and oxygen gas to form an oxidation resistance conductive layer 5 made of RuO$_2$(500 nm) and Ru(50 nm).

Figure 28E:
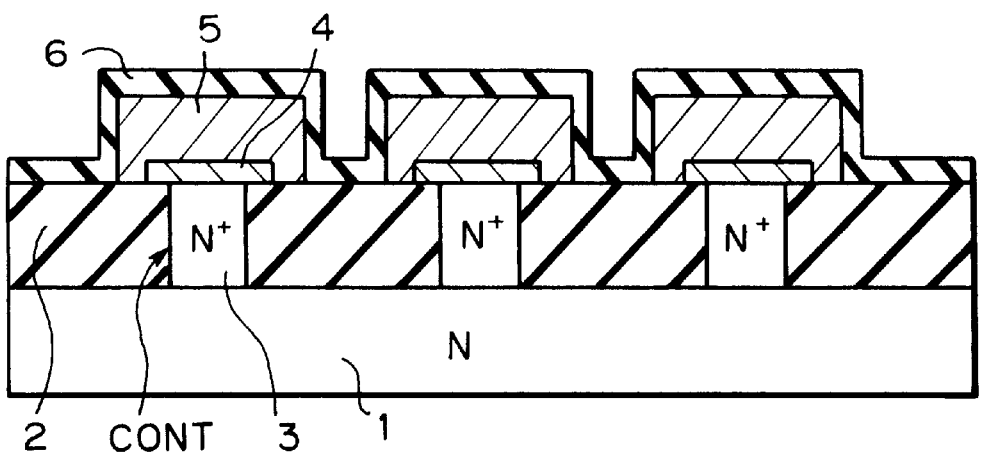

Next, referring to FIG. 28E, in the same way as in FIG. 26F, an about 100 nm thick high dielectric constant layer 6 made of BST is deposited on the entire surface by an ECR-MOCVD process using Ba(DPM)$_2$, Sr(DPM)$_2$, Ti(i-OC$_3$H$_7$) and oxygen gas. In this process, the substrate temperature is about 400 to 700° C., and the gas pressure is about 7 mTorr.

Figure 28F:
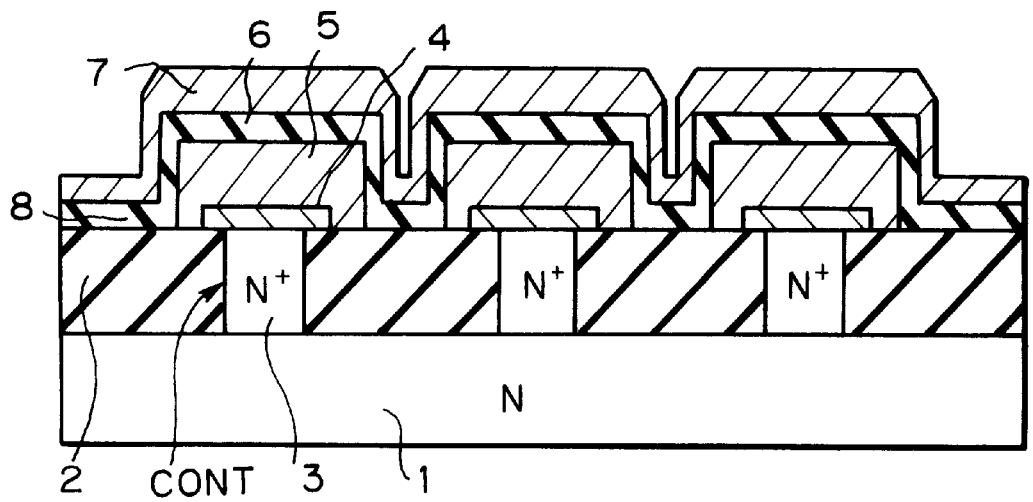

Finally, referring to FIG. 28F in the same way as in FIG. 26G, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 6.

Figure 29A:
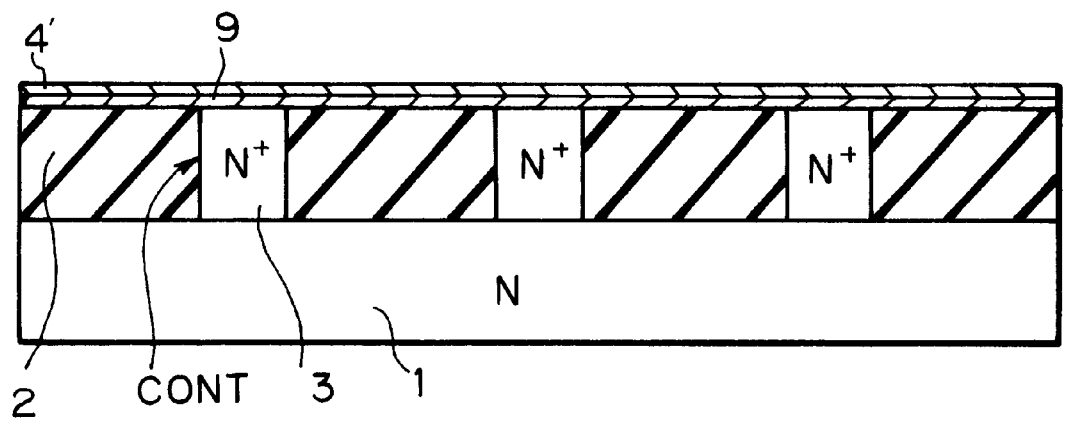
FIGS. 29A and 29B are cross-sectional views for explaining a method for manufacturing the stacked capacitors of FIGS. 13 and 20.

Note that in the process step as shown in FIG. 28C, before a TiN layer as indicated by 4' in FIG. 29A is formed, a silicon contact layer 9 made of TiSi$_2$ is formed, so that the stacked capacitor of FIG. 13 can be obtained.

Figure 29B:
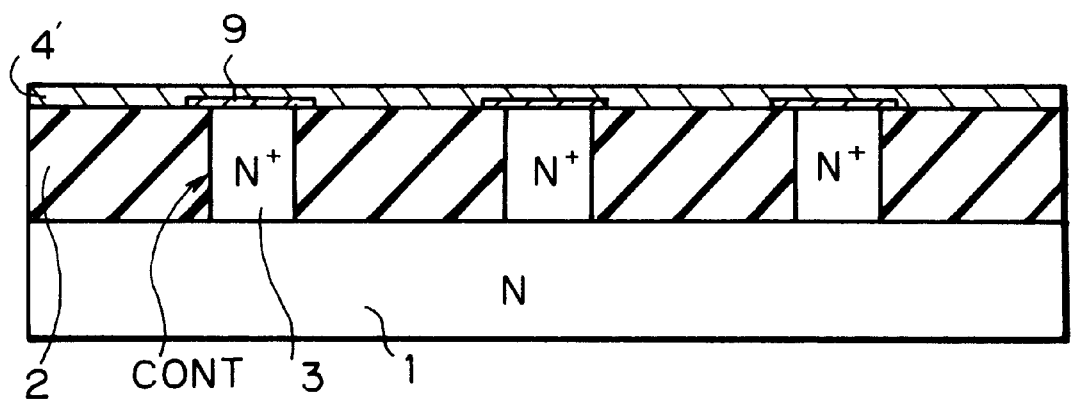

Also, after a Ti layer (not shown) is deposited when a rapid thermal annealing process at a temperature of about 700° C. is performed upon the Ti layer in a nitrogen atmosphere, a silicon contact layer 9 made of TiSi$_2$ is formed on the polycrystalline silicon plug 3 as illustrated in FIG. 29B, so that the stacked capacitor of FIG. 20 can be obtained.

FIGS. 30A through 30H are cross-sectional views for explaining the stacked capacitor of FIG. 7.

Figure 30A:
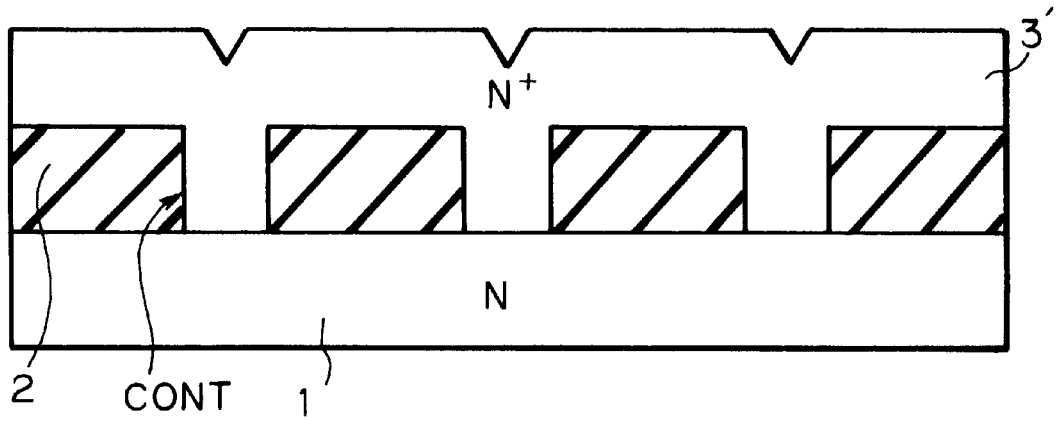
FIGS. 30A through 30H are cross-sectional views for explaining a method for manufacturing the stacked capacitor of FIG. 7.

First, referring to FIG. 30A, in the same way as in FIG. 26A, an N-type monocrystalline silicon substrate 1 having a resistance of about 0.1 Ω.cm is thermally oxidized to form an about 600 nm thick insulating layer 2 made of silicon oxide. Then, a contact hole CONT is perforated in the insulating layer 2. Then, an about 1 μm thick polycrycrystalline silicon layer 3a is deposited on the entire surface by a CVD process, and phosphorous ions are diffused into the polycrystalline silicon layer 3a to reduce the resistance thereof.

Figure 30B:
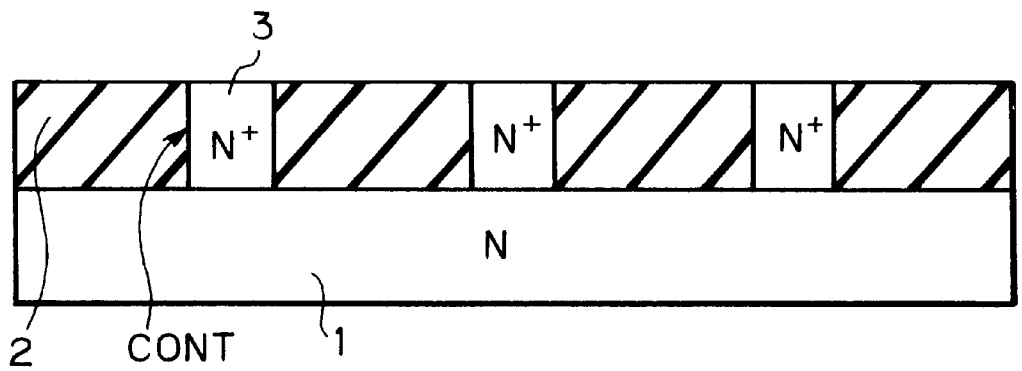

Next, referring to FIG. 30B, in the same way as in FIG. 26B, the polycrystalline silicon layer 3' is etched back by an RIE process using chlorine gas, and as a result, a polycrystalline silicon plug 3 is buried in the contact hole CONT.

Figure 30C:
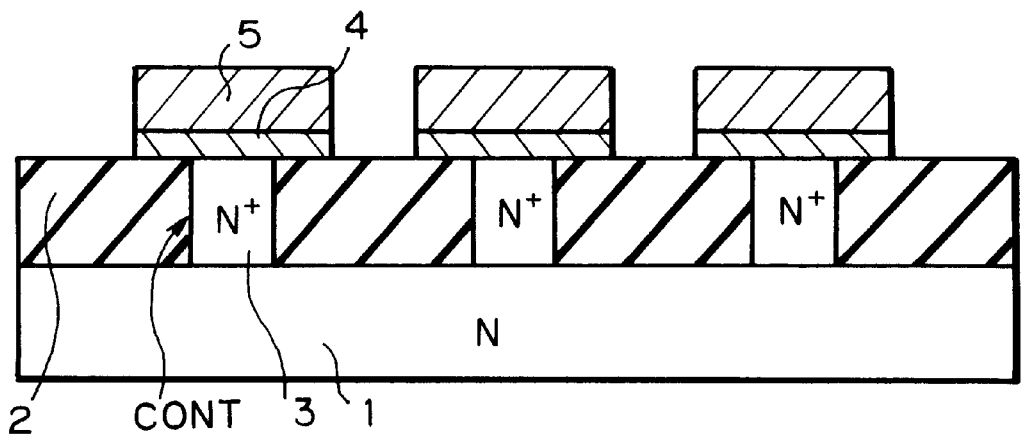

Next, referring to FIG. 30C, in the same way as in FIG. 26C, a TiN layer and a RuO$_2$/Ru layer are sequentially deposited by a reactive DC sputtering process. Then, the TiN layer and the RuO$_2$/Ru layer are patterned by an ECR plasma etching process using a mixture of chlorine gas and oxygen gas to form a silicon diffusion preventing conductive layer 4 made of TiN and an oxidation resistance conductive layer 5 made of RuO$_2$(500 nm) and Ru(50 nm).

Figure 30D:
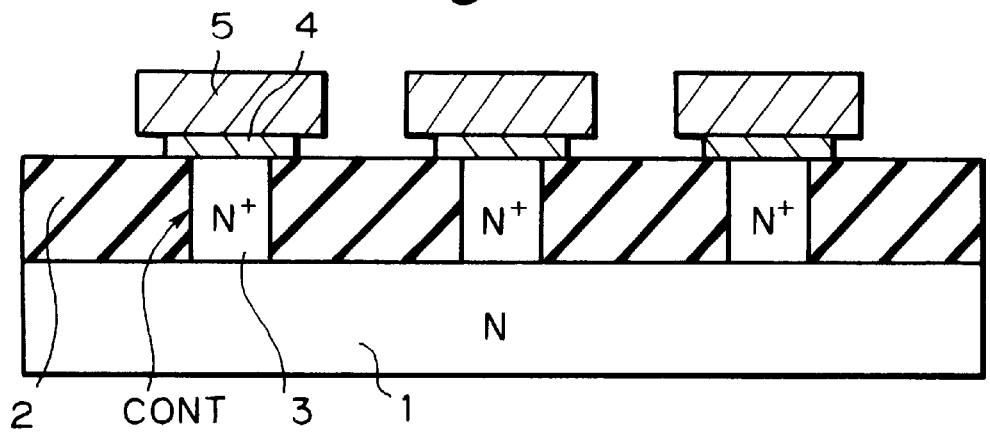

Next, referring to FIG. 30D, only the side of the silicon diffusion preventing conductive layer 4 is etched by a wet etching process using ammonia peroxide mixture, sulfuric acid peroxide mixture or hydrochloric acid peroxide mixture.

Figure 30E:
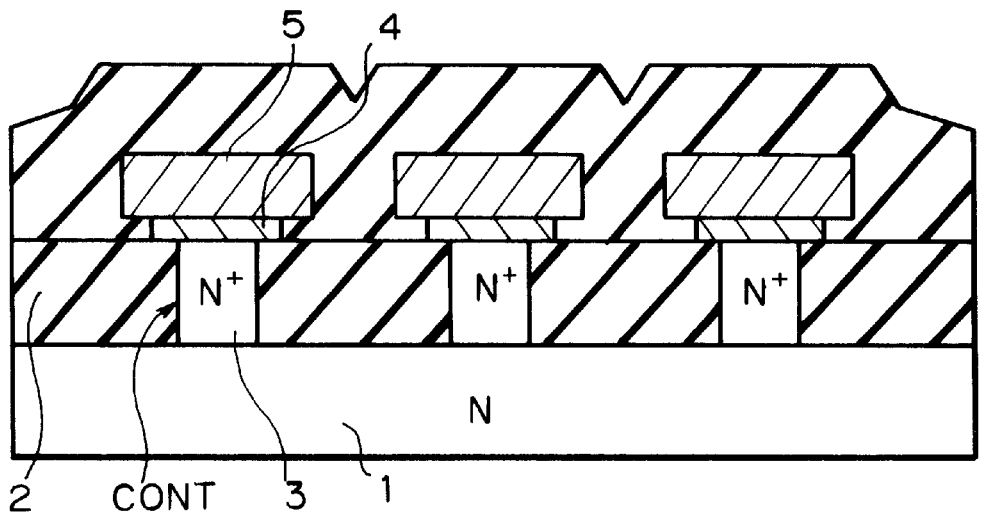

Next, referring to FIG. 30E, in the same way as in FIG. 26D, a silicon nitride layer 8' is deposited by a CVD process.

Figure 30F:
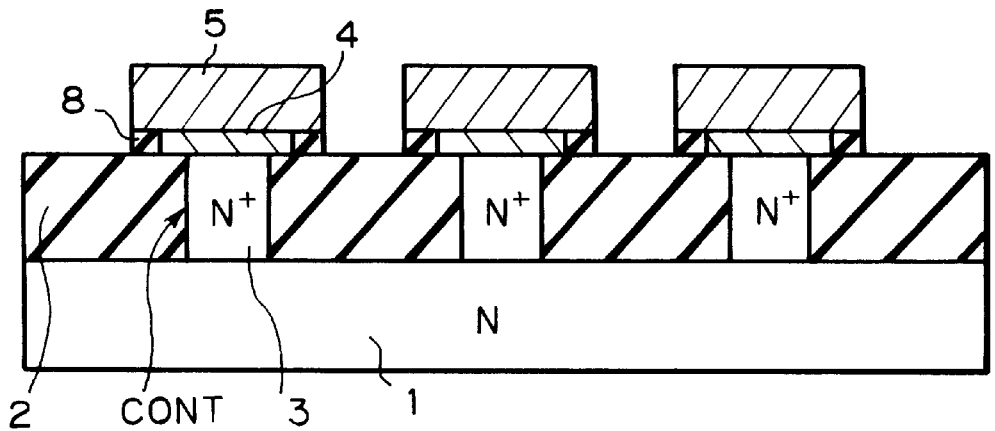

Next, referring to FIG. 30F, in a similar way to FIG. 26E, the silicon nitride layer 8' is etched back by an RIE etching process using chlorine gas to form a sidewall insulating spacer 8 made of silicon nitride. In this case, the sidewall insulating spacer 8 is located under the oxidation resistance conductive layer 5. That is, the sidewall insulating spacer 8 covers the sidewall of the silicon diffusion conductive layer 4, while the sidewall insulating spacer 8 does not cover the sidewall of the oxidation resistance conductive layer 5.

Figure 30G:
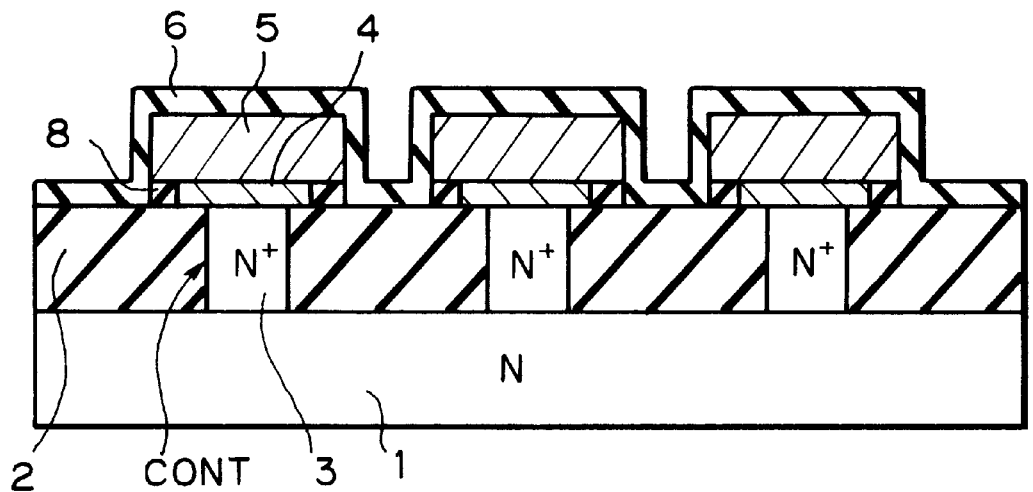

Next, referring to FIG. 30G, in the same way as in FIG. 26F, an about 100 nm thick high dielectric constant layer 6 made of BST is deposited on the entire surface by an ECR-MOCVD process using Ba(DPM)$_2$, Sr(DPM)$_2$, Ti(i-OC$_3$H$_7$) and oxygen gas. In this process, the substrate temperature is about 400 to 700° C., and the gas pressure is about 7 mTorr.

Figure 30H:
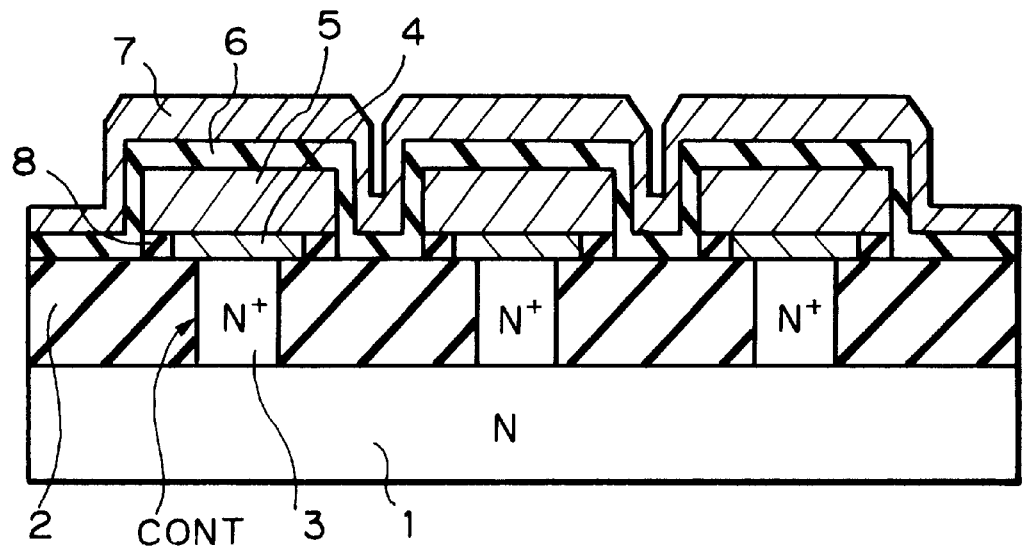

Finally, referring to FIG. 30H, in the same way as in FIG. 26G, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 7.

Figure 31A:
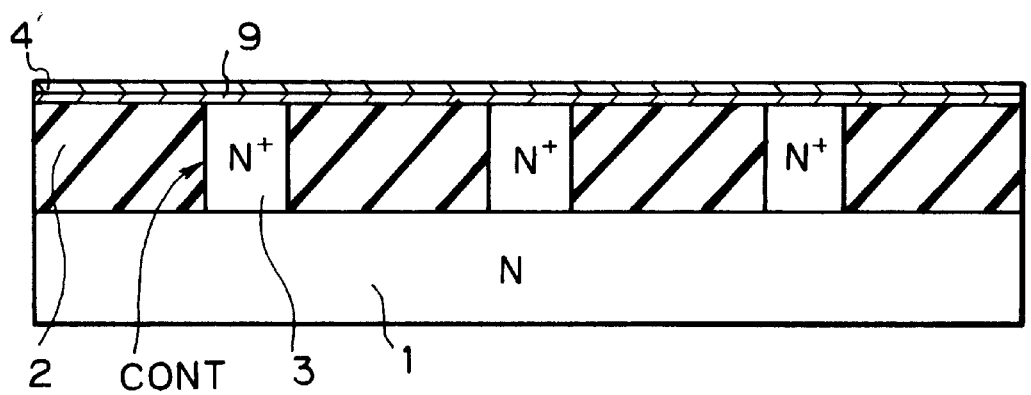
FIGS. 31A and 31B are cross-sectional views for explaining a method for manufacturing the stacked capacitor of FIGS. 14 and 21.

Note that in the process step as shown in FIG. 30C, before a TiN layer as indicated by 4' in FIG. 31A is formed, a silicon contact layer 9 made of TiSi$_2$ is formed, so that the stacked capacitor of FIG. 14 can be obtained.

Figure 31B:
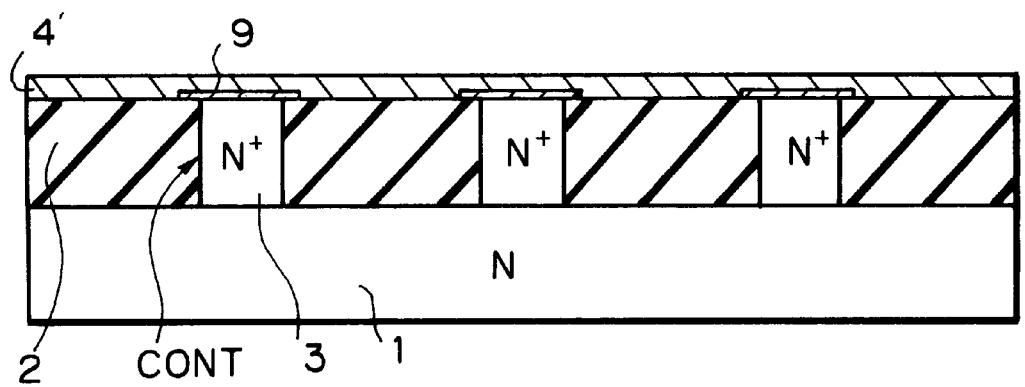

Also, after a Ti layer (not shown) is deposited when a rapid thermal annealing process at a temperature of about 700° C. is performed upon the Ti layer in a nitrogen atmosphere, a silicon contact layer 9 made of TiSi$_2$ is formed on the polycrystalline silicon plug 3 as illustrated in FIG. 31B, so that the stacked capacitor of FIG. 21 can be obtained.

FIGS. 32A through 32G are cross-sectional views for explaining the stacked capacitor of FIG. 8.

Figure 32A:
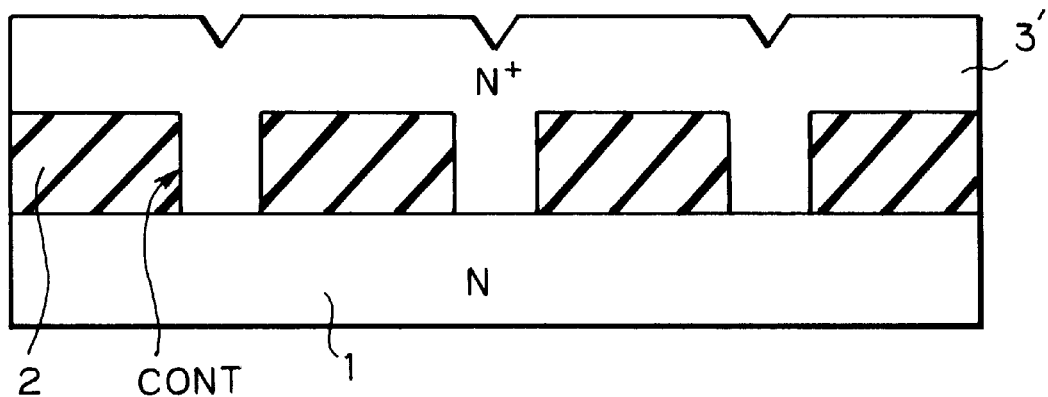
FIGS. 32A through 32G are cross-sectional views for explaining a method for manufacturing the stacked capacitor of FIG. 8.

First, referring to FIG. 32A, in the same way as in FIG. 26A, an N-type monocrystalline silicon substrate 1 having a resistance of about 0.1 Ω.cm is thermally oxidized to form an about 600 nm thick insulating layer 2 made of silicon oxide. Then, a contact hole CONT is perforated in the insulating layer 2. Then, an about 1 μm thick polycrycrystalline silicon layer 3' is deposited on the entire surface by a CVD process, and phosphorous ions are diffused into the polycrystalline silicon layer 3' to reduce the resistance thereof.

Figure 32B:
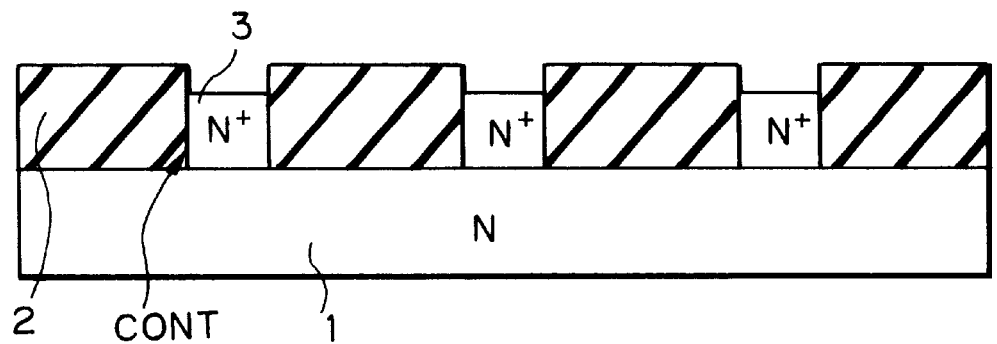

Next, referring to FIG. 32B, in a similar way to FIG. 26B, the polycrystalline silicon layer 3' is etched back by an RIE process using chlorine gas, and as a result, a polycrystalline silicon plug 3 is buried in the contact hole CONT. Also, in this case, the top surface of the polycrystalline silicon plug 3 is lower than that of the insulating layer 2 by about 100 nm.

Figure 32C:
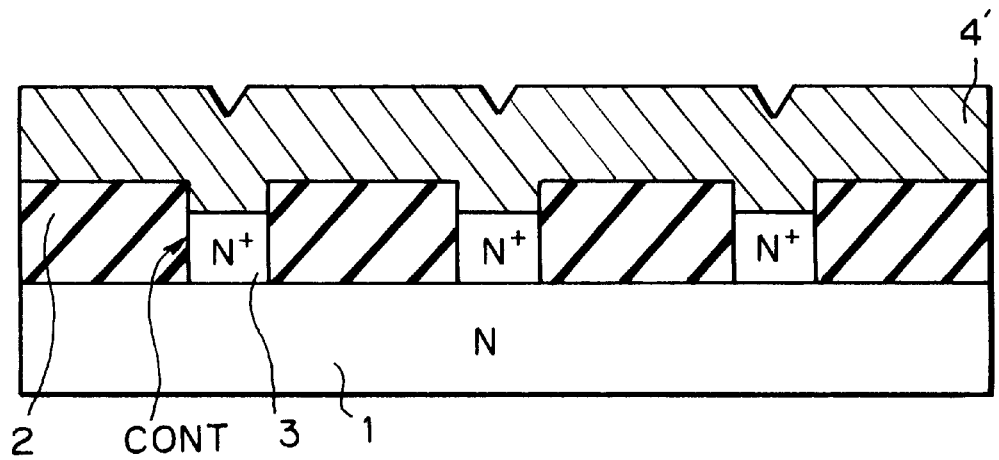

Next, referring to FIG. 32C, an about 600 nm TiN layer 4' is deposited by a reactive DC sputtering process using a mixture of argon gas and nitrogen gas.

Figure 32D:
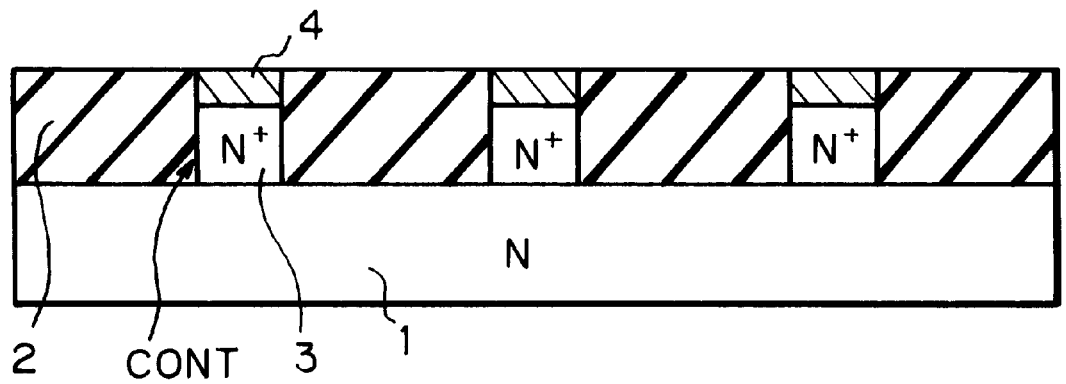

Next, referring to FIG. 32D, the TiN layer 4' on the insulating layer 2 is removed by a chemical mechanical polishing (CMP) process using colloidal silica, so that a silicon diffusion preventing conductive layer 4 made of TiN is buried in the contact hole CONT.

Figure 32E:
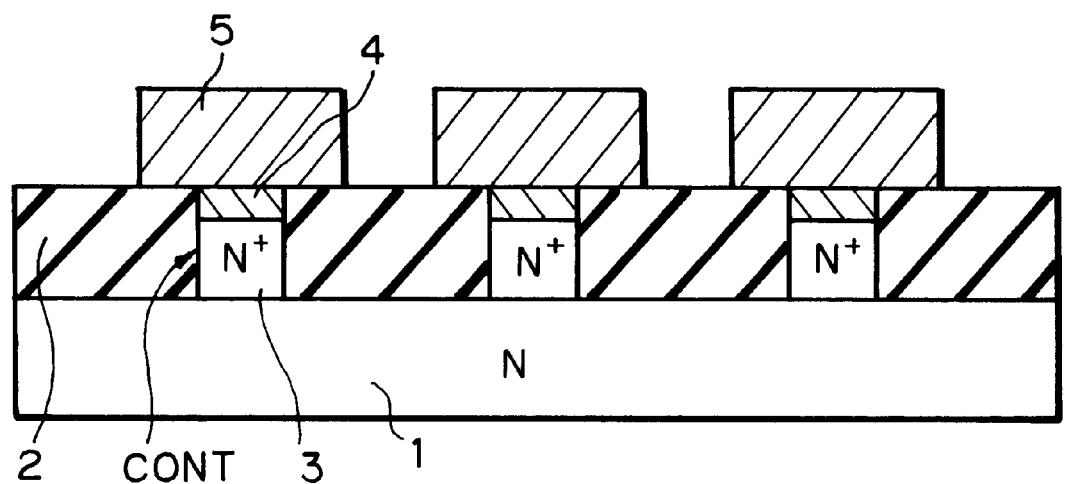

Next, referring to FIG. 32E, a $RuO_2$/Ru layer is deposited by a reactive DC sputtering process. Then, the $RuO_2$/Ru layer is patterned by an ECR plasma etching process using a mixture of chlorine gas and oxygen gas to form an oxidation resistance conductive layer 5 made of $RuO_2$(500 nm) and Ru(50 nm).

Figure 32F:
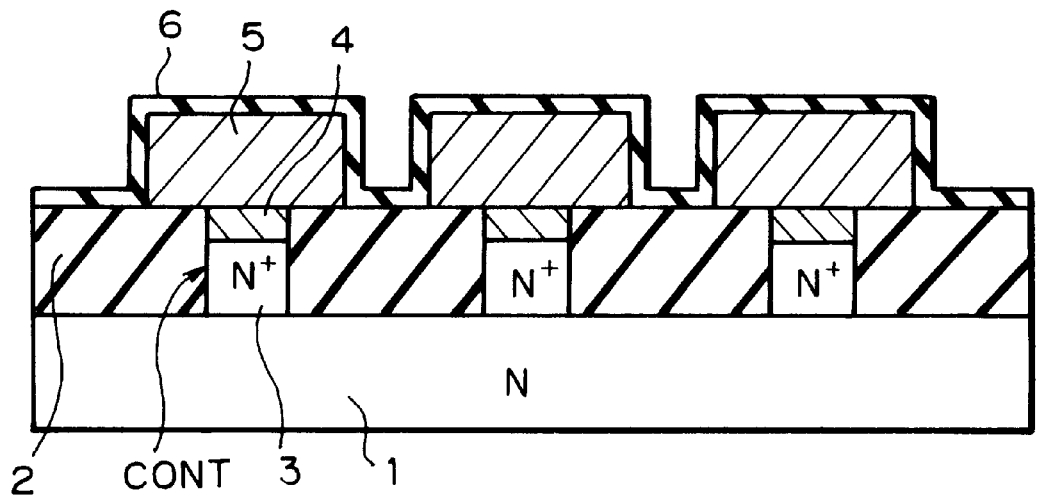

Next, referring to FIG. 32F, in the same way as in FIG. 26F, an about 100 nm thick high dielectric constant layer 6 made of BST is deposited on the entire surface by an ECR-MOCVD process using $Ba(DPM)_2$, $Sr(DPM)_2$, $Ti(i-OC_3H_7)$ and oxygen gas. In this process, the substrate temperature is about 400 to 700° C., and the gas pressure is about 7 mTorr.

Figure 32G:
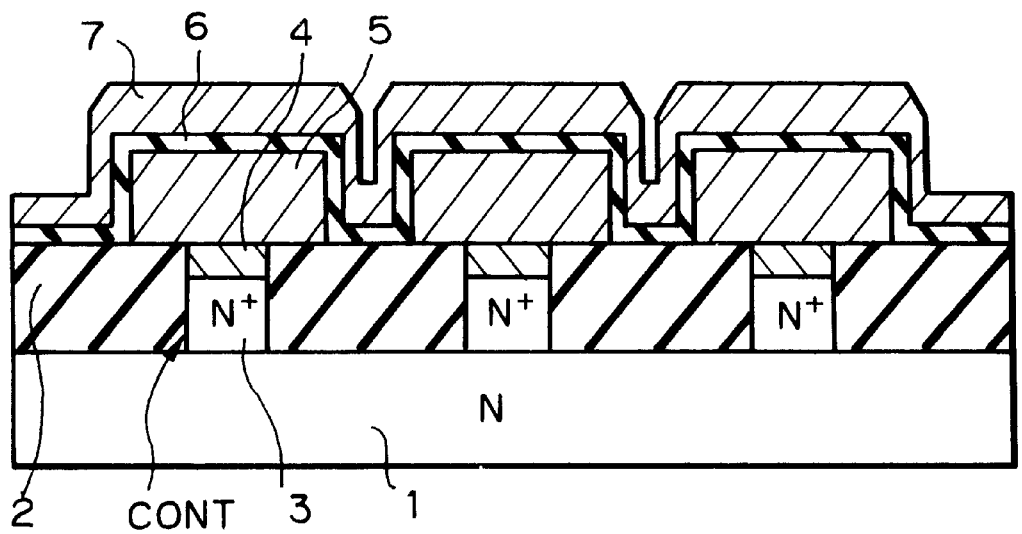

Finally, referring to FIG. 32G, in the same way as in FIG. 26G, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 8.

Figure 22:
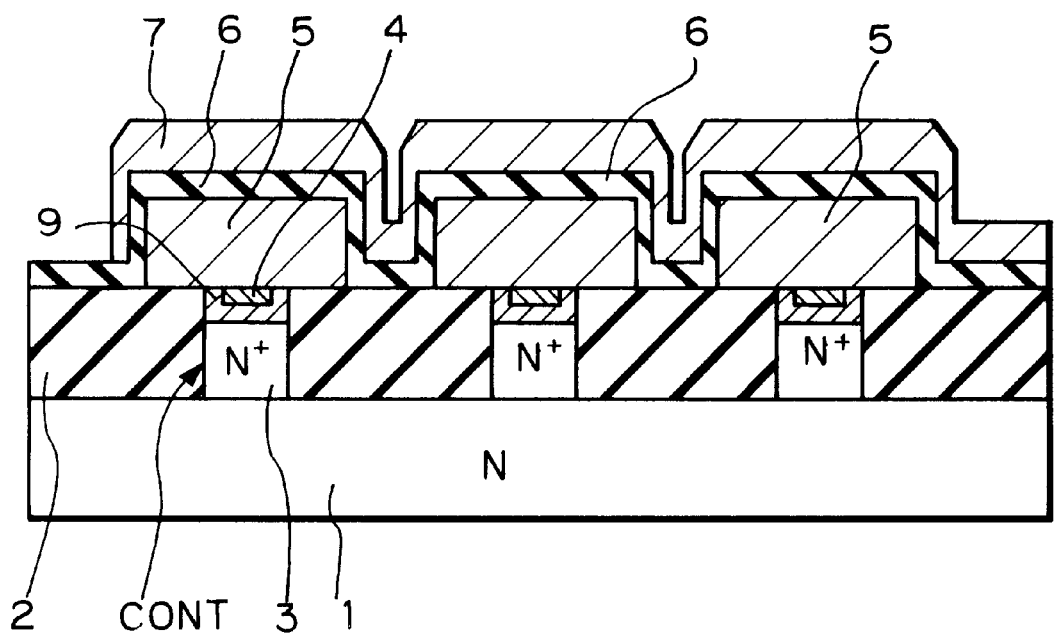
FIG. 22 is a cross-sectional view illustrating an eighteenth embodiment of the stacked capacitor according to the present invention.

Note that in the process step as shown in FIG. 32C, before the TiN layer 4' is formed, a silicon contact layer 9 made of $TiSi_2$ is formed, so that the stacked capacitor of FIG. 22 can be obtained.

Figure 33A:
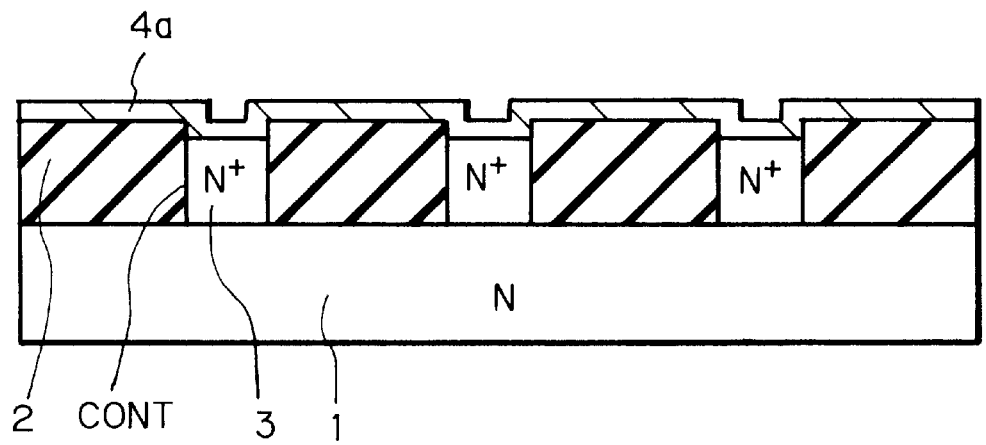
FIGS. 33A, 33B and 33C are cross-sectional views for explaining a method for manufacturing the stacked capacitor of FIG. 15.
Figure 33B:
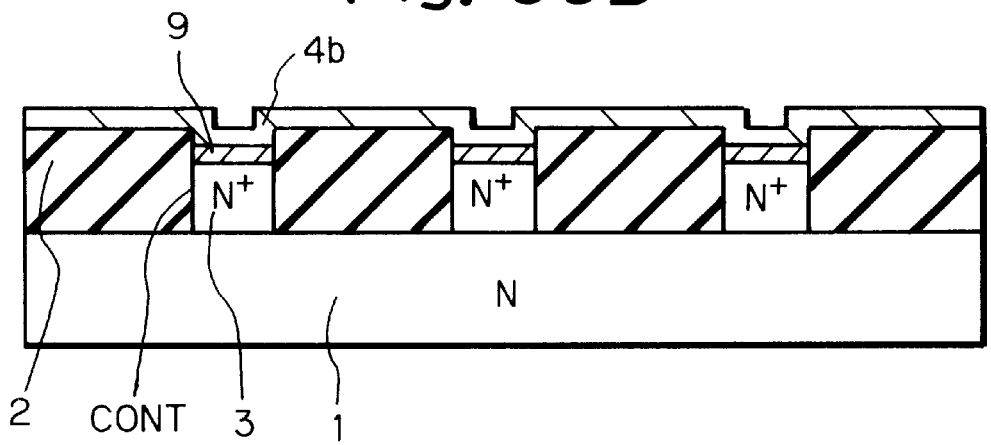
Figure 33C:
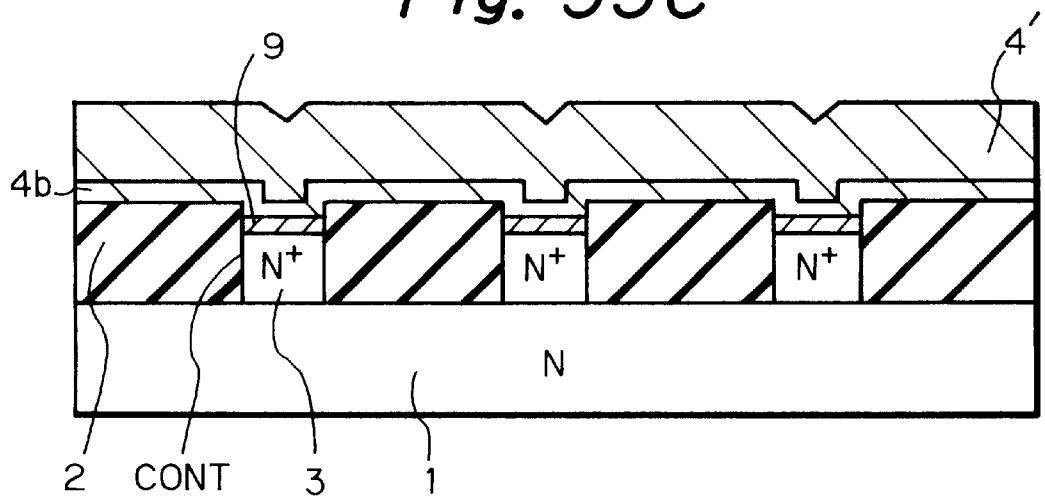

Also, before the TiN layer 4' is formed, an about 100 nm thick Ti layer 4a is deposited by a DC sputtering process as shown in FIG. 33A. Then, a rapid thermal annealing process at a temperature of about 700° C. is performed upon the Ti layer 4a in a nitrogen atmosphere for about 30s, a silicon contact layer 9 made of $TiSi_2$ is formed only on the polycrystalline silicon plug 3, and simultaneously, the Ti layer 4a is converted into a TiN layer 4b, as shown in FIG. 33B. Then, the TiN layer 4' is formed as shown in FIG. 33C. Thus, the stacked capacitor of FIG. 15 can be obtained.

FIGS. 34A through 34G are also cross-sectional views for explaining the stacked capacitor of FIG. 8.

Figure 34A:
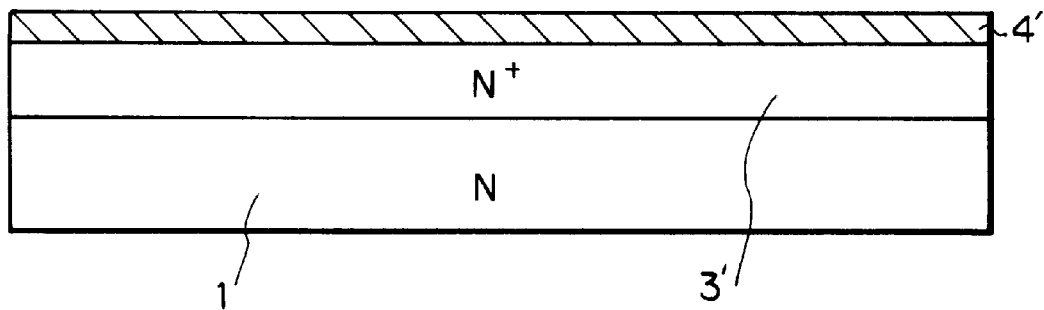
FIGS. 34A through 34G are cross-sectional views for explaining a method for manufacturing the stacked capacitor of FIG. 8.

First, referring to FIG. 34A, an about 1 μm thick polycrystalline silicon layer 3' is deposited on an N-type monocrystalline silicon substrate having a resistance of about 0.1 Ω.cm by a CVD process, and phosphorous ions are diffused into the polycrystalline silicon layer 3' to reduce the resistance thereof. Then, an about 600 nm TiN layer 4' is deposited by a reactive DC sputtering process using a mixture of argon gas and nitrogen gas.

Figure 34B:
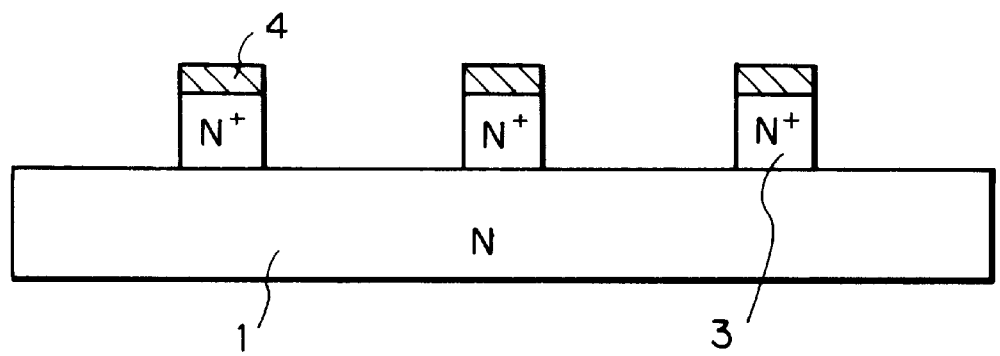

Next, referring to FIG. 34B, the TiN layer 4' and the polycrystalline silicon layer 3' are patterned to form a silicon diffusion preventing conductive layer 4 and a polycrystalline silicon plug 3.

Figure 34C:
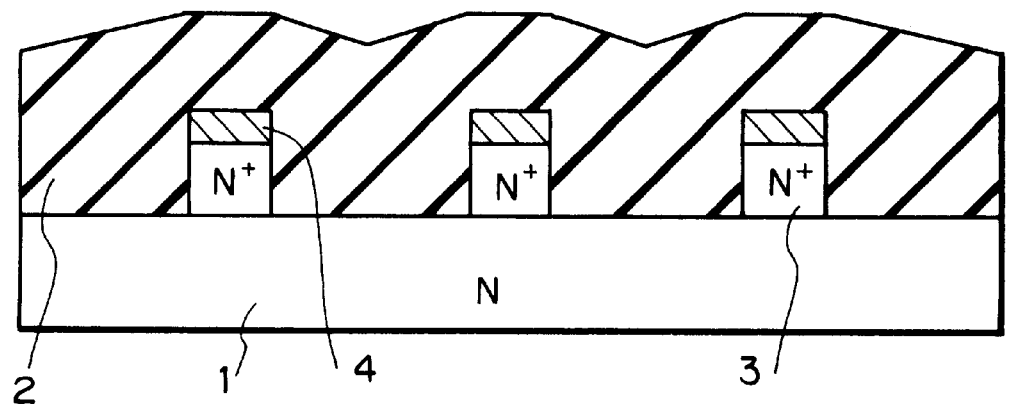

Next, referring to FIG. 34C, an insulating layer 2 made of silicon oxide is formed by a CVD process.

Figure 34D:
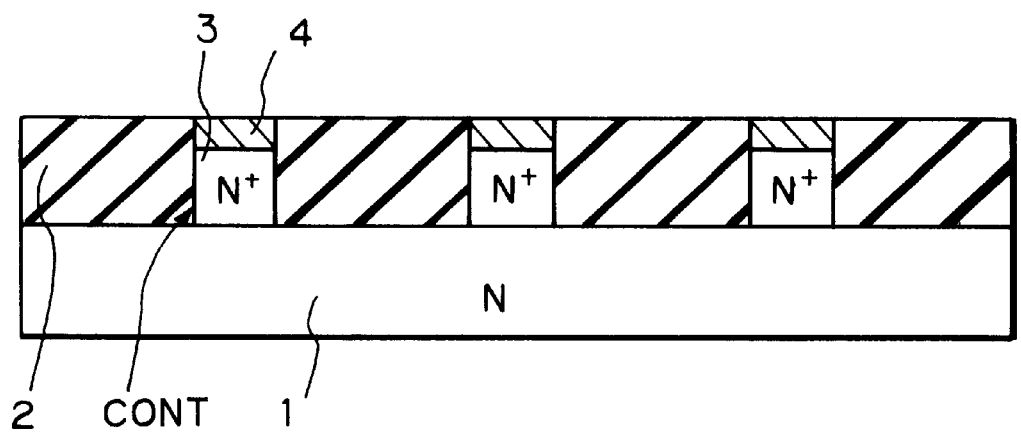

Next, referring to FIG. 34D, the insulating layer 2 on the silicon diffusion preventing conductive layer 4 is removed by a CMP process using colloidal silica, so that the silicon diffusion preventing conductive layer 4 is exposed from the insulating layer 2.

Figure 34E:
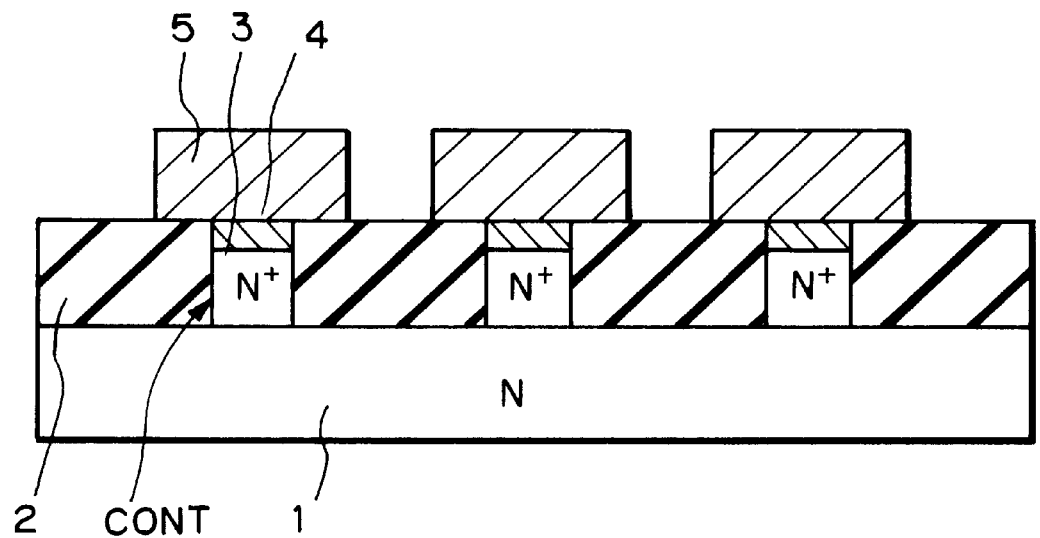

Next, referring to FIG. 34E, in the same way as in FIG. 32E, a $RuO_2$/Ru layer is deposited by a reactive DC sputtering process. Then, the $RuO_2$/Ru layer is patterned by an ECR plasma etching process using a mixture of chlorine gas and oxygen gas to form an oxidation resistance conductive layer 5 made of $RuO_2$(500 nm) and Ru(50 nm).

Figure 34F:
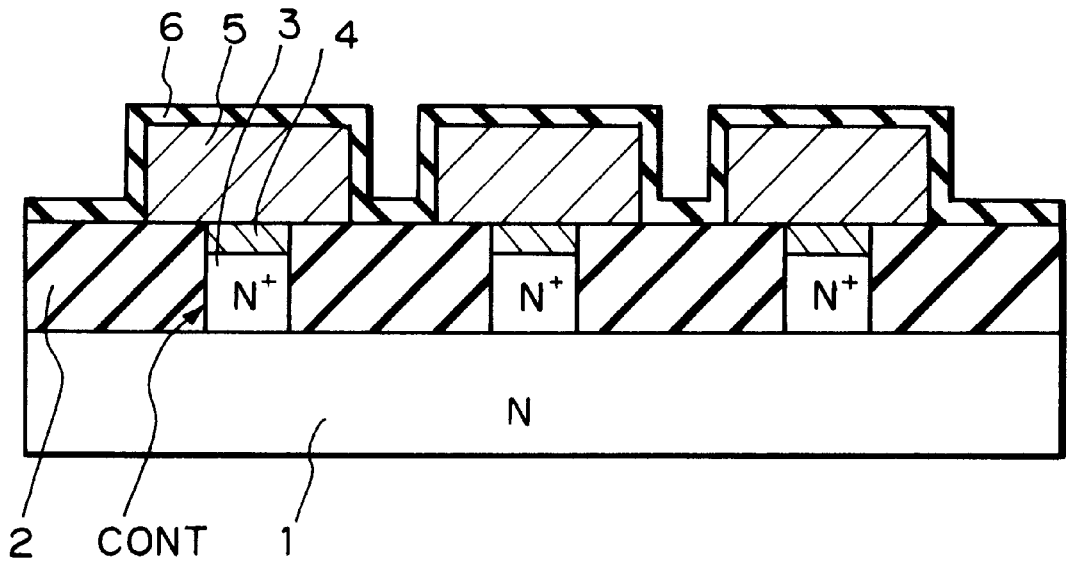

Next, referring to FIG. 34F, in the same way as in FIG. 32F, an about 100 nm thick high dielectric constant layer 6 made of BST is deposited on the entire surface by an ECR-MOCVD process using $Ba(DPM)_2$, $Sr(DPM)_2$, $Ti(i-OC_3H_7)$ and oxygen gas. In this process, the substrate temperature is about 400 to 700° C., and the gas pressure is about 7 mTorr.

Figure 34G:
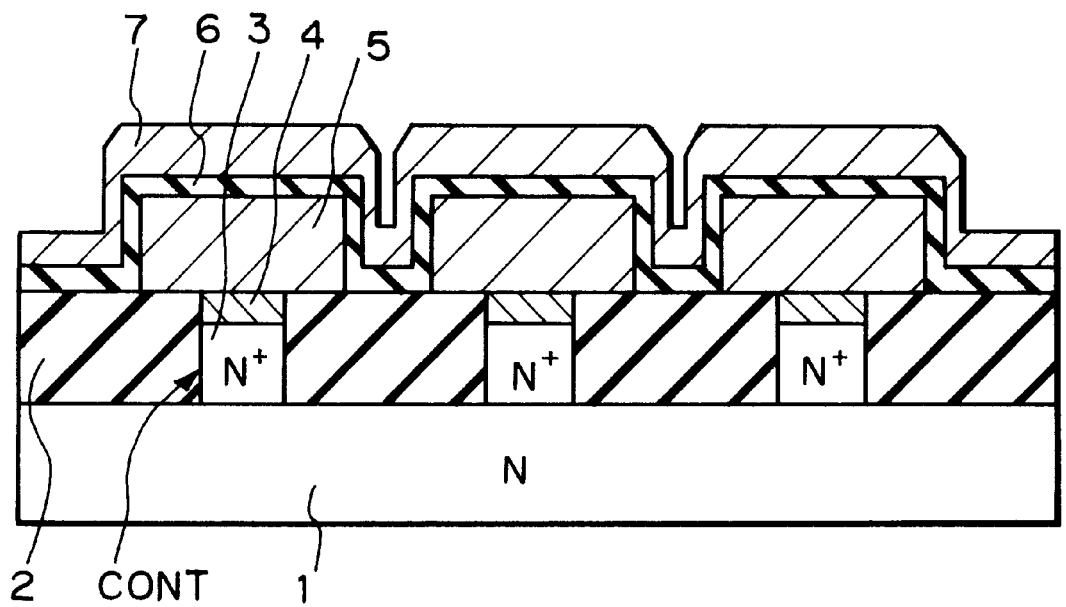

Finally, referring to FIG. 34G, in the same way as in FIG. 32G, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 8.

Figure 16:
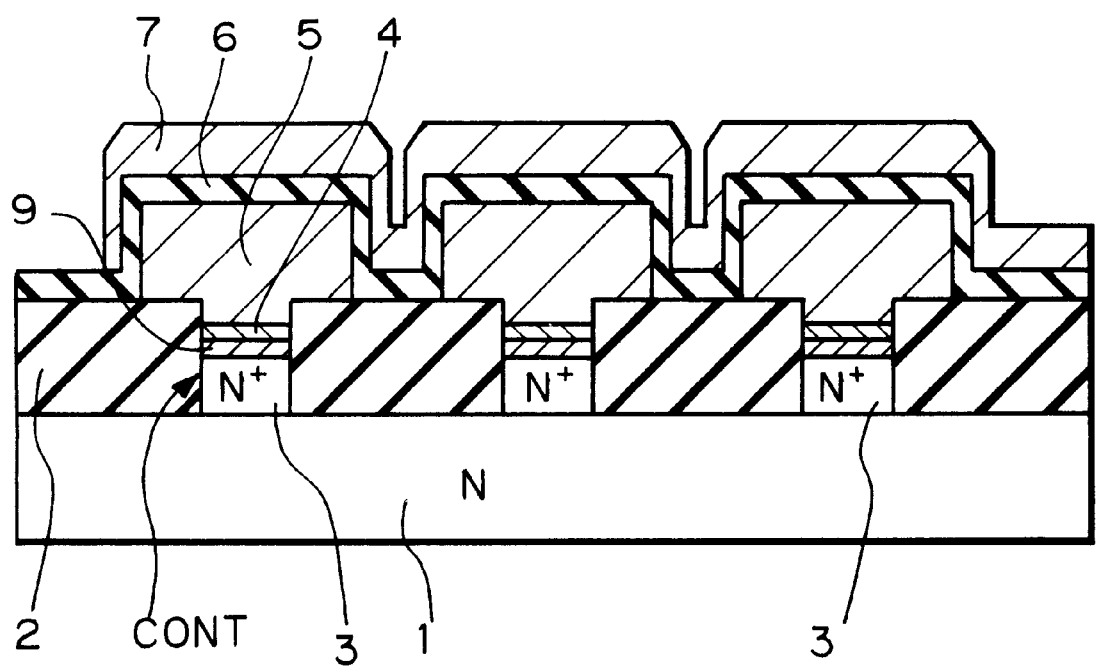
FIG. 16 is a cross-sectional view illustrating a twelfth embodiment of the stacked capacitor according to the present invention.
Figure 17:
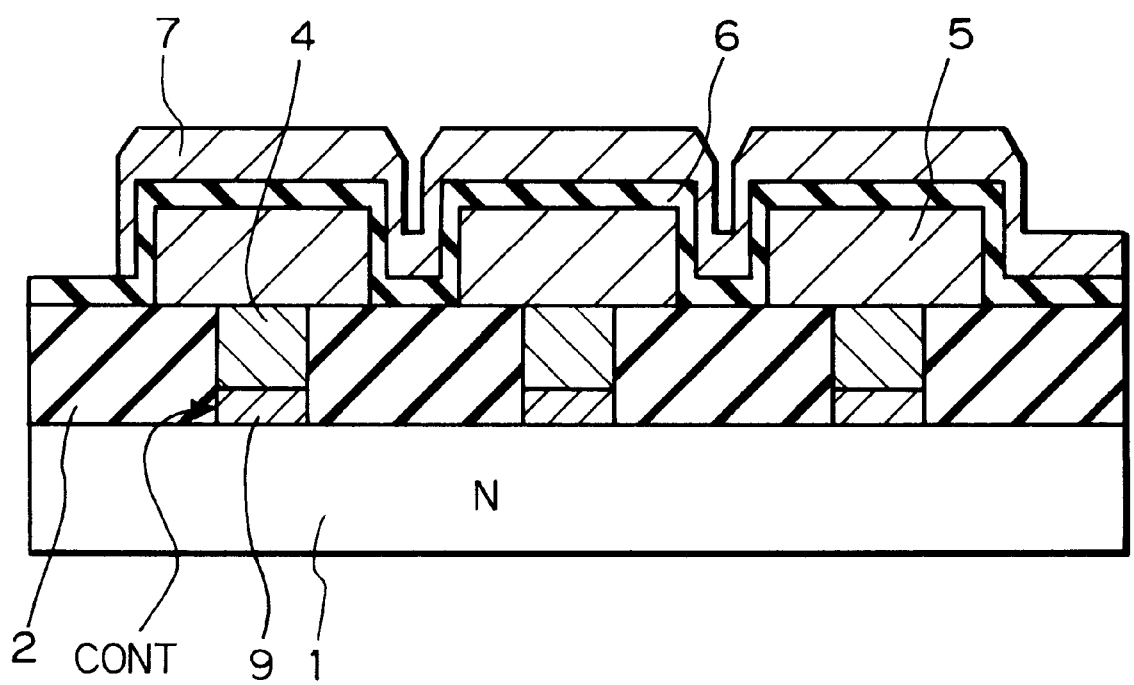
FIG. 17 is a cross-sectional view illustrating a thirteenth embodiment of the stacked capacitor according to the present invention.
Figure 35:
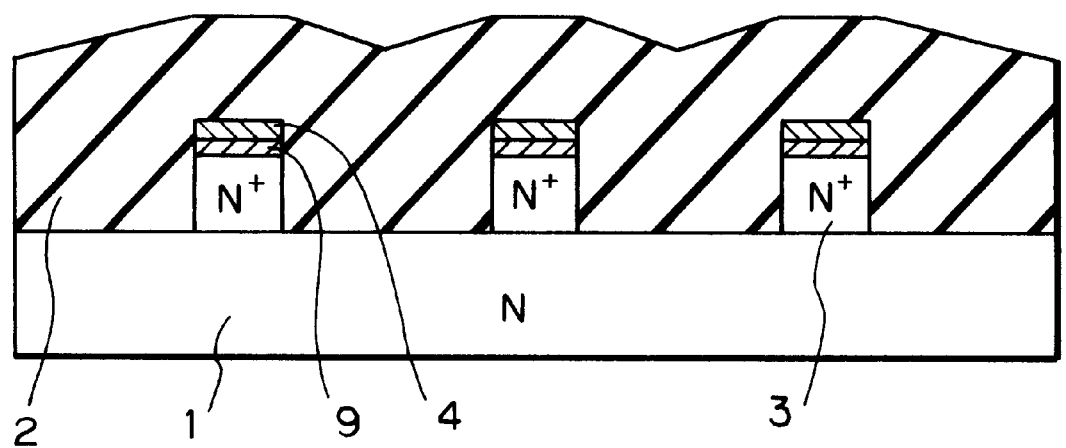
FIG. 35 is a cross-sectional view for explaining a method for manufacturing the stacked capacitor of FIG. 15.

Note that in the process step as shown in FIG. 34A, after a Ti layer is formed before the formation of the TiN layer 4', when a rapid thermal annealing process at a temperature of about 700° C is performed upon the Ti layer in a nitrogen atmosphere, a silicon contact layer 9 made of $TiSi_2$ is formed on the polycrystalline silicon layer 3' as illustrated in FIG. 35, so that the stacked capacitor of FIG. 16 can be obtained.

FIGS. 36A through 36G are also cross-sectional views for explaining the stacked capacitor of FIG. 9.

Figure 36A:
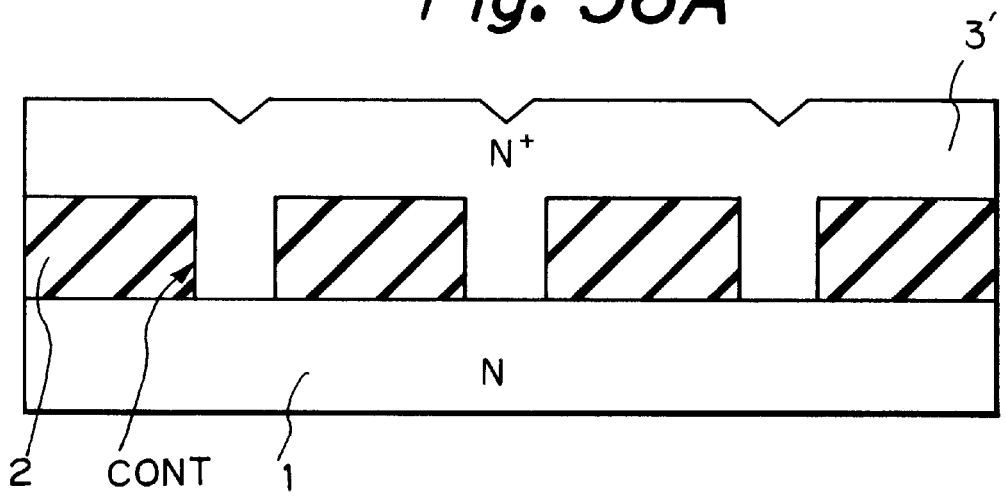
FIGS. 36A through 36G are cross-sectional views for explaining a method for manufacturing the stacked capacitor of FIG. 9.

First, referring to FIG. 36A, in the same way as in, FIG. 32A, an N-type monocrystalline silicon substrate 1 having a resistance of about 0.1 Ω.cm is thermally oxidized to form an about 600 nm thick insulating layer 2 made of silicon oxide. Then, a contact hole CONT is perforated in the insulating layer 2. Then, an about 1 μm thick polycrycrystalline silicon layer 3' is deposited on the entire surface by a CVD process, and phosphorous ions are diffused into the polycrystalline silicon layer 3' to reduce the resistance thereof.

Figure 36B:
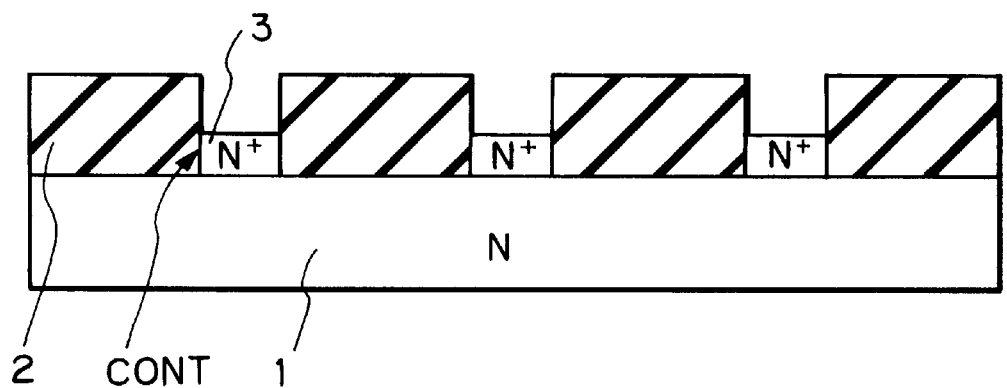

Next, referring to FIG. 36B, in a similar way to FIG. 32B, the polycrystalline silicon layer 3' is etched back by an RIE process using chlorine gas, and as a result, a polycrystalline silicon plug 3 is buried in the contact hole CONT. Also, in this case, the top surface of the polycrystalline silicon plug 3 is remarkably lower than that of the insulating layer 2.

Figure 36C:
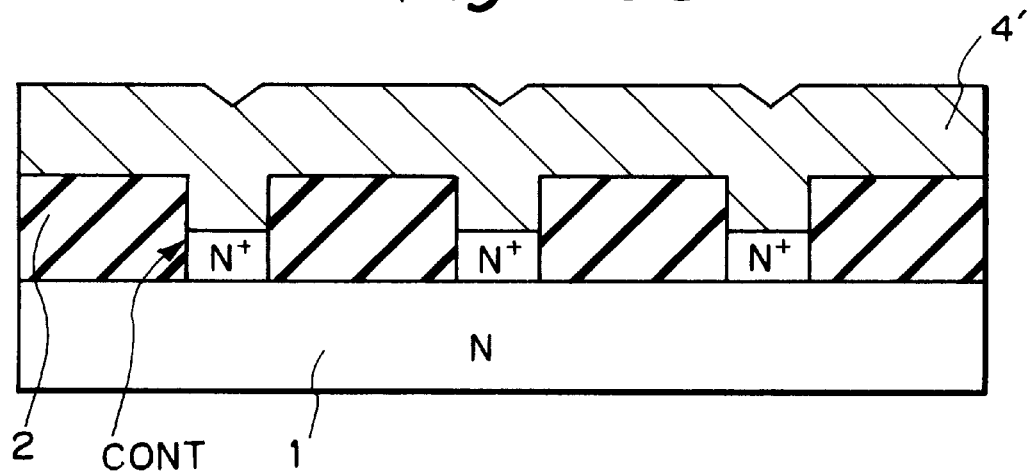

Next, referring to FIG. 36C, in the same way as in FIG. 32C, an about 600 nm TiN layer 4' is deposited by a reactive DC sputtering process using a mixture of argon gas and nitrogen gas.

Figure 36D:
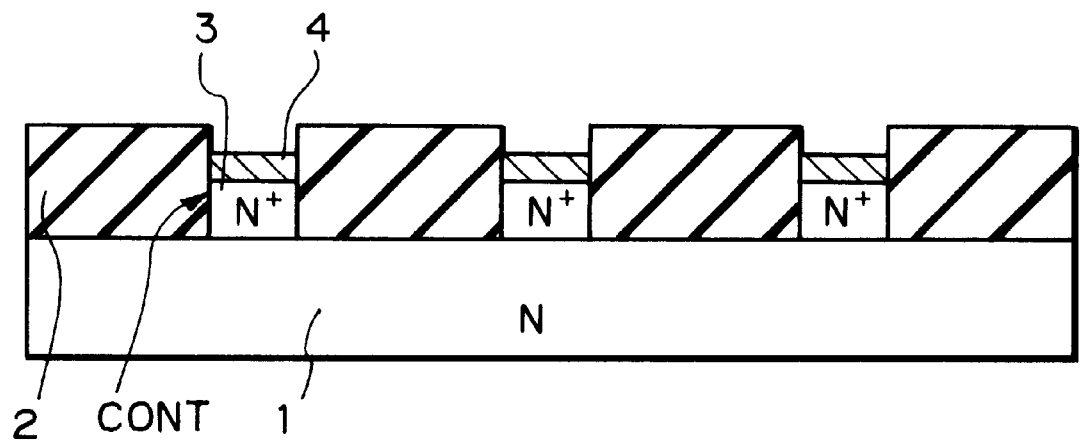

Next, referring to FIG. 36D, in a similar way to FIG. 32D, the TiN layer 4' on the insulating layer 2 is removed by an RIE process using chlorine gas, so that a silicon diffusion preventing conductive layer 4 made of TiN is completely buried in the contact hole CONT. In this case, the surface of the silicon diffusion preventing conductive layer 4 is lower than that of the insulating layer 2.

Figure 36E:
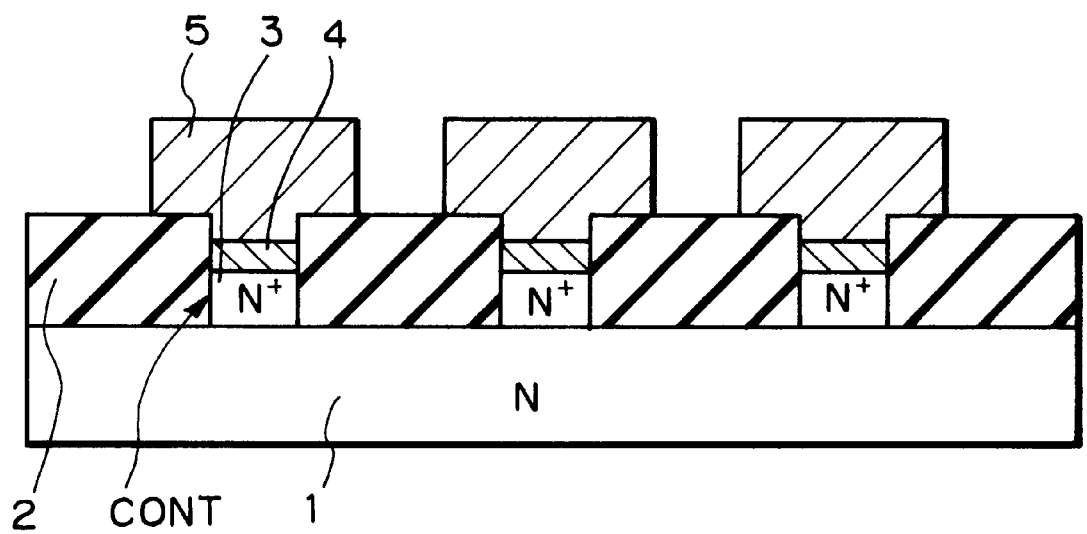

Next, referring to FIG. 36E, in the same way as in FIG. 32E, a $RuO_2$/Ru layer is deposited by a reactive DC sputtering process. Then, the RuO$_2$/Ru layer is patterned by an ECR plasma etching process using a mixture of chlorine gas and oxygen gas to form an oxidation resistance conductive layer 5 made of RuO$_2$2(500 nm) and Ru(50 nm). In this case, the oxidation resistance conductive layer 5 is partly buried in the contact hole CONT.

Figure 36F:
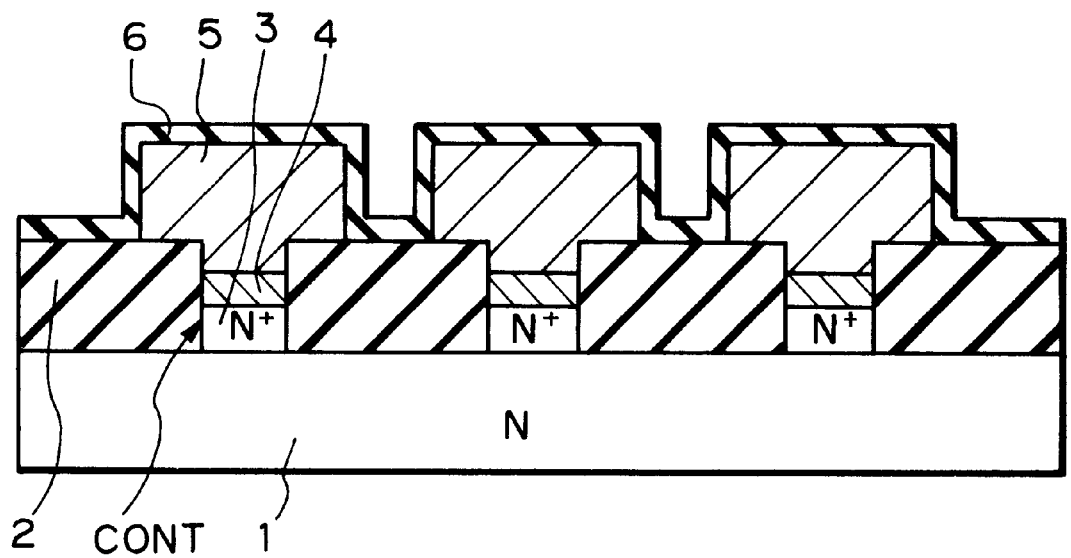

Next, referring to FIG. 36F, in the same way as in FIG. 32F, an about 100 nm thick high dielectric constant layer 6 made of BST is deposited on the entire surface by an ECR-MOCVD process using Ba(DPM)$_2$, Sr(DPM)$_2$, Ti(i-OC$_3$H$_7$) and oxygen gas. In this process, the substrate temperature is about 400 to 700° C., and the gas pressure is about 7 mTorr.

Figure 36G:
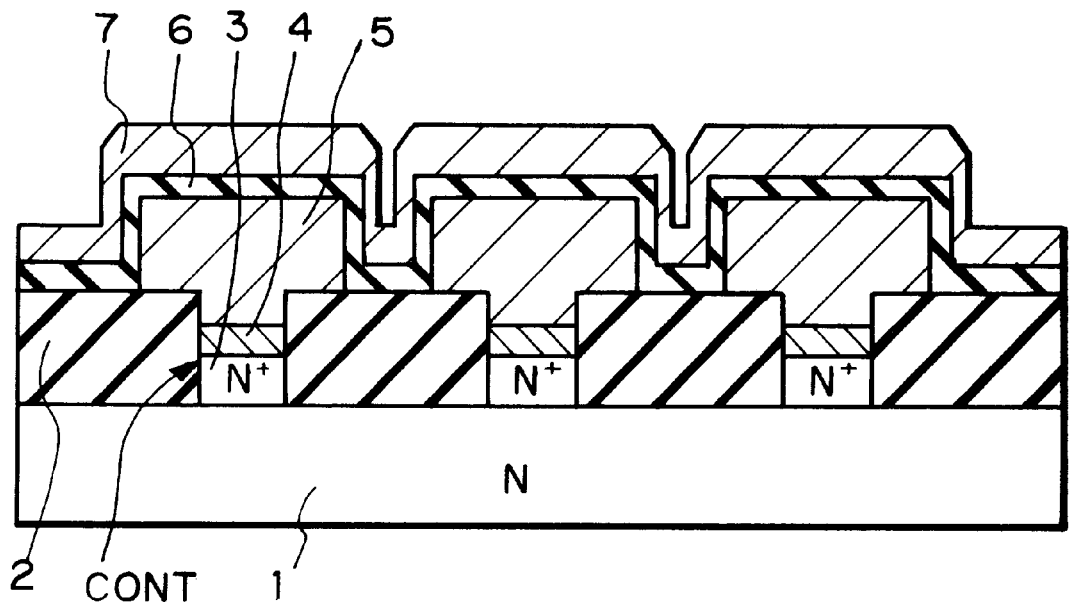

Finally, referring to FIG. 36G, in the same way as in FIG. 32G, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 9.

Figure 23:
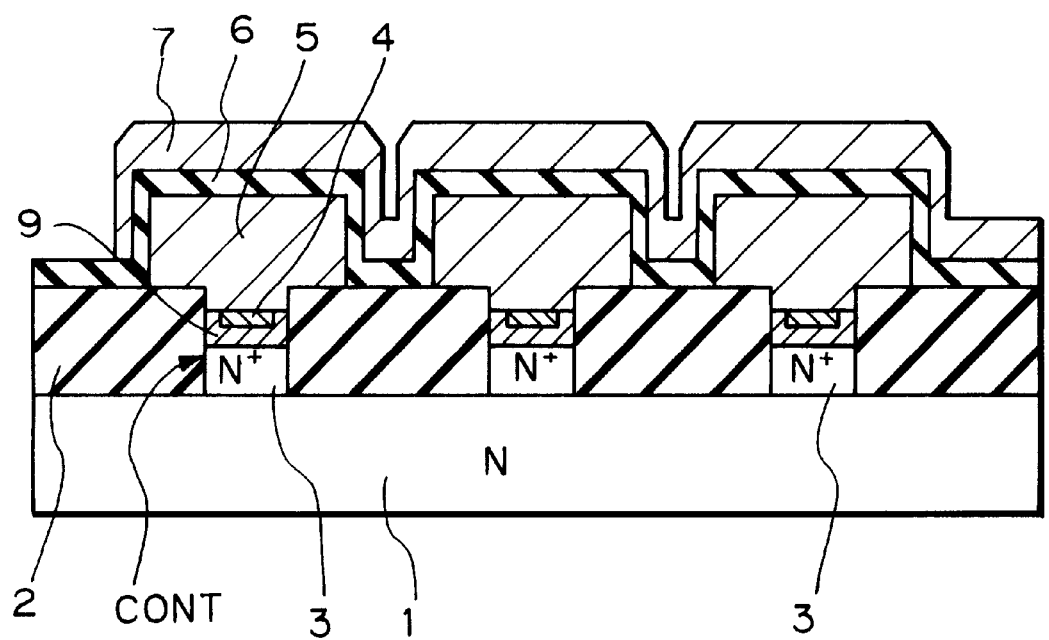
FIG. 23 is a cross-sectional view illustrating a nineteenth embodiment of the stacked capacitor according to the present invention.

Note that in the process step as shown in FIG. 36C, before the TiN layer 4' is formed, a silicon contact layer 9 made of TiSi$_2$ is formed, so that the stacked capacitor of FIG. 23 can be obtained.

Figure 37A:
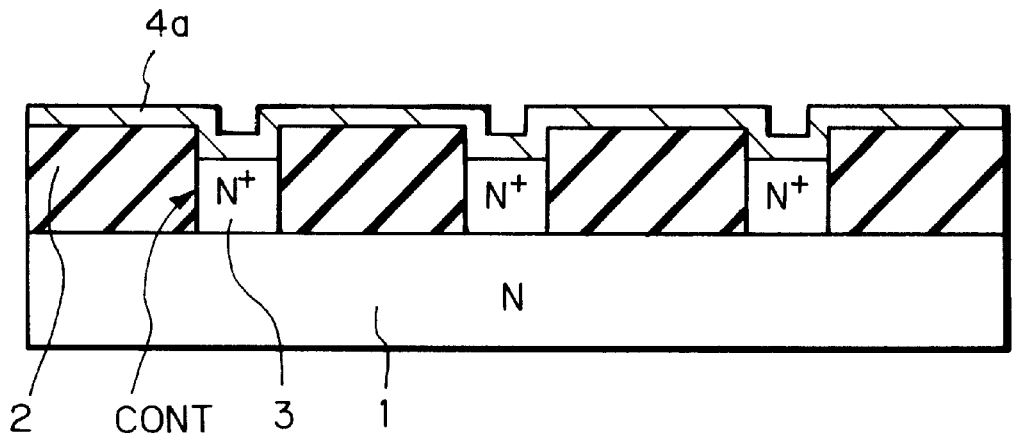
FIGS. 37A, 37B and 37C are cross-sectional views for explaining a method for manufacturing the stacked capacitor of FIG. 23.
Figure 37B:
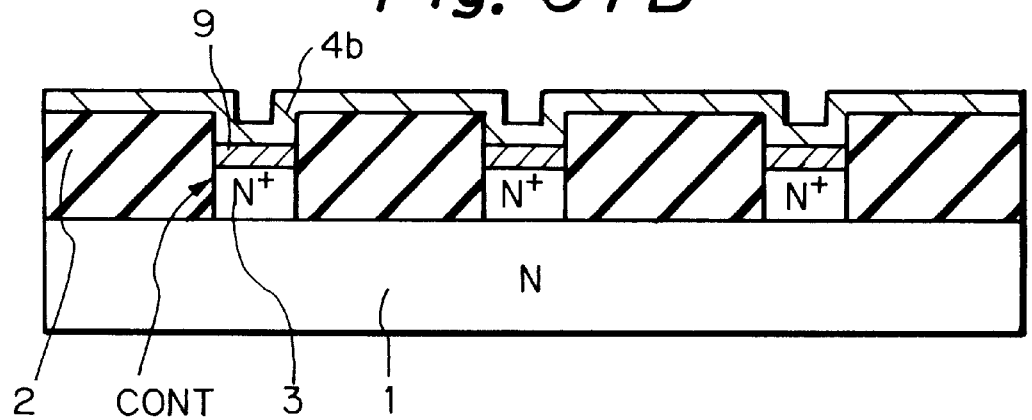
Figure 37C:
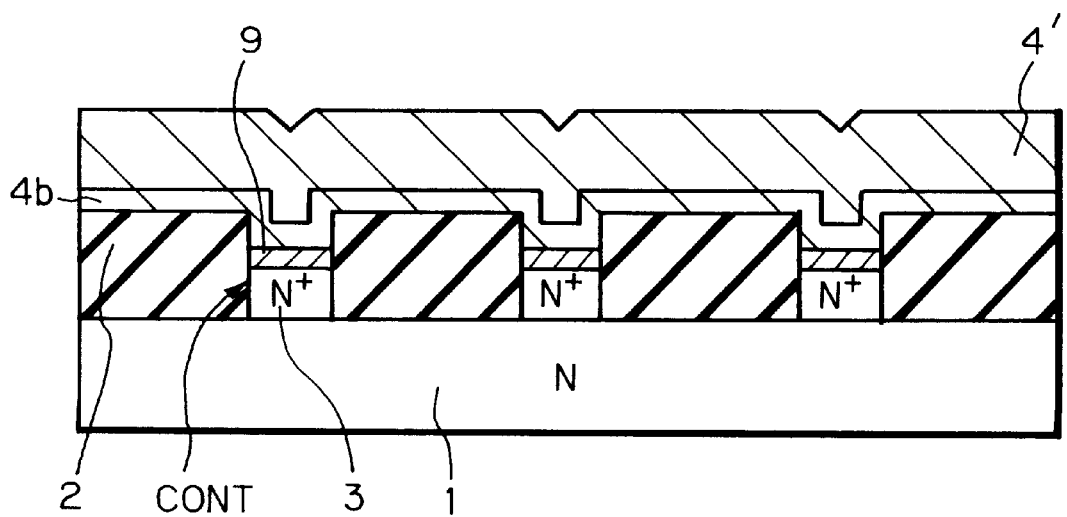

Also, before the TiN layer 4' is formed, an about 100 nm thick Ti layer 4a is deposited by a DC sputtering process as shown in FIG. 37A. Then, a rapid thermal annealing process at a temperature of about 700° C. is performed upon the Ti layer 4a in a nitrogen atmosphere for about 30s, a silicon contact layer 9 made of TiSi$_2$ is formed only on the polycrystalline silicon plug 3, and simultaneously, the Ti layer 4a is converted into a TiN layer 4b, as shown in FIG. 37B. Then, the TiN layer 4' is formed as shown in FIG. 37C. Thus, the stacked capacitor of FIG. 23 can be obtained.

FIGS. 38A through 38E are cross-sectional views for explaining the stacked capacitor of FIG. 10.

Figure 38A:
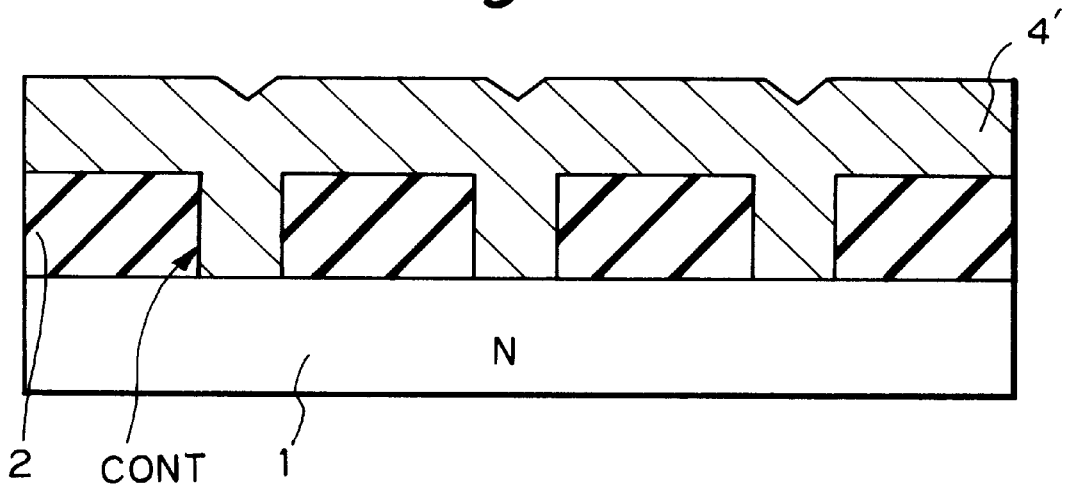
FIGS. 38A and 38E are cross-sectional views for explaining a method for manufacturing the stacked capacitors of FIG. 10.

First, referring to FIG. 38A an N-type monocrystalline silicon substrate 1 having a resistance of about 0.1 Ω.cm is thermally oxidized to form an about 600 nm thick insulating layer 2 made of silicon oxide. Then, a contact hole CONT is perforated in the insulating layer 2. Then, an about 600 nm TiN layer 4' is deposited by a reactive DC sputtering process using a mixture of argon gas and nitrogen gas.

Figure 38B:
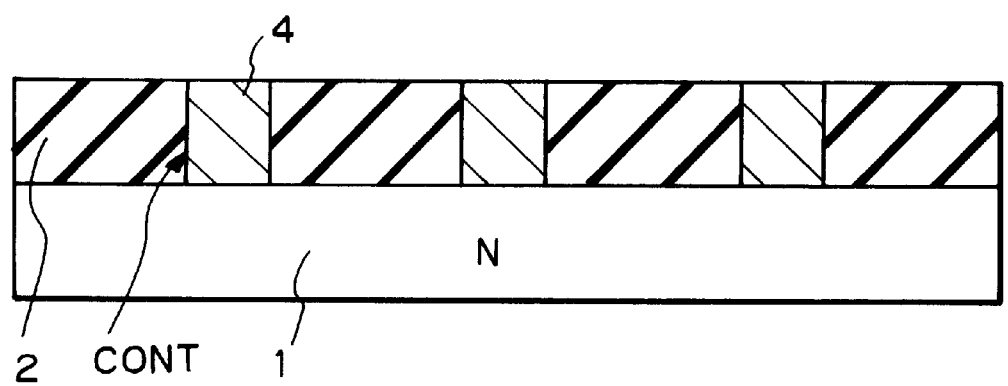

Next, referring to FIG. 38B, the TiN layer 4' on the insulating layer 2 is removed by a CMP process using colloidal silica, so that a silicon diffusion preventing conductive layer 4 made of TiN is buried in the contact hole CONT.

Figure 38C:
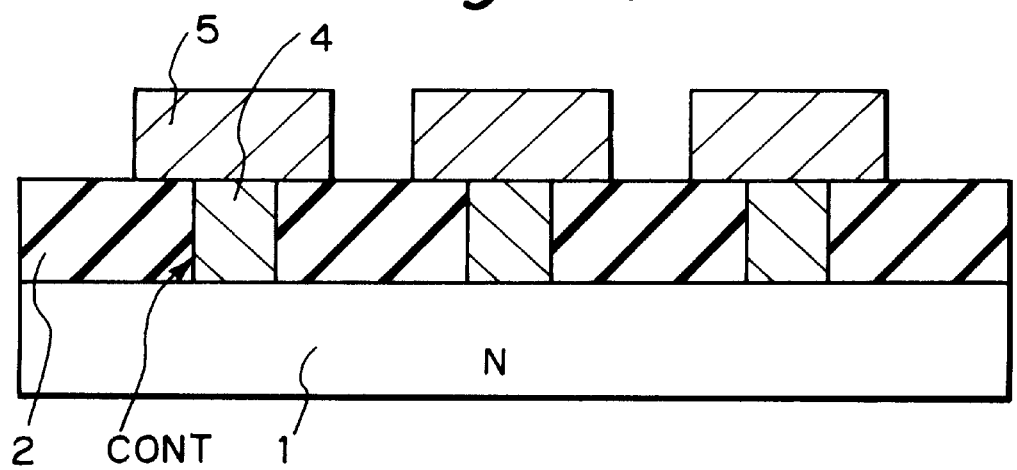

Next, referring to FIG. 38C, in the same way as in to FIG. 32E, a RuO$_2$/Ru layer is deposited by a reactive DC sputtering process. Then, the RuO$_2$/Ru layer is patterned by an ECR plasma etching process using a mixture of chlorine gas and oxygen gas to form an oxidation resistance conductive layer 5 made of RuO$_2$(500 nm) and Ru(50 nm).

Figure 38D:
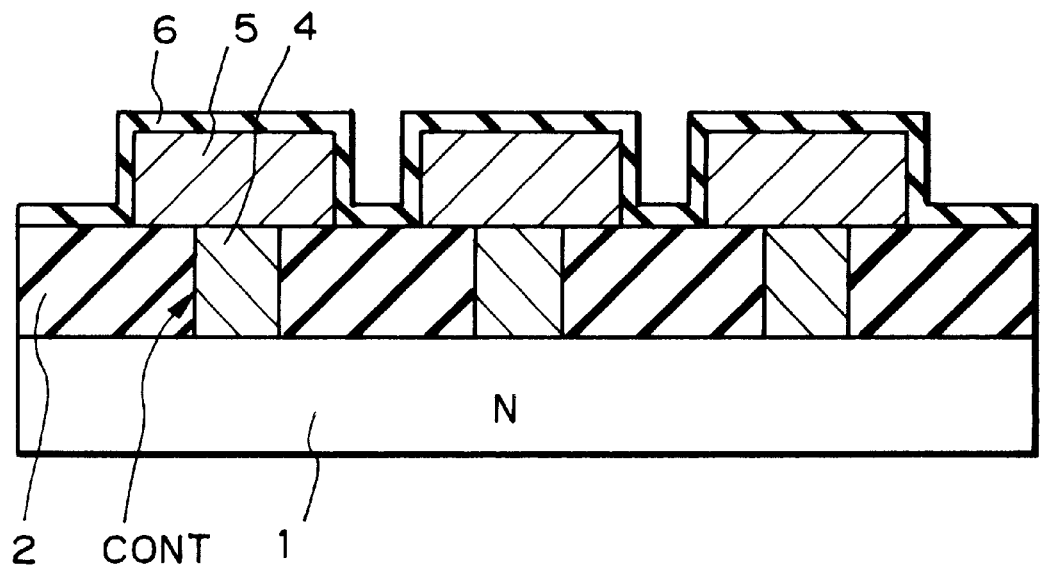

Next, referring to FIG. 38D, in the same way as in FIG. 32F, an about 100 nm thick high dielectric constant layer 6 made of BST is deposited on the entire surface by an ECR-MOCVD process using Ba(DPM)$_2$, Sr(DPM)$_2$, Ti(i-OC$_3$H$_7$) and oxygen gas. In this process, the substrate temperature is about 400 to 700° C., and the gas pressure is about 7 mTorr.

Figure 38E:
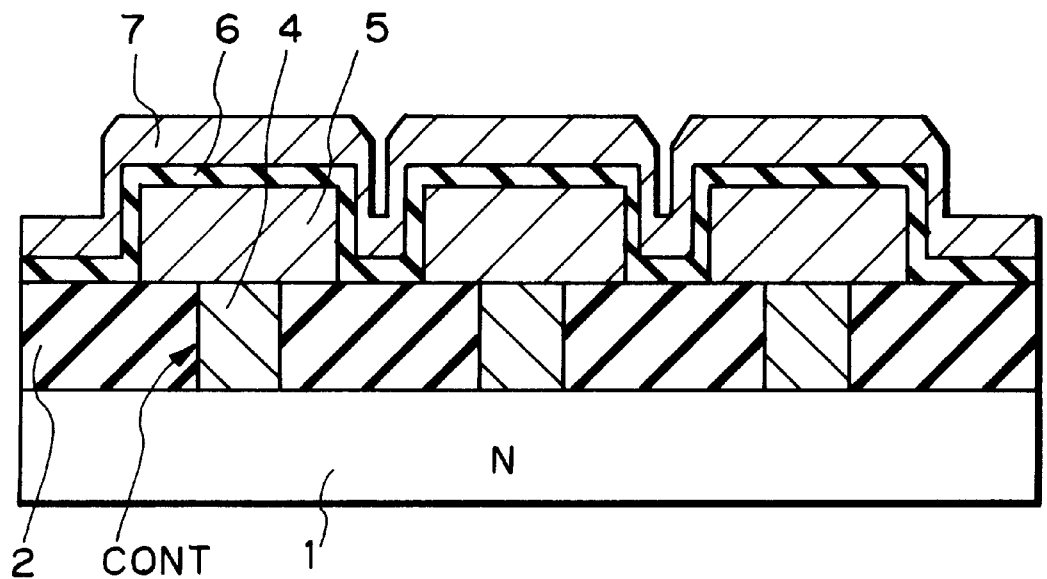

Finally, referring to FIG. 38E, in the same way as in FIG. 32G, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 10.

Figure 24:
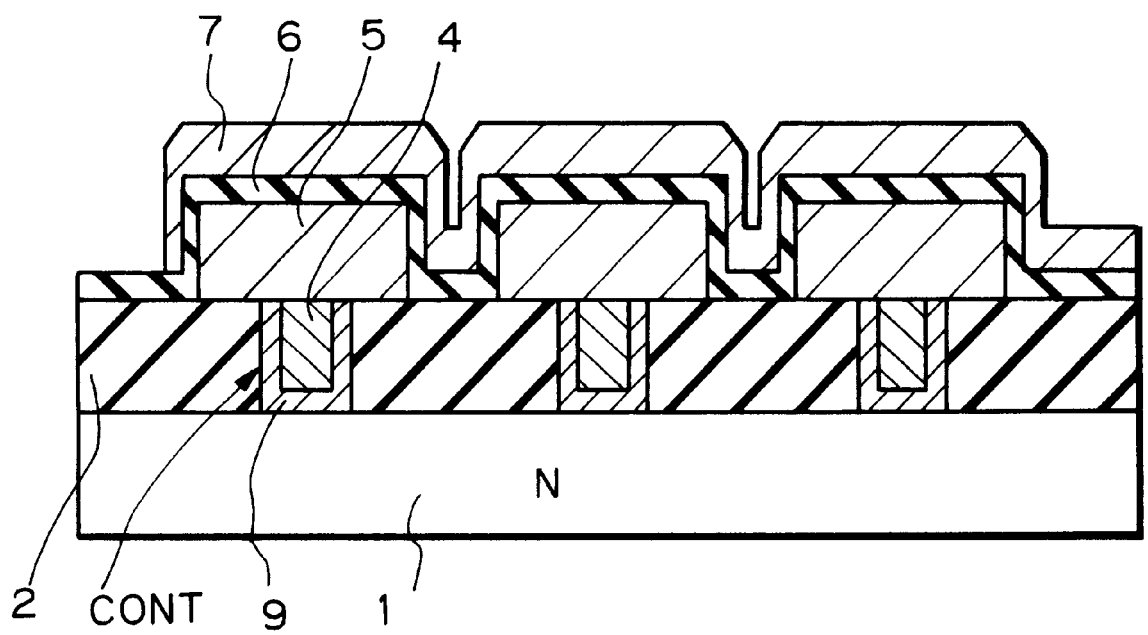
FIG. 24 is a cross-sectional view illustrating a twentieth embodiment of the stacked capacitor according to the present invention.

Note that in the process step as shown in FIG. 38A, before the TiN layer 4' is formed, a silicon contact layer 9 made of TiSi$_2$ is formed, so that the stacked capacitor of FIG. 24 can be obtained.

Figure 39A:
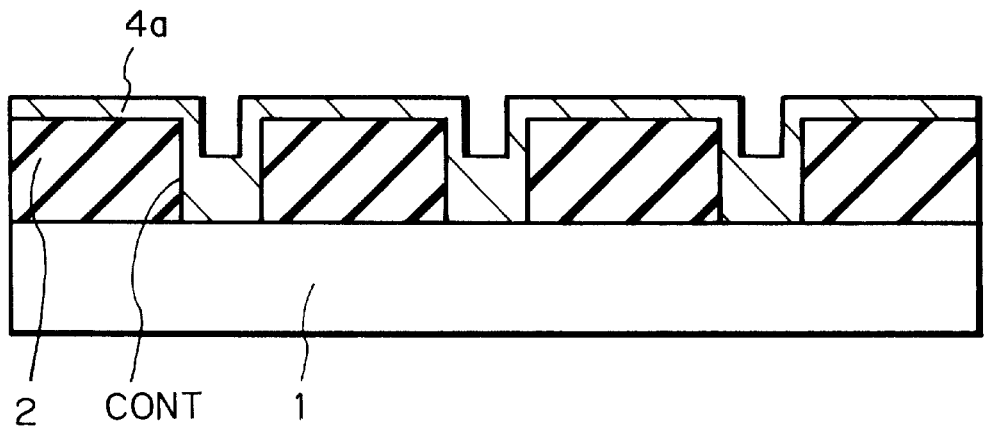
FIGS. 39A through 39C are cross-sectional views for explaining a method for manufacturing the stacked capacitors of FIGS. 17 and 24.
Figure 39B:
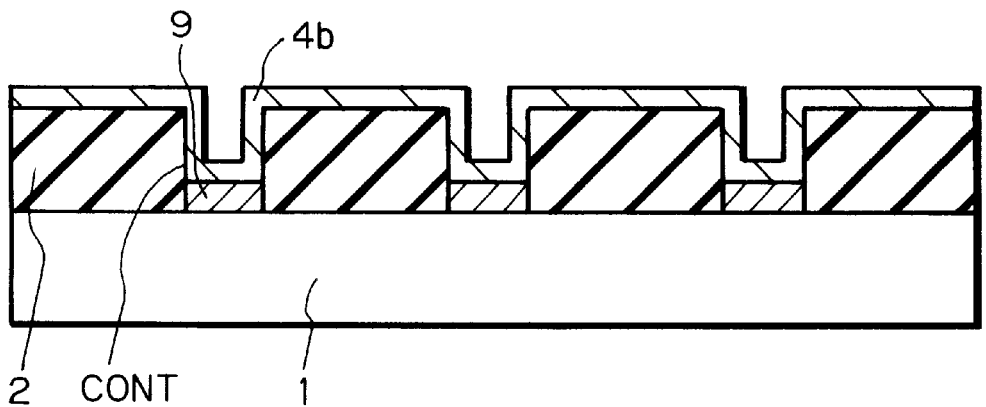
Figure 39C:
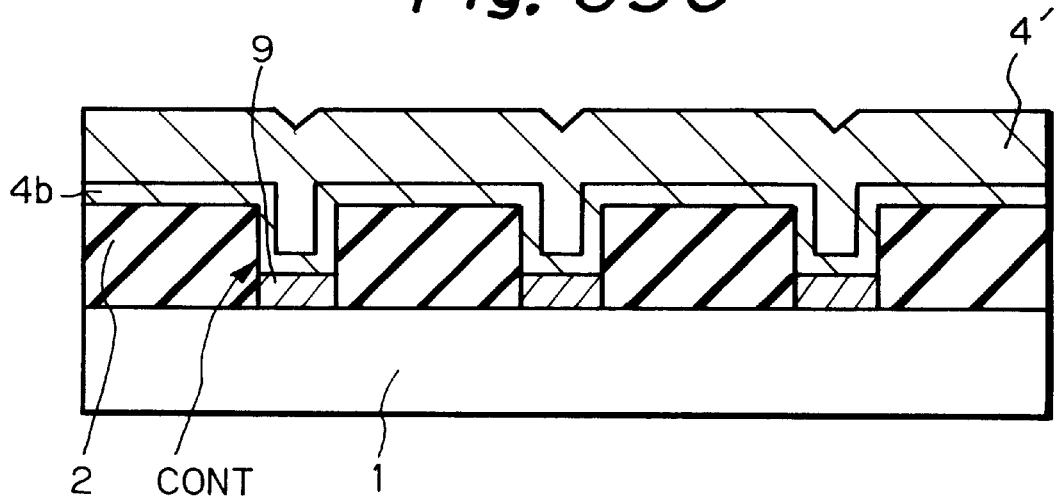

Also, after the TiN layer 4' is formed, an about 100 nm thick Ti layer 4a is deposited by a DC sputtering process as shown in FIG. 39A. Then, a rapid thermal annealing process at a temperature of about 700° C. is performed upon the Ti layer 4a in a nitrogen atmosphere for about 30s, a silicon contact layer 9 made of TiSi$_2$ is formed only on the silicon substrate 1, and simultaneously, the Ti layer 4a is converted into a TiN layer 4b, as shown in FIG. 39B. Then, the TiN layer 4' is formed as shown in FIG. 39C. Thus, the stacked capacitor of FIG. 17 can be obtained.

FIGS. 40A through 40E are cross-sectional views for explaining the stacked capacitor of FIG. 11.

Figure 40A:
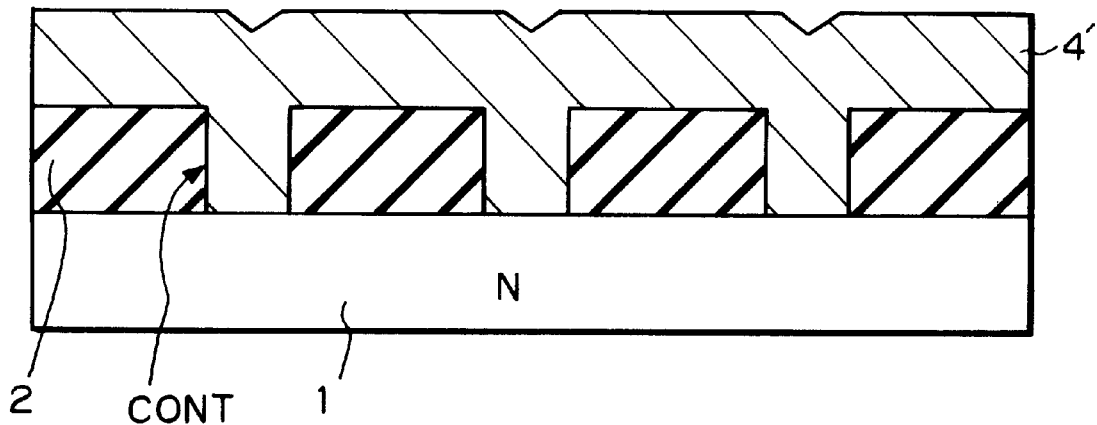
FIGS. 40A through 40E are cross-sectional views for explaining a method for manufacturing the stacked capacitor of FIG. 11.

First, referring to FIG. 40A, in the same way as in FIG. 38A an N-type monocrystalline silicon substrate 1 having a resistance of about 0.1 Ω.cm is thermally oxidized to form an about 600 nm thick insulating layer 2 made of silicon oxide. Then, a contact hole CONT is perforated in the insulating layer 2. Then, an about 600 nm TiN layer 4' is deposited by a reactive DC sputtering process using a mixture of argon gas and nitrogen gas.

Figure 40B:
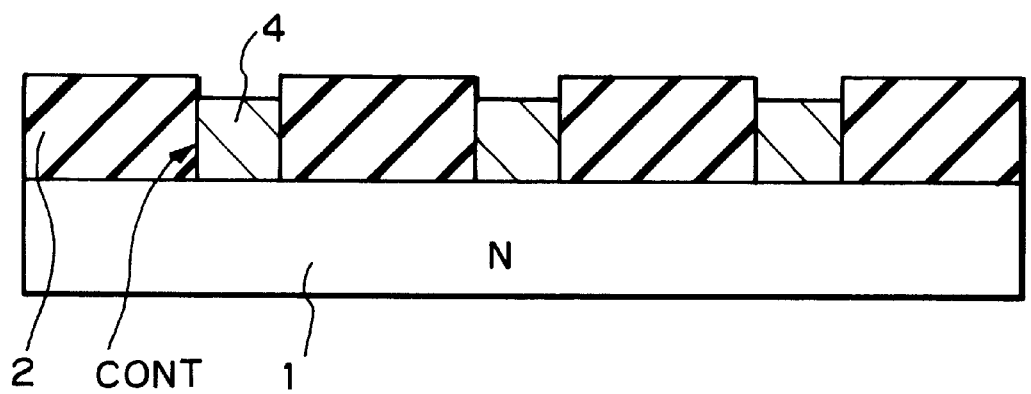

Next, referring to FIG. 40B, in a similar way to FIG. 38B, the TiN layer 4' on the insulating layer 2 is removed by an RIE process using chlorine gas, so that a silicon diffusion preventing conductive layer 4 made of TiN is completely buried in the contact hole CONT. In this case, the height of the silicon diffusion preventing conductive layer 4 is lower than that of the insulating layer 2.

Figure 40C:
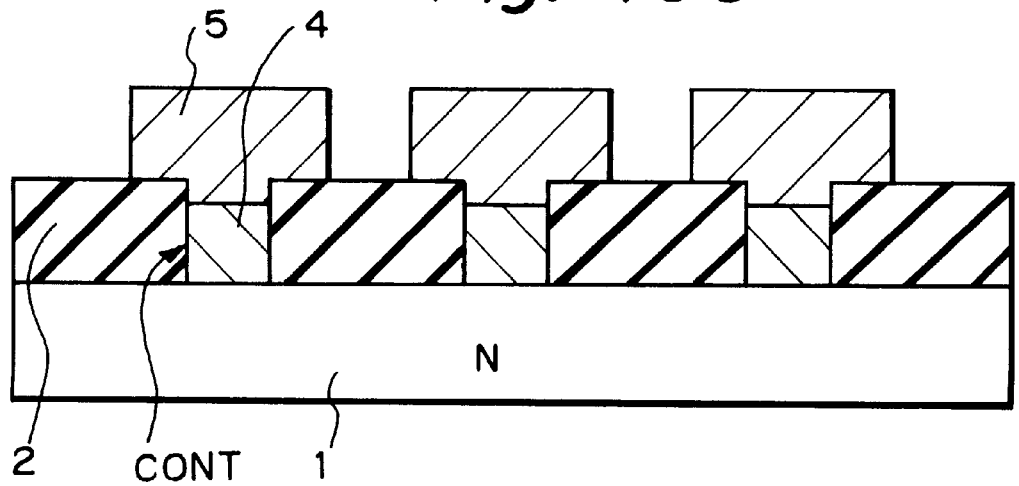

Next, referring to FIG. 40C, in the same way as in to FIG. 38C, a RuO$_2$/Ru layer is deposited by a reactive DC sputtering process. Then, the RuO$_2$/Ru layer is patterned by an ECR plasma etching process using a mixture of chlorine gas and oxygen gas to form an oxidation resistance conductive layer 5 made of RuO$_2$(500 nm) and Ru(50 nm).

Figure 40D:
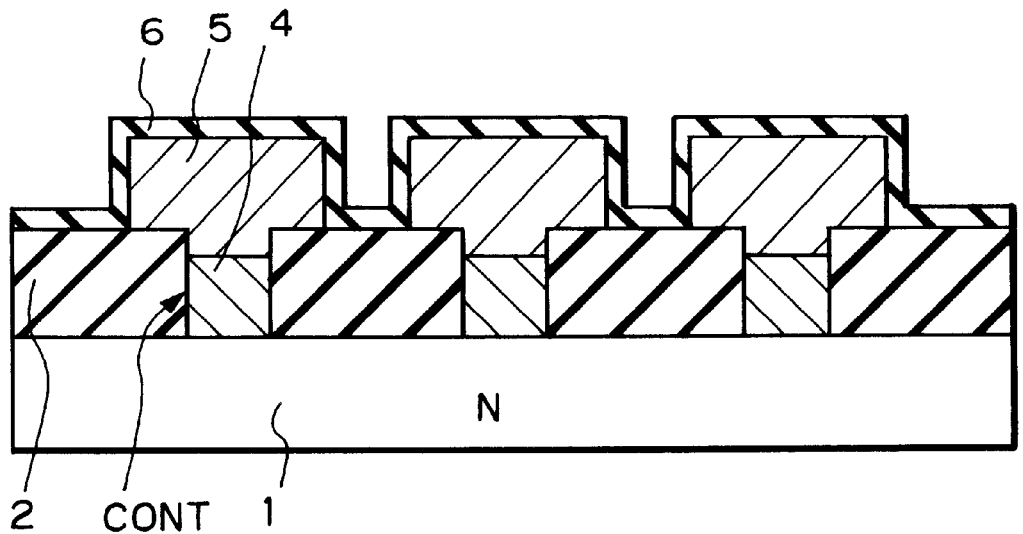

Next, referring to FIG. 40D, in the same way as in FIG. 38D, an about 100 nm thick high dielectric constant layer 6 made of BST is deposited on the entire surface by an ECR-MOCVD process using Ba(DPM)$_2$, Sr(DPM)$_2$, Ti(i-OC$_3$H$_7$) and oxygen gas. In this process, the substrate temperature is about 400 to 700 ° C., and the gas pressure is about 7 mTorr.

Figure 40E:
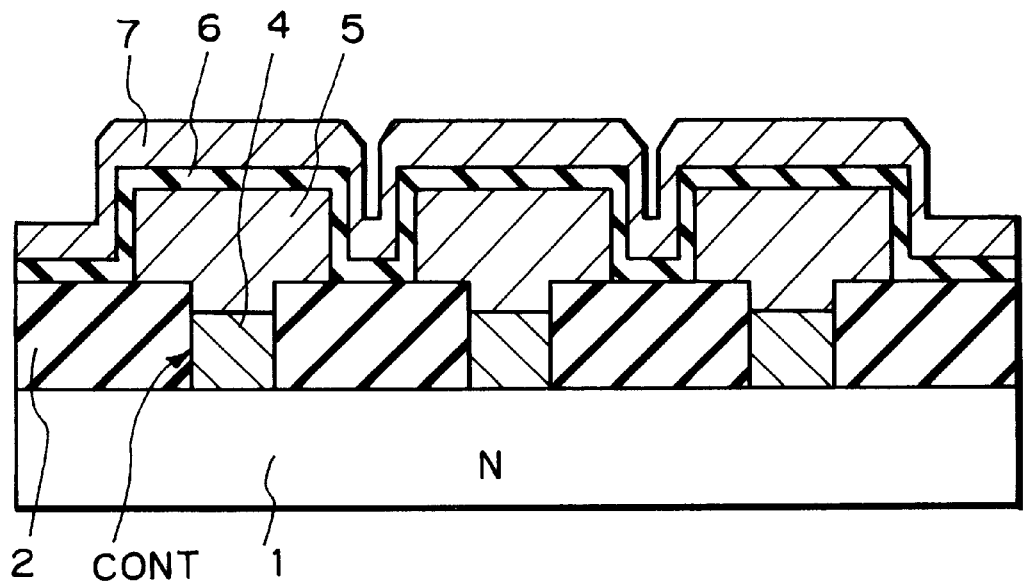

Finally, referring to FIG. 40E, in the same way as in FIG. 38E, an upper electrode layer 7 made of Al(1 μm)/TiN(50 nm) is deposited on the entire surface by a DC sputtering process using Ar gas.

Then, the upper electrode layer 7 is etched by an RIE process using chlorine gas, thus obtaining the stacked capacitor of FIG. 11.

Figure 25:
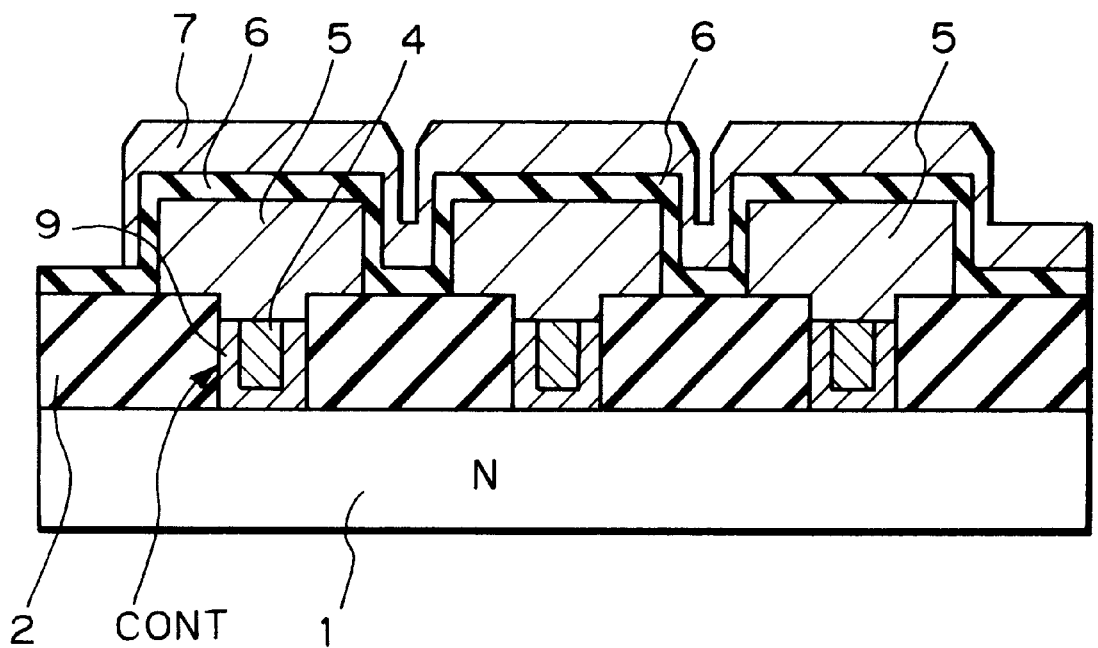
FIG. 25 is a cross-sectional view illustrating a twenty-first embodiment of the stacked capacitor according to the present invention.

Note that in the process step as shown in FIG. 40A, before a TiN layer as indicated by 4' in FIG. 40A is formed, a silicon contact layer 9 made of TiSi$_2$ is formed, so that the stacked capacitor of FIG. 25 can be obtained.

Figure 18:
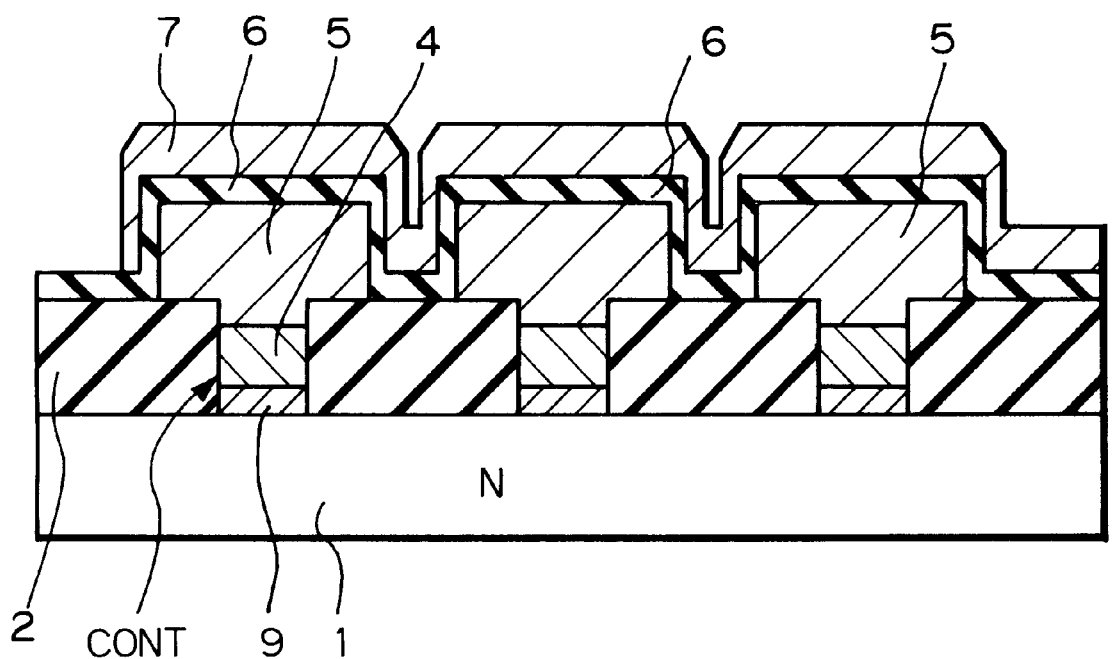
FIG. 18 is a cross-sectional view illustrating a fourteenth embodiment of the stacked capacitor according to the present invention.

Also, as shown in FIGS. 39A, 39B and 39C, a silicon contact layer 9 made of TiSi$_2$ is formed on the silicon substrate 1, so that the stacked capacitor of FIG. 18 can be obtained.

In the above-described embodiments, although the polycrystalline silicon plug 3 is grown by a CVD process, the polycrystalline silicon plug 3 can be grown by an epitaxial growth process. Also, impurities such germanium instead of phosphorus can be introduced into the polycrystalline silicon plug 3.

Also, the silicon diffusion preventing conductive layer 4 can be made of metal including at least one of Ti, W, Ta, Mo, Co and Ni, or their nitride, or their films including nitrogen, or their silicide. In this case, the temperature of reaction of the silicon diffusion preventing conductive layer 4 with silicon is lower than the temperature of about 400 to 700° C. of the ECR-MOCVD process for forming the high dielectric constant layer 6. Particularly, when the silicon diffusion preventing conductive layer 4 is made of metal silicide, the silicon contact layer 9 can be easily formed in selfalignment with the silicon diffusion preventing conductive layer 4, thus reducing the number of manufacturing steps required.

Further, the silicon contact layer 9 can be made of silicide of metal including at least one of Ti, W, Ta, Mo, Co and Ni. Such silicide has a silicon diffusion preventing ability even at a temperature of up to 500° C., and also, has a small contact resistance to silicon, since silicon is included in the silicide.

In addition, the oxidation resistance conductive layer 6 can be made of metal including at least one of Ru, Re, Os, Ir and Rh, their oxide, or their silicide, or metal including at least one of Pt and Pd. Particularly, $RuO_2$ and Ru are preferable in view of the fine-structure technology thereof.

Further, the high dielectric constant layer 6 can be made of $ABO_3$ where A includes at least one of Ba, Sr, Pb, Ca, La, Li and K, and B includes at least one of Ti, Ta, Nb, Mg, Mn, Fe, Zn and W. Examples of $ABO_3$ are $SrTiO_3$, $PbTiO_3$, $Pb(Zr,Ti)O_3$, $(Pb,La)(Zr,Ti)O_3$, $Pb(Mg,Nb)\ O_3$, $Pb(Mg,W)O_3$, $Pb(Zn,Nb)O_3$, $LiTaO_3$, $LiNbO_3$, $KTaO_3$ and $KNbO_3$.

In addition, the high dielectric constant layer 6 can be made of $(Bi_2O_2)(A_{m-1}B_mO_{m-1})$ (m=1,2,3,4,5) where A includes at least one of Ma, Sr, Pb, Ca, K and Bi, and B includes at least one of Nb, Ta, Ti and W. Examples of $(BiO_2)(A_{m-1}B_mO_{3m-1})$ are $BiTiO_{12}$, $SrBr_2TaO_9$ and $SrBi_2Nb_2O_9$. Further, the high dielectric constant layer 6 can be made of $Ta_2O_5$.

As explained hereinbefore, according to the present invention, since the oxidation resistance conductive layer is isolated from a high dielectric constant layer with a small sidewall insulating spacer or without a sidewall insulating spacer, the stacked capacitor can be reduced in size to enhance the integration.

We claim:

1. A method for manufacturing a capacitor, comprising the steps of:

forming an insulating layer on a silicon substrate;

perforating a contact hole in said insulating layer;

burying a polycrystalline silicon plug in said contact hole of said insulating layer;

forming a silicon diffusion preventing conductive layer on said polycrystalline silicon plug and said insulating layer;

forming an oxidation resistance conductive layer on said silicon diffusion preventing conductive layer;

etching said oxidation resistance conductive layer and said silicon diffusion preventing conductive layer to form a lower electrode layer;

forming a sidewall insulating spacer only on a sidewall of said silicon diffusion preventing conductive layer;

forming a high dielectric constant layer on said oxidation resistance conductive layer and said sidewall insulating spacer; and forming an upper electrode layer on said high dielectric constant layer.

2. The method as set forth in claim 1, further comprising a step of forming a silicon contact layer on said polycrystalline silicon plug, after said polycrystalline silicon plug is buried and before said silicon diffusion preventing conductive layer is formed.

3. The method as set forth in claim 1, further comprising the steps of:

forming a refractory metal layer on said polycrystalline silicon plug, after said polycrystalline silicon plug is buried; and performing a thermal annealing operation upon said refractory metal layer in a nitrogen atmosphere to form a silicon contact layer.

4. The method as set forth in claim 1, wherein said silicon diffusion preventing conductive layer comprises a material selected from the group of titanium, tungsten, tantalum, molybdenum, cobalt, nickel, titanium nitride, tungsten nitride, tantalum nitride, molybdenum nitride, cobalt nitride, nickel nitride, nitrogen including titanium, nitrogen including tungsten, nitrogen including tantalum, nitrogen including molybdenum, nitrogen including cobalt, nitrogen including nickel, titanium silicide, tungsten silicide, tantalum silicide, molybdenum silicide, cobalt silicide and nickel silicide.

5. The method as set forth in claim 1, wherein said oxidation resistance conductive layer comprises a material selected from the group of ruthenium, rhenium, osmium, iridium, rhodium, platinum, palladium, ruthenium oxide, rhenium oxide, osmium oxide, iridium oxide, rhodium oxide, ruthenium silicide, rhenium silicide, osmium silicide, iridium silicide and rhodium silicide.

6. The method as set forth in claim 2, wherein said silicon contact layer comprises a material selected from the group of titanium silicide, tungsten silicide, tantalum silicide, molybdenum silicide, cobalt silicide, nickel silicide.

7. The method as set forth in claim 3, wherein said silicon contact layer comprises a material selected from the group of titanium silicide, tungsten silicide, tantalum silicide, molybdenum silicide, cobalt silicide, nickel silicide.

8. The method as set forth in claim 1, wherein said high dielectric constant layer comprises a material selected from the group of $ABO_3$, $Bi_2O_2\ (X_{m-1}Z_mO_{3m-1}\ )$(m=1,2, . . . 5) and $Ta_2O_5$, where A includes at least one of barium, strontium, lead, calcium, litium and potassium; B includes at least one of zirconium, titanium, tantalum, niobium, magnesium, manganese, iron, zinc and tungsten; X includes at least one of barium, strontium, lead, calcium, potassium and bismuth; and Z includes at least one of titanium, tantalum, niobium and tungsten.

* * * * *

UNITED STATES PATENT AND TRADEMARK OFFICE
CERTIFICATE OF CORRECTION

PATENT NO. : 5,943,547
DATED : August 24, 1999
INVENTOR(S) : Yamamichi et al.

It is certified that error appears in the above-identified patent and that said Letters Patent is hereby corrected as shown below:

Claim 8, Col. 16, line 53, "$(X_{m-1}Z_mO_{3m-1})$" should be - -$(X_{m-1}Z_mO_{3m+1})$- -.

Col. 15, line 34, "$(A_{m-1}B_mO_{m-1})$" should be - -$(A_{m-1}B_mO_{3m+1})$- -.

Col. 15, line 37, "$(A_{m-1}B_mO_{m-1})$" should be - -$(A_{m-1}B_mO_{3m+1})$- -.

Signed and Sealed this

Second Day of May, 2000

Attest:

Q. TODD DICKINSON

*Attesting Officer*           *Director of Patents and Trademarks*